(12) United States Patent
Hazelton et al.

(10) Patent No.: US 6,757,053 B1
(45) Date of Patent: Jun. 29, 2004

(54) STAGE ASSEMBLY INCLUDING A REACTION MASS ASSEMBLY

(75) Inventors: Andrew J. Hazelton, San Carlos, CA (US); Mike Binnard, Belmont, CA (US)

(73) Assignee: Nikon Corporation (JP)

( * ) Notice: Subject to any disclaimer, the term of this patent is extended or adjusted under 35 U.S.C. 154(b) by 240 days.

(21) Appl. No.: 09/714,747

(22) Filed: Nov. 16, 2000

(51) Int. Cl.[7] .......................... G03B 27/58; G03B 27/62
(52) U.S. Cl. ........................................... 355/72; 355/75
(58) Field of Search .............................. 355/53, 72, 75

(56) References Cited

U.S. PATENT DOCUMENTS

| | | | |
|---|---|---|---|
| 4,444,492 A | 4/1984 | Lee | |
| 4,821,205 A | 4/1989 | Schutten et al. | |
| 5,208,497 A | 5/1993 | Ishii et al. | |
| 5,227,839 A | 7/1993 | Allen | |
| 5,255,051 A | 10/1993 | Allen | |
| 5,280,677 A | 1/1994 | Kubo et al. | |
| 5,815,246 A | 9/1998 | Sperling et al. | |
| 5,864,389 A | 1/1999 | Osanai et al. | |
| 5,969,441 A | * 10/1999 | Loopstra et al. ......... | 248/178.1 |
| 5,991,005 A | * 11/1999 | Horikawa et al. ........... | 355/53 |
| 6,028,376 A | 2/2000 | Osanai et al. | |
| 6,252,370 B1 | 6/2001 | Ebihara et al. | |
| 6,262,794 B1 | 7/2001 | Miyajima | |
| 6,271,606 B1 | * 8/2001 | Hazelton ................. | 250/491.1 |
| 6,281,654 B1 | 8/2001 | Lee | |
| 6,322,060 B1 | 11/2001 | Mayama et al. | |
| 6,323,483 B1 | 11/2001 | Cleveland et al. | |
| 6,323,935 B1 | 11/2001 | Ebihara et al. | |
| 6,337,484 B1 | 1/2002 | Loopstra et al. | |
| 6,355,994 B1 | 3/2002 | Andeen et al. | |
| 6,359,679 B1 | 3/2002 | Ito et al. | |
| 6,408,045 B1 | * 6/2002 | Matsui et al. ............... | 378/204 |
| 6,449,030 B1 | 9/2002 | Kwan | |

FOREIGN PATENT DOCUMENTS

| | | |
|---|---|---|
| JP | 7-142331 | 6/1995 |
| WO | WO 98/28665 | 7/1998 |
| WO | WO 98/40791 | 9/1998 |
| WO | WO 01/47001 A1 | 6/2001 |

OTHER PUBLICATIONS

U.S. patent application Ser. No. 09/721,733, Nishi, filed Nov. 27, 2000.
U.S. patent application Ser. No. 09/759,524, Yuan et al., filed Jan. 16, 2001.

* cited by examiner

*Primary Examiner*—David Gray
*Assistant Examiner*—D. Ben Esplin
(74) *Attorney, Agent, or Firm*—Steven G. Roeder; Jim Rose

(57) ABSTRACT

A stage assembly (10) for moving and positioning a device (26) is provided herein. The stage assembly (10) includes a stage base (12), a stage (14), a stage mover assembly (16), and a reaction mass assembly (18). The stage mover assembly (16) moves the stage (14) along an X axis and along a Y axis relative to the stage base (12). The reaction mass assembly (18) is coupled to the stage mover assembly (16). Uniquely, the reaction mass assembly (18) reduces the reaction forces created by the stage mover assembly (16) in three degrees of freedom that are transferred to the stage base (12). With this design, stage mover assembly (16) has less influence upon the position of the stage base (12). These features allow for more accurate positioning of the device (26) by the stage assembly (10) and better performance of the stage assembly (10).

181 Claims, 24 Drawing Sheets

STAGE ASSEMBLY INCLUDING A REACTION MASS ASSEMBLY

CROSS REFERENCE TO RELATED APPLICATIONS

As far as permitted, the disclosures of (i) U.S. patent application Ser. No. 09/714,598, entitled, "A SYSTEM AND METHOD FOR RESETTING A REACTION MASS ASSEMBLY OF A STAGE ASSEMBLY," filed on Nov. 16, 2000, (ii) U.S. patent application Ser. No. 09/713,911, entitled "STAGE ASSEMBLY INCLUDING A REACTION ASSEMBLY," filed on Nov. 16, 2000, and (iii) U.S. patent application Ser. No. 09/713,910, entitled "STAGE ASSEMBLY INCLUDING A REACTION ASSEMBLY THAT IS CONNECTED BY ACTUATORS," filed on Nov. 16, 2000, are incorporated herein by reference.

FIELD OF THE INVENTION

The present invention is directed to a stage assembly for moving a device. More specifically, the present invention is directed to a stage assembly including a reaction mass assembly for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle is extremely small. Accordingly, the precise relative positioning of the wafer and the reticle is critical to the manufacturing of high density, semiconductor wafers.

Unfortunately, the wafer stage mover assembly generates reaction forces that can vibrate the wafer stage bass and the apparatus frame. The vibration influences the position of the wafer stage base, the wafer stage, and the wafer. As a result thereof, the vibration can cause an alignment error between the reticle and the wafer. This reduces the accuracy of positioning of the wafer relative to the reticle and degrades the accuracy of the exposure apparatus.

In light of the above, one object of the present invention is to provide a stage assembly that precisely positions a device. Another object is to provide a stage assembly that minimizes the influence of the reaction forces of the stage mover assembly upon the position of the stage, the stage base, and the apparatus frame. Still another object is to provide a stage assembly having an improved reaction mass assembly. Yet another object is to provide an exposure apparatus capable of manufacturing precision devices such as high density, semiconductor wafers.

SUMMARY

The present invention is directed to a stage assembly for moving a device relative to a stage base that satisfies these needs. The stage assembly includes a stage, a stage mover assembly, and a reaction mass assembly. The stage retains the device. The stage mover assembly is connected to the stage and moves the stage relative to the stage base with at least two degrees of freedom. The reaction mass assembly is coupled to the stage mover assembly.

A number of embodiments of the reaction mass assembly are provided herein. Uniquely, in each embodiment, the reaction mass assembly reduces the reaction forces created by the stage mover assembly in at least two degrees of freedom that are transferred to the stage base. As a result thereof, the stage assembly can more accurately position the device. Further, the stage assembly can be used in an exposure apparatus to manufacture high density, high quality semiconductor wafers.

As provided herein, the stage mover assembly can include one or more X stage movers and one or more Y stage movers that are coupled to the reaction mass assembly. The X stage movers move the stage along an X axis, and about a Z axis, while the Y stage movers move the stage along a Y axis. The stage mover assembly generates reaction forces in at least two degrees of freedom.

In the embodiments provided herein, the reaction mass assembly includes an X reaction component and a Y reaction component. The X reaction component moves relative to the stage base with at least to degrees of freedom and more preferably, three degrees of freedom. The Y reaction component moves relative to the stage base with at least one degree of freedom and more preferably three degrees of freedom.

Further, in the embodiments provided herein, the X reaction component is coupled to the Y reaction component and moves relative to the Y reaction component along the X axis. Additionally, the X reaction component and the Y reaction component move concurrently along the Y axis relative to the stage base. In some of the embodiments, the X reaction component and the Y reaction component also move concurrently along the X axis and about a Z axis relative to the stage base.

Preferably, the stage assembly also includes a reaction mover assembly that adjusts and corrects the position of the reaction mass assembly relative to the stage base. As provided herein, the reaction mover assembly can adjust the position of the reaction mass assembly relative to the stage base in one degree of freedom and more preferably in three degrees of freedom. For example, the reaction mover assembly can (i) move the X reaction component relative to Y reaction component along the X axis, (ii) move the X reaction component and the Y reaction component concurrently relative to the stage base along the Y axis, (iii) move the X reaction component and the Y reaction component concurrently relative to the stage base along the X axis, and/or (iv) move the X reaction component and the Y reaction component concurrently relative to the stage base about a Z axis. Further, as provided herein, the reaction mover assembly can be disposed independently from the stage movers.

The present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
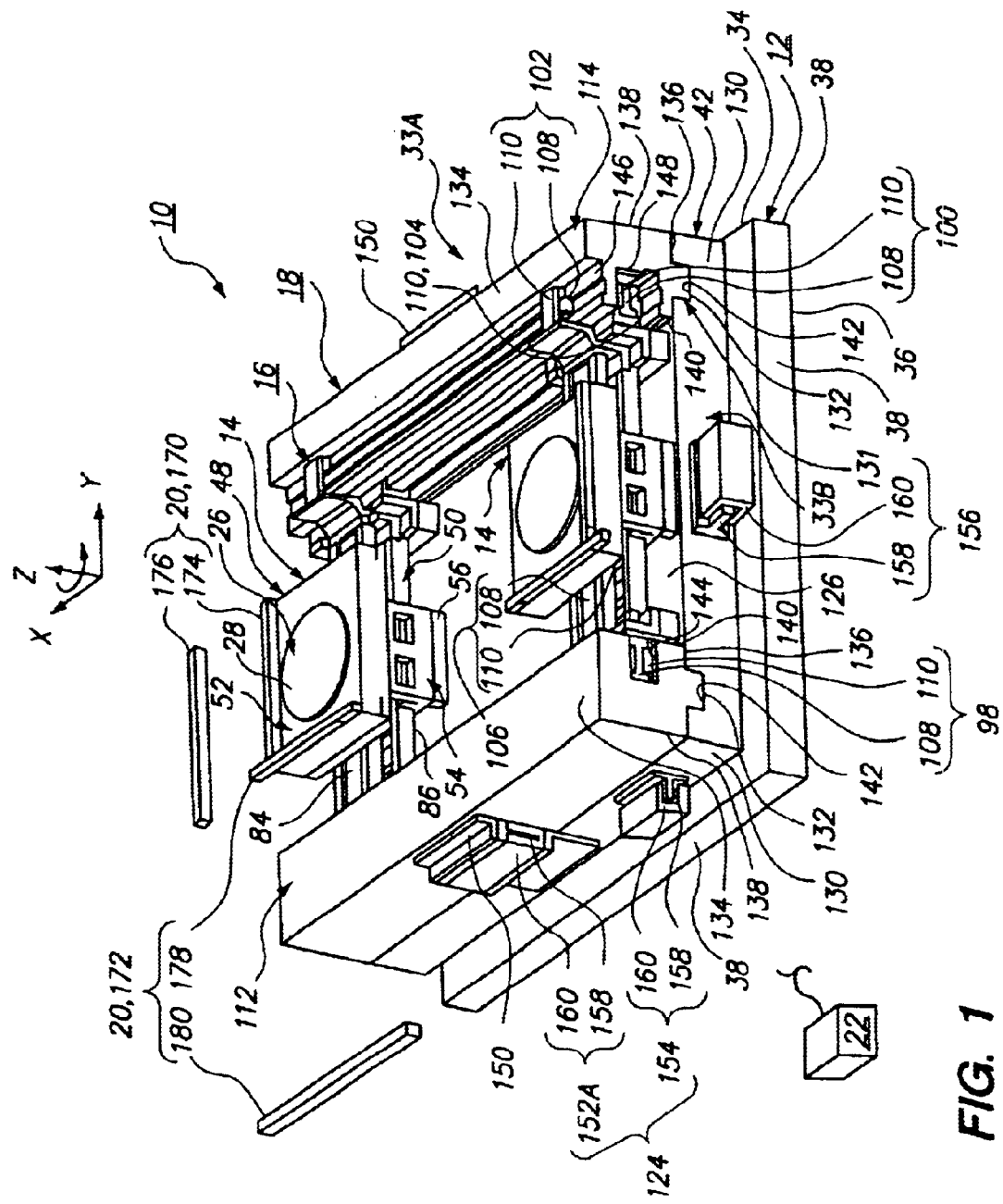
FIG. 1 is a perspective view of a first embodiment of a stage assembly having features of the present invention.

Referring initially to FIG. 1, a stage assembly 10, having features of the present invention, includes a stage base 12, at least one stage 14 (two are illustrated), a stage mover assembly 16, a reaction mass assembly 18, a measurement system 20 (only a portion is illustrated in FIG. 1), and a control system 22. The stage assembly 10 is positioned above a mounting base 24 (illustrated in FIG. 18). As an overview, the stage mover assembly 16 precisely moves each stage 14 relative to the stage base 12. Further, the reaction mass assembly 18 reduces and, minimizes the amount of reaction forces from the stage mover assembly 16 that are transferred to the stage base 12 and the mounting base 24.

The stage assembly 10 is particularly useful for precisely positioning a device during a manufacturing and/or an inspection process. The type of device 26 positioned and moved by the stage assembly 10 can be varied. For example, the device 26 can be a semiconductor wafer 28, and the stage assembly 10 can be used as part of an exposure apparatus 30 (illustrated in FIG. 18) for precisely positioning the semiconductor wafer 28 during manufacturing of the semiconductor wafer 28. Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 8:
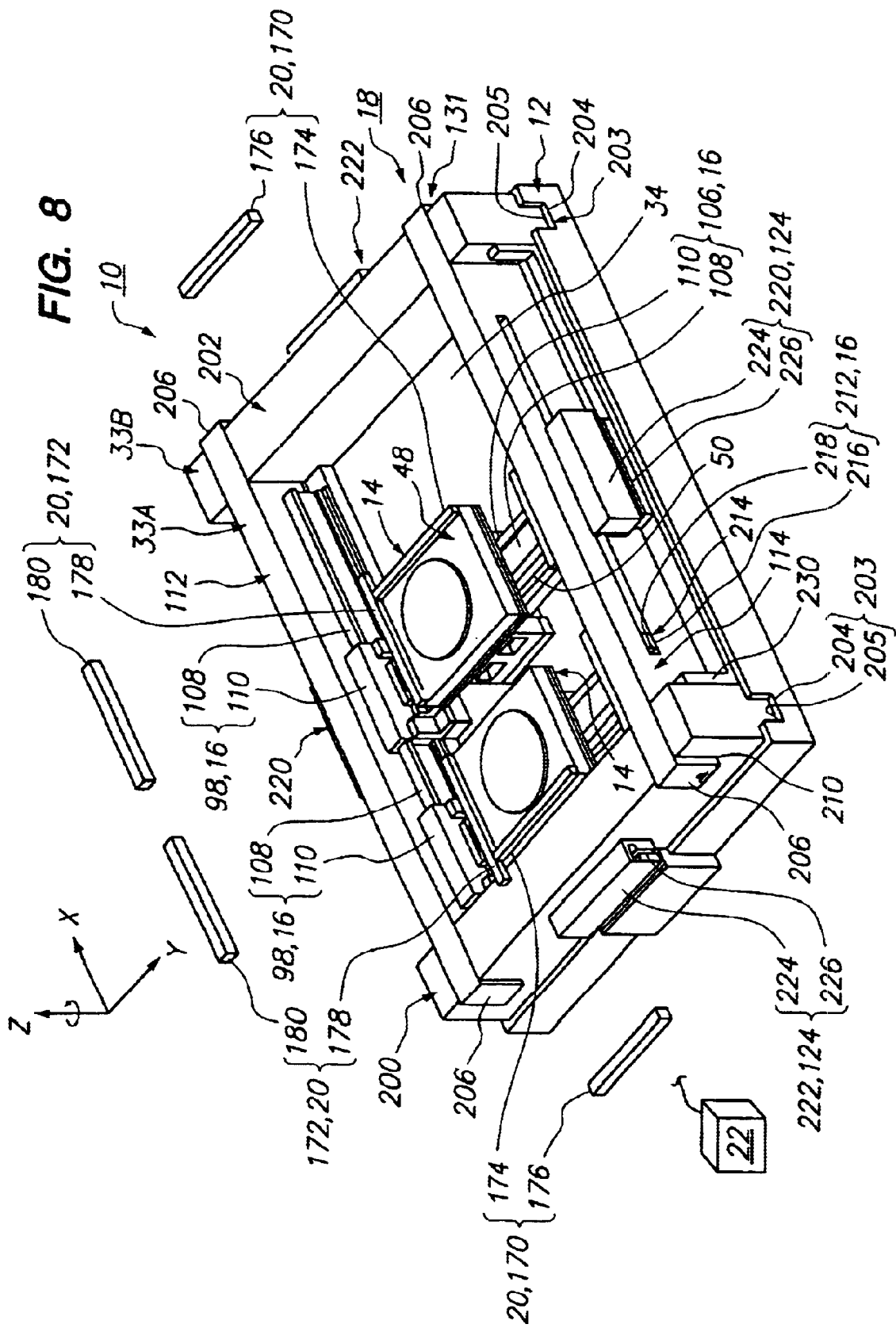
FIG. 8 is a perspective view of a second embodiment of a stage assembly having features of the present invention.
Figure 11:
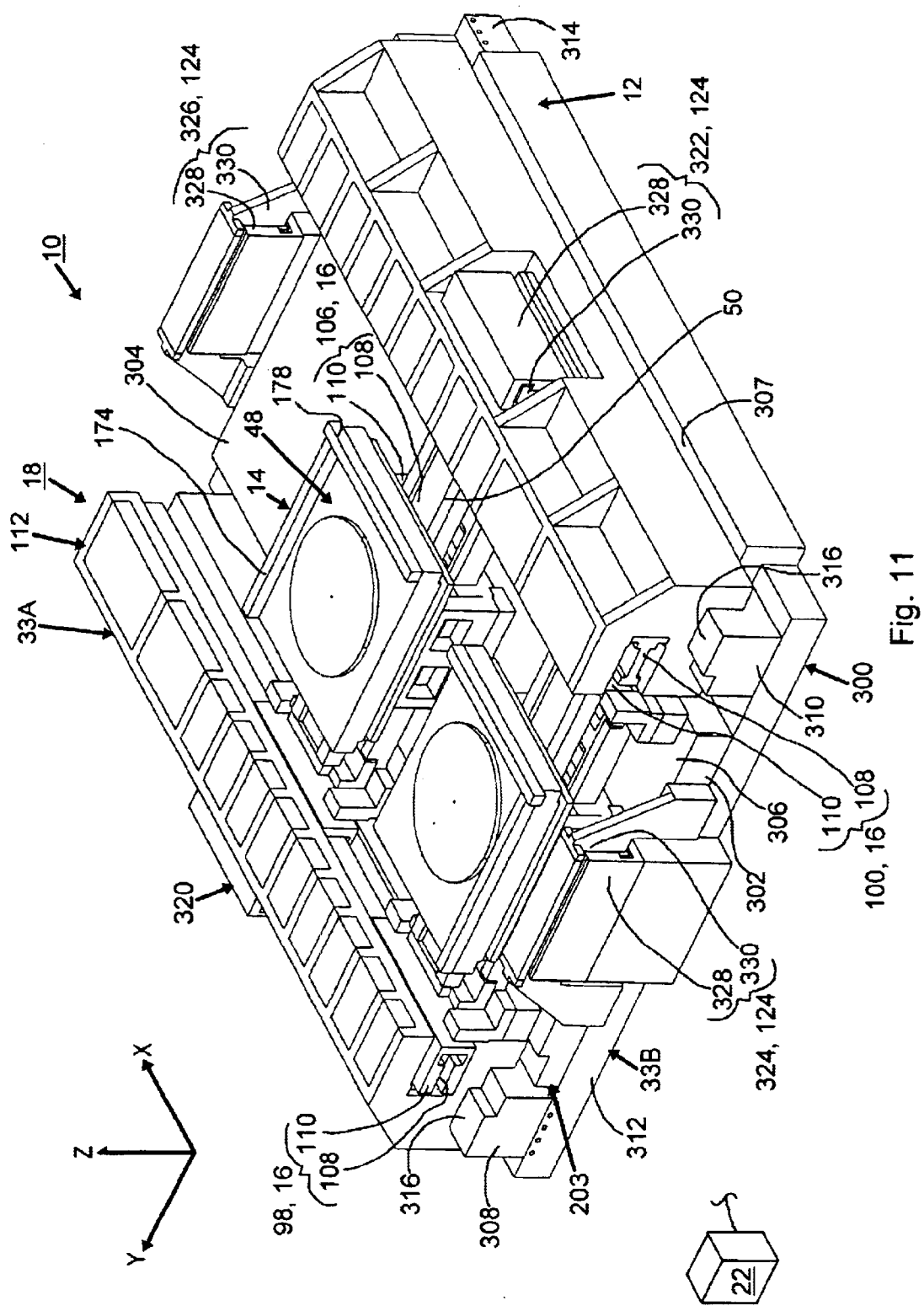
FIG. 11 is a perspective view of a third embodiment of a stage assembly having features of the present invention.
Figure 14:
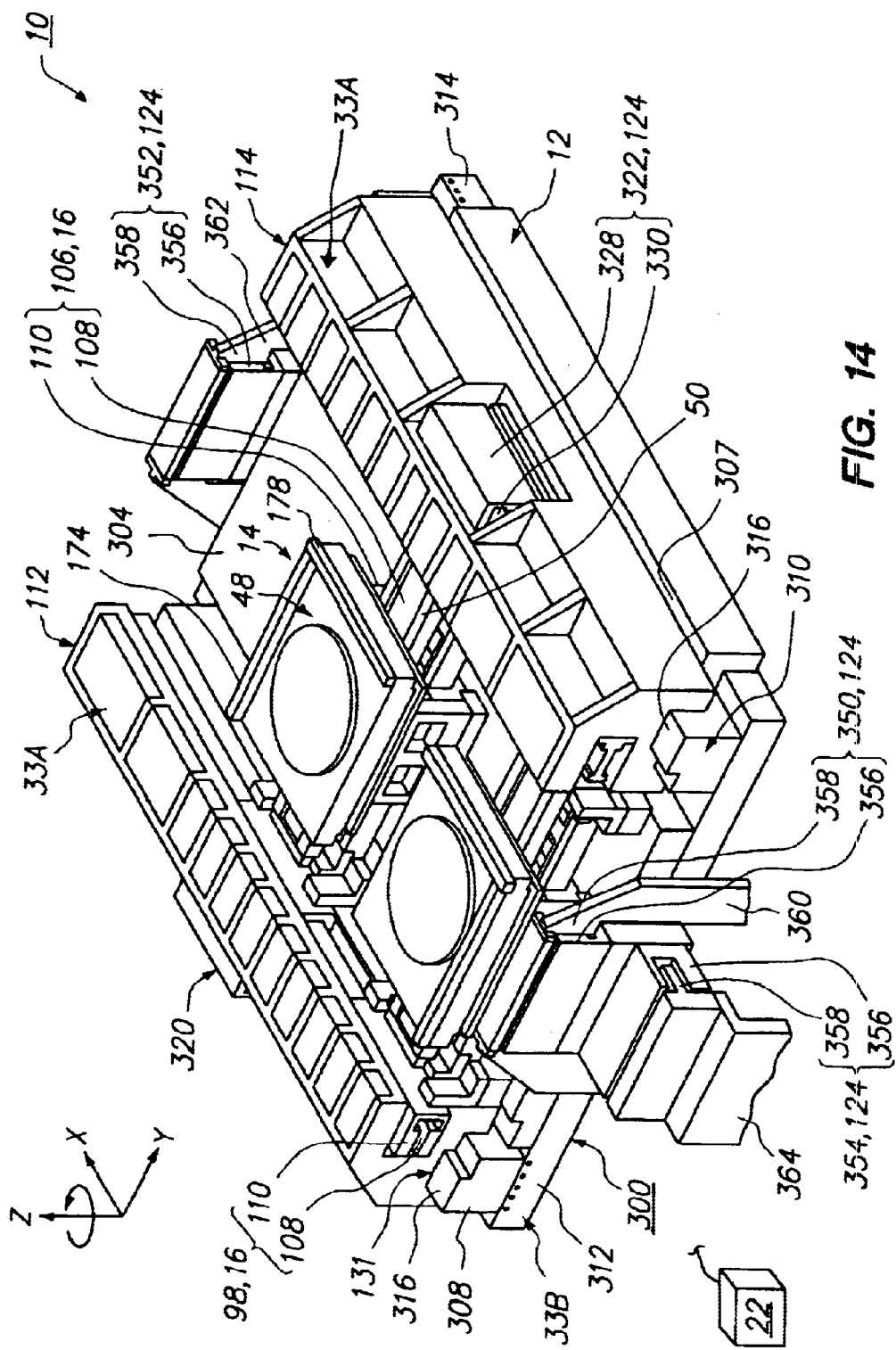
FIG. 14 Is a perspective view of a fourth embodiment of a stage assembly having features of the present invention.

A number of alternate embodiments of the stage assembly 10 are illustrated in the Figures. In particular, FIG. 1 illustrates a perspective view of a first embodiment of the stage assembly 10, FIG. 8 illustrates a perspective view of a second embodiment of the stage assembly 10, FIG. 11 illustrates a perspective view of a third embodiment of the stage assembly 10, and FIG. 14 illustrates a perspective view of a fourth embodiment of the stage assembly 10.

In each embodiment illustrated herein, each stage 14 is moved relative to the stage base 12 along the X axis, along the Y axis, and about the Z axis (collectively "the planar degrees of freedom"). More specifically, the stage mover assembly 16 moves and positions each stage 14 along the X axis, along the Y axis, and about the Z axis under the control of the control system 22. Additionally, in each embodiment illustrated, the stage assembly 10 includes two stages 14 that independently move relative to the stage base 12. Alternately, however, each stage assembly 10 could include only one stage 14 or more than two stages 14.

Importantly, the reaction mass assembly 18; reduces and minimizes the amount of reaction force from the stage mover assembly 16 that are transferred to the stage base 12 and the mounting base 24. As an overview, in the embodiments provided herein, the reaction mass assembly 18 includes an X reaction component 33A and a Y reaction component 33B. The X reaction component 33A moves relative to the stage base 12 with at least two degrees of freedom and more preferably, three degrees of freedom. The Y reaction component 33B moves relative to the stage base 12 with at least one degree of freedom and more preferably three degrees of freedom.

Further, in the embodiments provided herein, the X reaction component 33A is coupled to the Y reaction component 33B and moves relative to the Y reaction component 33B along the X axis. Additionally, the X reaction component 33A and the Y reaction component 33B move concurrently along the Y axis relative to the stage base 12. In some of the embodiments, the X reaction component 33A and the Y reaction component 33B also move concurrently along the X axis and about the Z axis relative to the stage base 12.

In a preferred embodiment of the present invention, the reaction mass assembly 18 is free to move along the X axis, along the Y axis, and about the Z axis relative to the stage base 12. In this embodiment, when the stage mover assembly 16 applies a force to the stage 14 along the X axis, the Y axis, and/or about the Z axis, an equal and opposite force is applied to the reaction mass assembly 18. Further, the control system 22 corrects the position of the reaction mass assembly 18 along the X axis, along the Y axis, and about the Z axis.

The reaction mass assembly 18 provided herein, minimizes the disturbance that is transferred to the stage base 12. This improves the positioning performance of the stage assembly 10. Further, for an exposure apparatus 30, this allows for more accurate positioning of the semiconductor wafer 28 relative to a reticle 32 (illustrated in FIG. 18).

The stage base 12 supports a portion of the stage assembly 10 above the mounting base 24. The design of the stage base 12 can be varied to suit the design requirements of the stage assembly 10. In the embodiment illustrated in FIGS. 1–3, the stage base 12 is generally rectangular shaped and includes a planar base top 34 (sometimes referred to as a guide face), an opposed planar base bottom 36, four base sides 38, and a plurality of spaced apart base fluid pads 40 (illustrated in FIG. 3). The base fluid pads 40 are secured to base top 34.

In this embodiment, the reaction mass assembly 18 is maintained above the stage base 12 with a vacuum type fluid bearing. More specifically, in this embodiment, each of the base fluid pads 40 includes a plurality of spaced apart fluid outlets (not shown), and a plurality of spaced apart fluid inlets (not shown). Pressurized fluid (not shown) is released from the fluid outlets towards a reaction base 42 of the Y reaction component 33B of the reaction mass assembly 18. A vacuum is pulled in the fluid inlets to create a vacuum preload type, fluid bearing between the base top 34 and the reaction base 42. The vacuum preload type fluid bearing maintains the reaction mass assembly 18, spaced apart along the Z axis, relative to the stage base 12. Further, the vacuum preload type fluid bearing allows for motion of the X reaction component 33A, and the Y reaction component 33B along the X axis, along the Y axis, and about the Z axis relative to the stage base 12.

Alternately, the reaction mass assembly 18 can be supported spaced apart from the stage base 12 in other ways. For example, a magnetic type bearing or a ball bearing type of assembly could be utilized that allows for motion of the reaction mass assembly 18 relative to the stage base 12.

Figure 18:
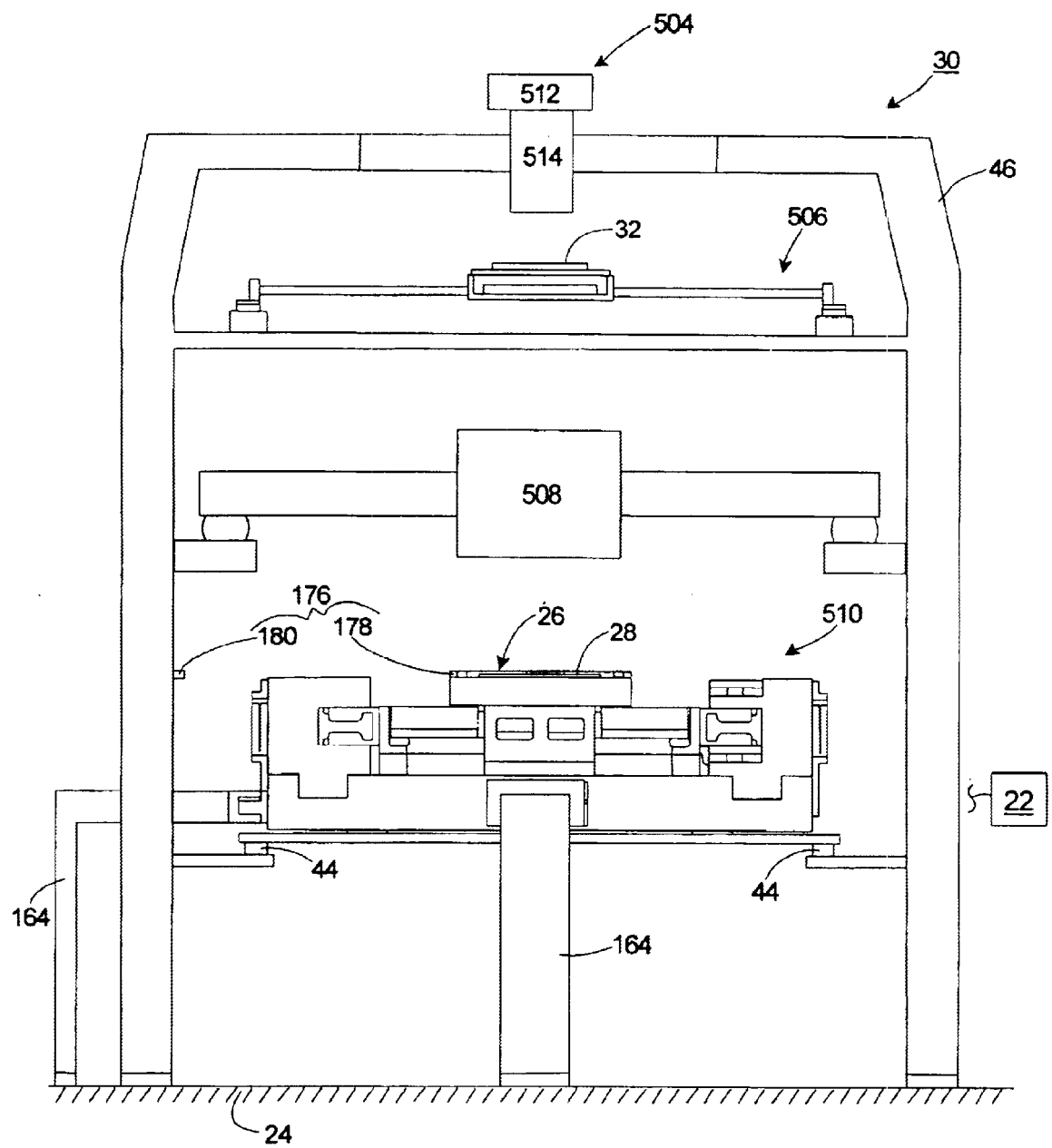
FIG. 18 is a schematic illustration of an exposure apparatus having features of the present invention.

Preferably, referring to FIG. 18, the stage base 12 is secured with resilient base isolators 44 and an apparatus frame 46 to the mounting base 24. The base isolators 44 reduce the effect of vibration of the apparatus frame 46 causing vibration on the stage base 12. Typically, three or four spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

Figure 2:
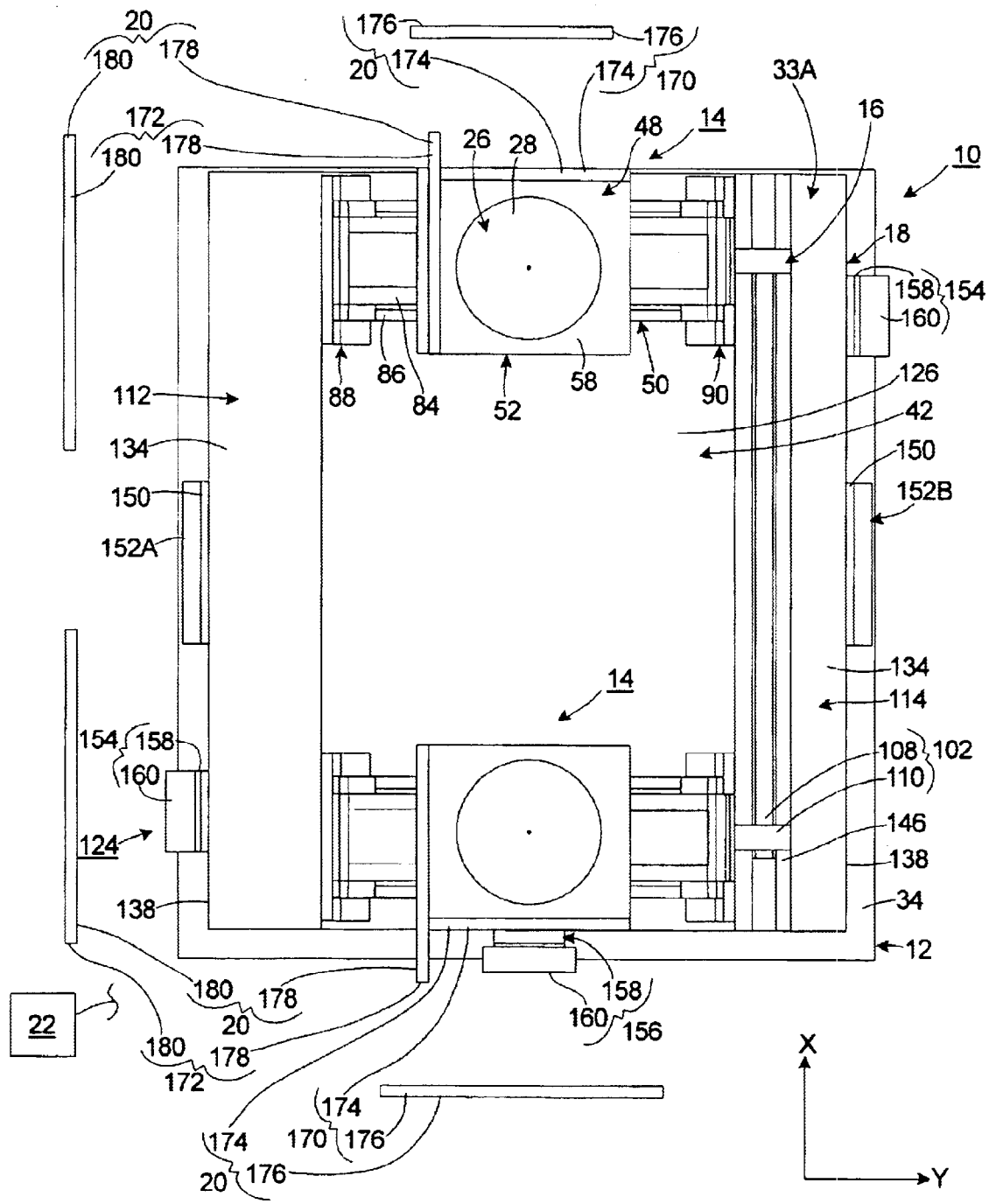
FIG. 2 is a top plan view of the stage assembly of FIG. 1
Figure 3:
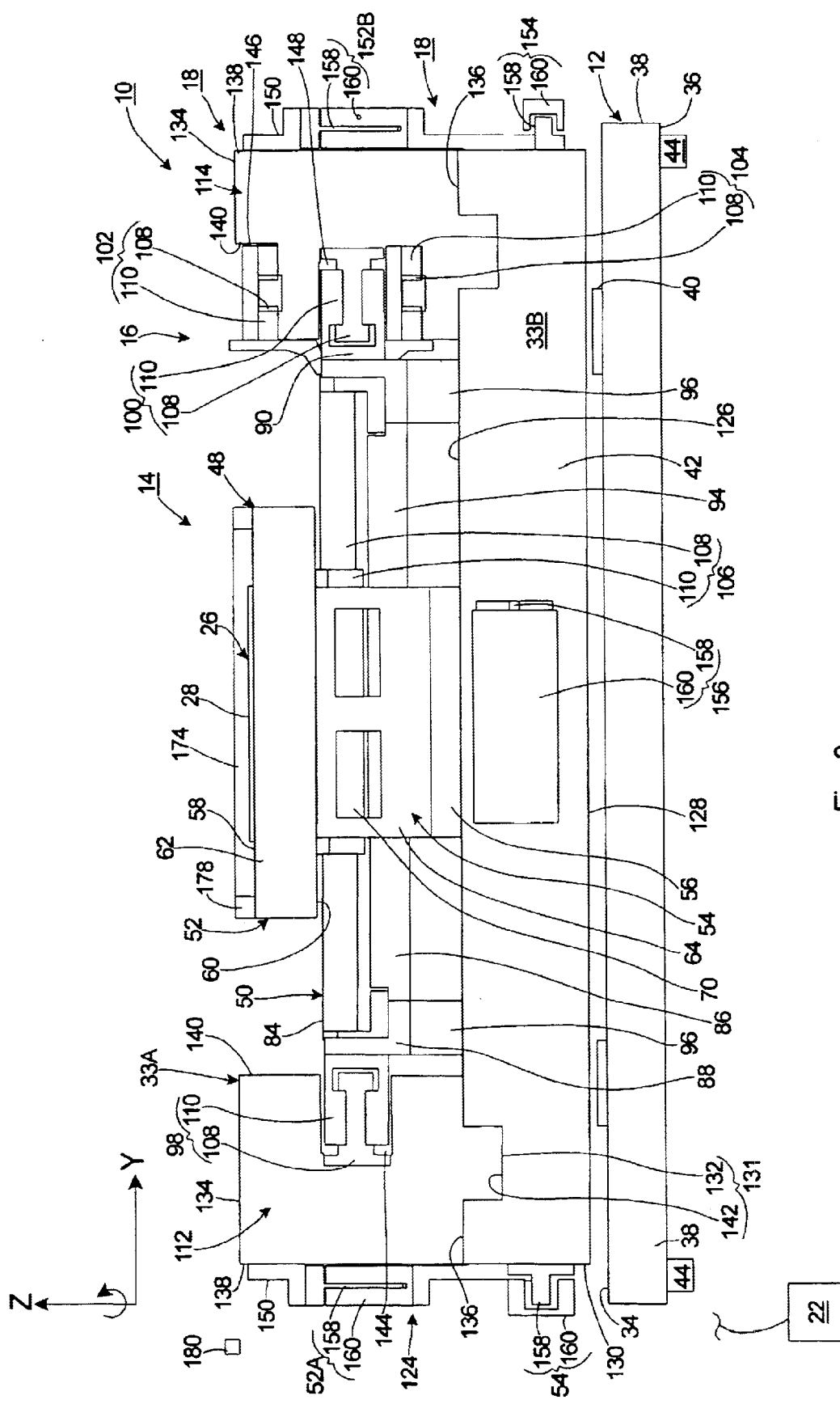
FIG. 3 is a front plan view of the stage assembly of FIG. 1.

The stage 14 retains the device 26. The stage 14 is precisely moved by the stage mover assembly 16 to precisely position the device 26. The design of each stage 14 can be varied to suit the design requirements of the stage assembly 10. A perspective view of one of the stages 14 is provided in FIG. 4. In this embodiment, the stage 14 includes a device table 48, a guide assembly 50, a portion of the stage mover assembly 16, and a portion of the measurement system 20. The design of each stage 14 illustrated in FIGS. 1–3 is substantially the same as the stage 14 illustrated in FIG. 4. Accordingly, the present discussion describes only one of the stages 14.

Figure 4:
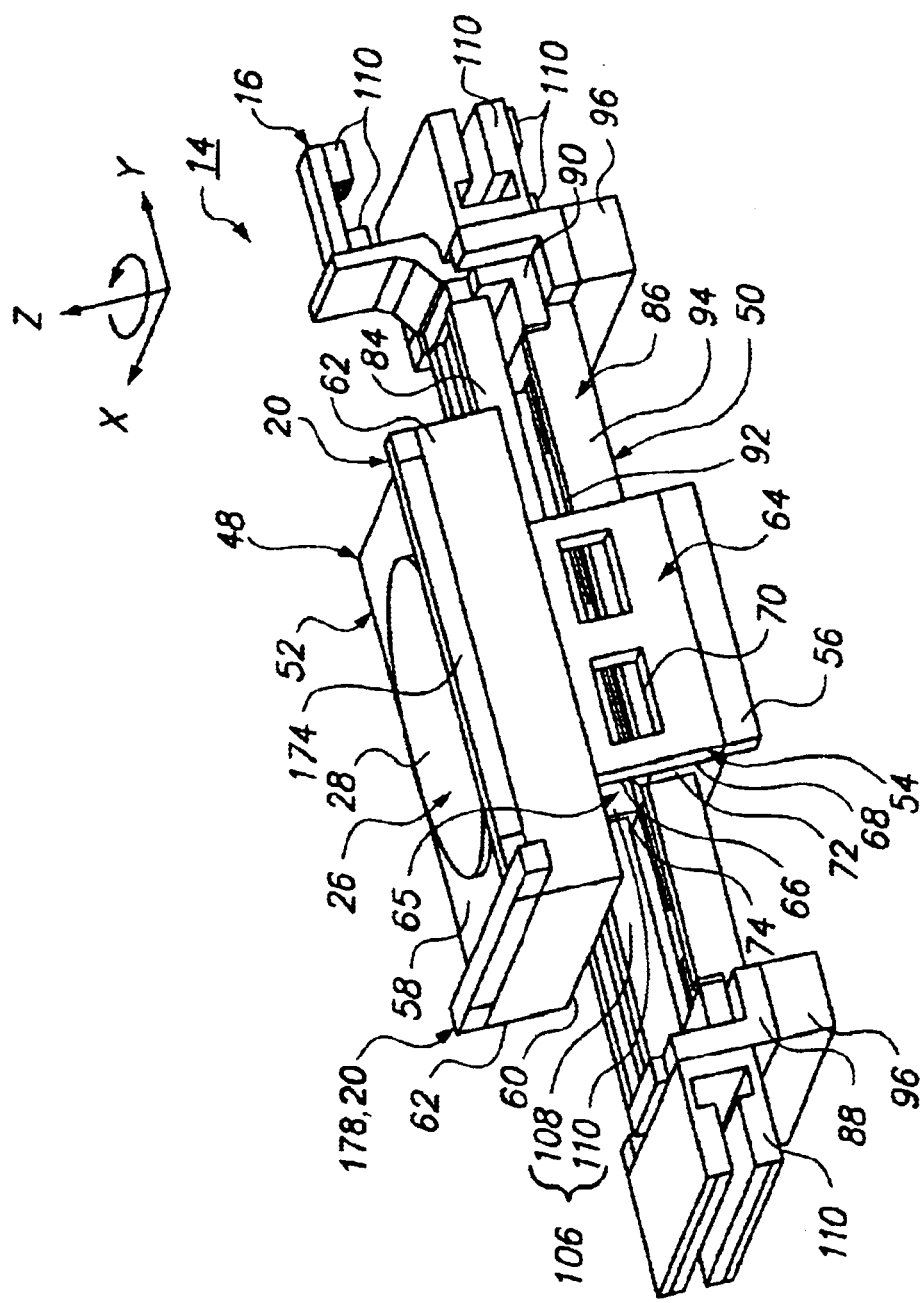
FIG. 4 is a perspective view of a stage having features of the present invention.

The design and movement of the device table 48 for each stage 14 can be varied to suit the design requirements of the stage assembly 10. In the embodiment illustrated in FIGS. 14, the device table 48 moves relative to the guide assembly 50 along the Y axis. Further, the device table 48 includes: (i) an upper table component 52, (ii) a lower table component 54 positioned below the upper table component 52, (iii) a pair of spaced apart table fluid pads 56 (only one is illustrated in FIG. 4) positioned below the lower table component 54.

Figure 5A:
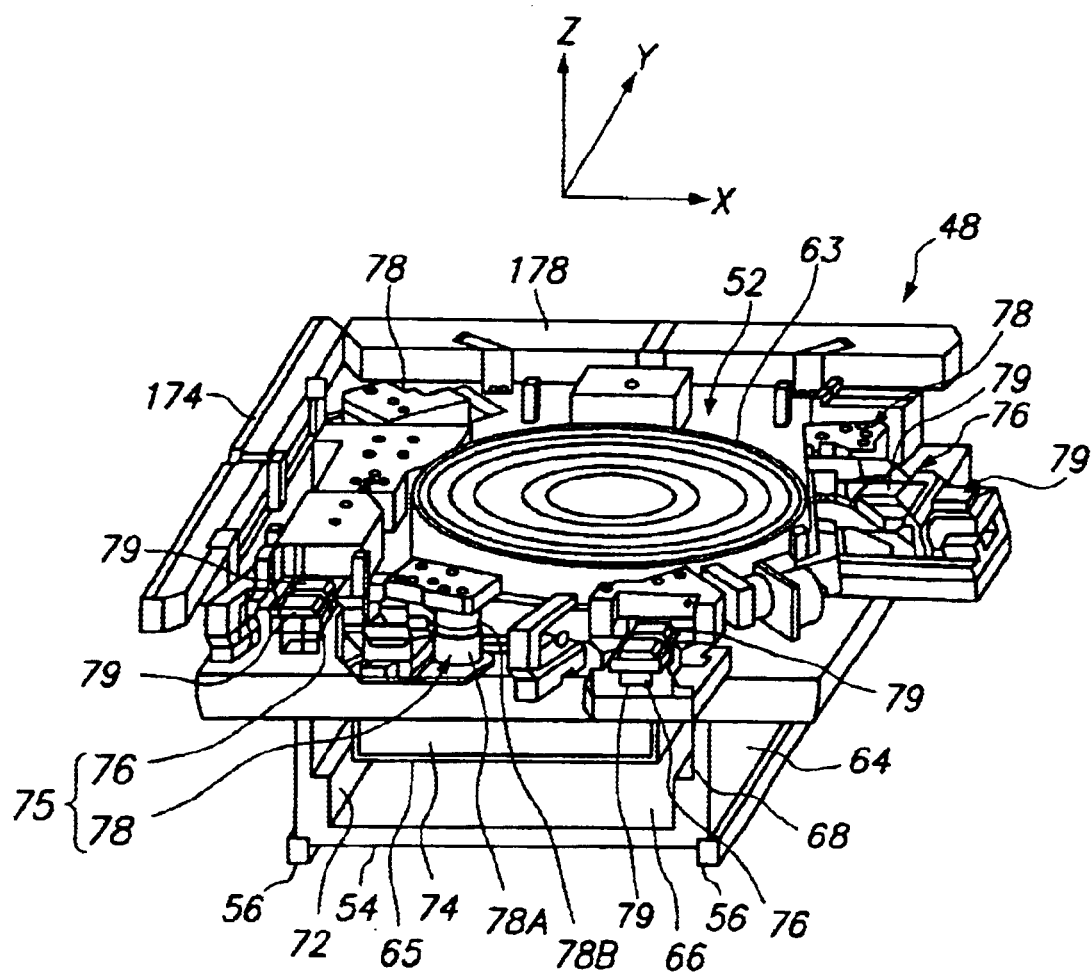
FIG. 5A is a perspective view of a device table having features of the present invention.
Figure 5B:
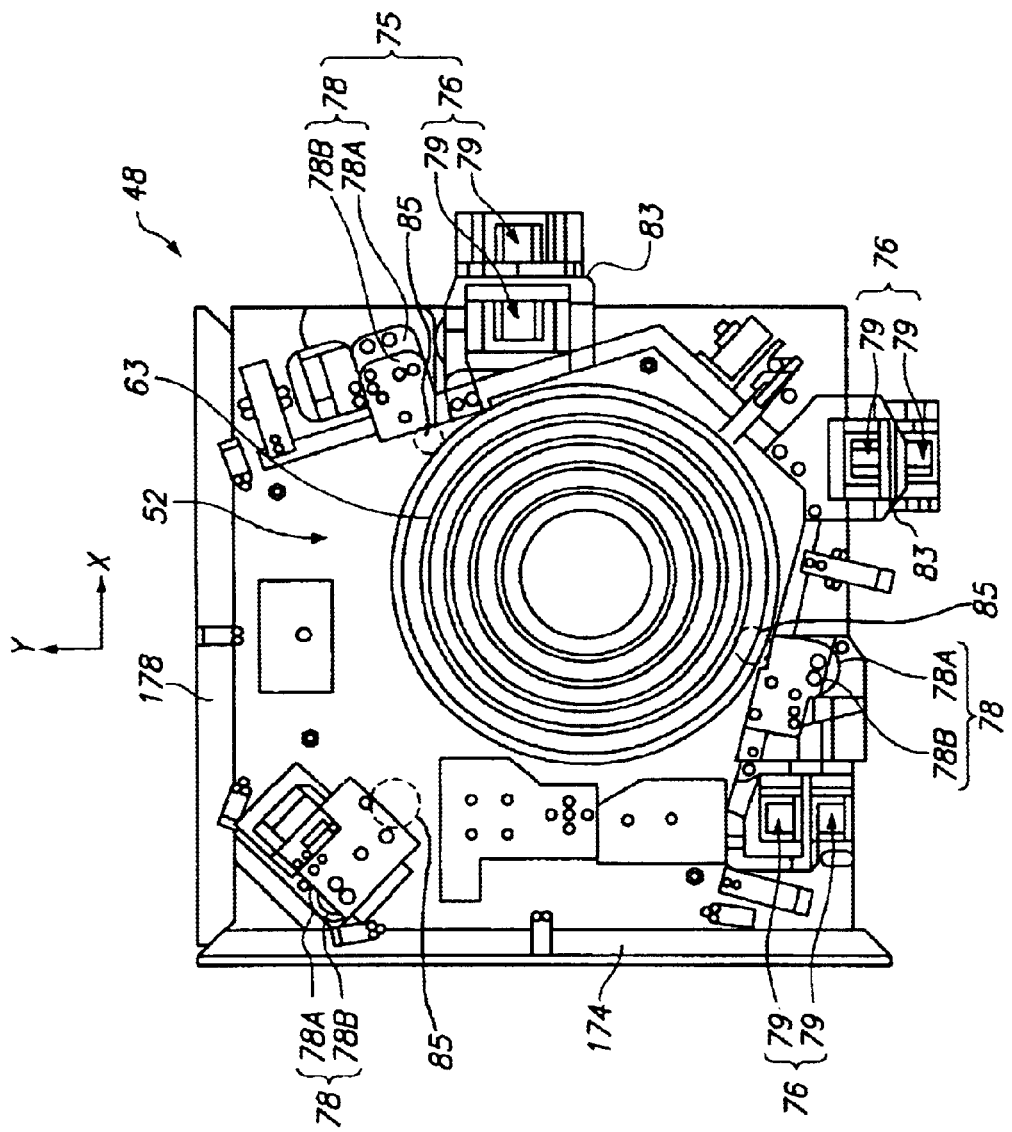
FIG. 5B is a top plan view of the device table of FIG. 5A.

The upper table component 52 is generally rectangular shaped and includes a table top 58, a table bottom 60, four table sides 62 (only two sides are illustrated in the Figures), and a device holder 63 (illustrated in FIGS. 5A and 5B). The device holder 63 is positioned near the table top 58 and retains the device 26 during movement of the stage 14. The device holder 63 can be a vacuum chuck, an electrostatic chuck, or some other type of clamp.

The lower table component 54 includes a generally rectangular tube shaped outer guide section 64, and generally rectangular tube shaped inner guide section 65. The outer guide section 64 is positioned below the upper table component 52. The outer guide section 64 defines a generally rectangular shaped guide channel 66 that is sized and shaped to receive a portion of the guide assembly 50. The guide channel 66 defines a pair of spaced apart side guide surfaces 68. The outer guide section 64 also includes a plurality of section apertures 70 that extend transversely through the outer guide section 64 to reduce the weight of the outer guide section 64.

Additionally, the outer guide section 64 includes a pair of spaced apart, section fluid pads 72 (only one is illustrated in the Figures) that are positioned along the side guide surfaces 68 in the guide channel 66. In this embodiment, each section fluid pad 72 includes a plurality of spaced apart fluid outlets (not shown). Pressurized fluid (not shown) is released from the fluid outlets towards the guide assembly 50 to create a fluid bearing between the device table 48 and the guide assembly 50. The fluid bearing maintains the device table 48 spaced apart from the guide assembly 50 along the X axis and allows for motion of the device table 48 along the Y axis relative to the guide assembly 50.

The inner guide section 65 is positioned within the guide channel 66, below the upper table component 52. The inner guide section 65 defines a generally rectangular shaped opening 74 that is sized and shaped to receive a portion of the guide assembly 50. Stated another way, the inner guide section 65 encircles a portion of the guide assembly 50. In the embodiments provided herein, the inner guide section 65 supports a portion of the stage mover assembly 16 as provided below.

The table fluid pads 56 extend downwardly from the lower table component 54. Each table fluid pad 56 includes a plurality of spaced apart fluid outlets (not shown), and a plurality of spaced apart fluid inlets (not shown). Pressurized fluid (not shown) is released from the fluid outlets towards the reaction base 42 of the reaction mass assembly 18. A vacuum is pulled in the fluid inlets to create a vacuum preload type fluid bearing between the table fluid pads 56 and the reaction base 42. The vacuum preload type fluid bearing maintains the device table 48 spaced apart along the Z axis relative to the reaction base 42. Further, the vacuum preload type fluid bearing allows for motion of the device table 48 along the X axis, along the Y axis, and about the Z axis relative to the reaction base 42.

Alternately, the device table 48 can be supported above the reaction base 42 in other ways. For example, a magnetic type bearing or a ball bearing type of assembly could be utilized that allows for movement of the device table 48 relative to the reaction base 42.

FIGS. 5A and 5B illustrate an alternate embodiment of a device table 48 having features of the present invention. In this design, the device table 48 includes a table mover assembly 75. Further, in this design, the upper table component 52 is moveable relative to the lower table component 54. More specifically, the table mover assembly 75 adjusts the position of the upper table component 52 relative to the lower table component 54 of the device table 48.

The design of the table mover assembly 75 can be varied to suit the design requirements to the stage assembly 10. In the embodiment illustrated In FIGS. 5A and 5B, the table mover assembly 75 adjusts the position of the upper table component 52 and the device holder 63 relative to the lower table component 54 with six degrees of freedom. Alternately, for example, the table mover assembly 75 can be designed to move the upper table component 52 relative to the lower table component 54 with only three degrees of freedom. The table mover assembly 75 can include one or more rotary motors, voice coil motors, linear motors, electromagnetic actuators 79, or some other force actuators.

In the embodiment illustrated in FIGS. 5A and 5B, the table mover assembly 75 includes three spaced apart, horizontal table movers 76 and three spaced apart, vertical table movers 78. The horizontal table movers 76 move the upper table component 52 along the X axis, along the Y axis, and about the Z axis relative to the lower table component 54. The vertical table movers 78 move the upper table component 52 about the X axis, about the Y axis, and along the Z axis relative to the lower table component 54.

The design of each table mover 76, 78 can be varied. In the embodiment illustrated in the Figures, each of the horizontal table movers 76 includes a pair of electromagnetic actuators 79, and each of the vertical table movers 78 is a noncommutated actuator commonly referred to as a voice coil actuator.

Figure 6A:
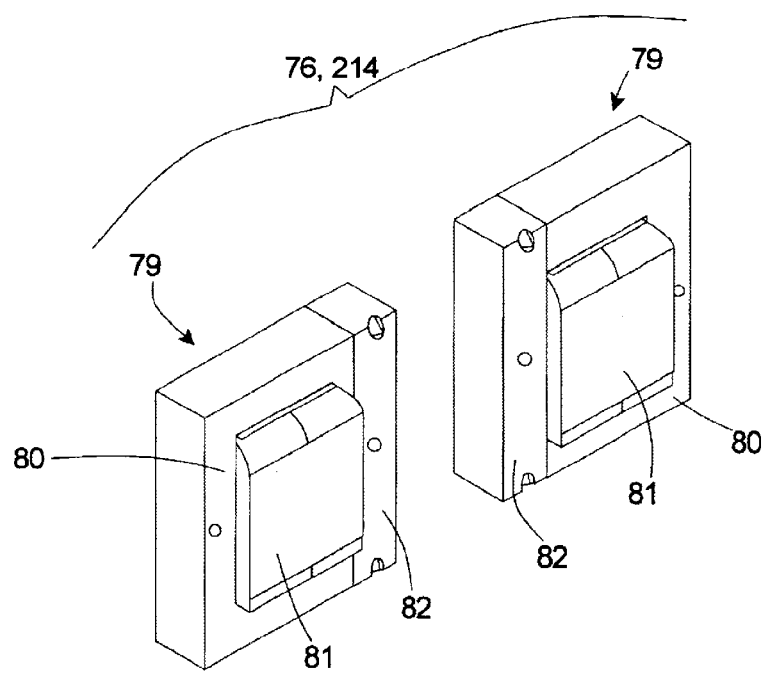
FIG. 6A illustrates a perspective view of a pair of electromagnetic actuators having features of the present invention.
Figure 6B:
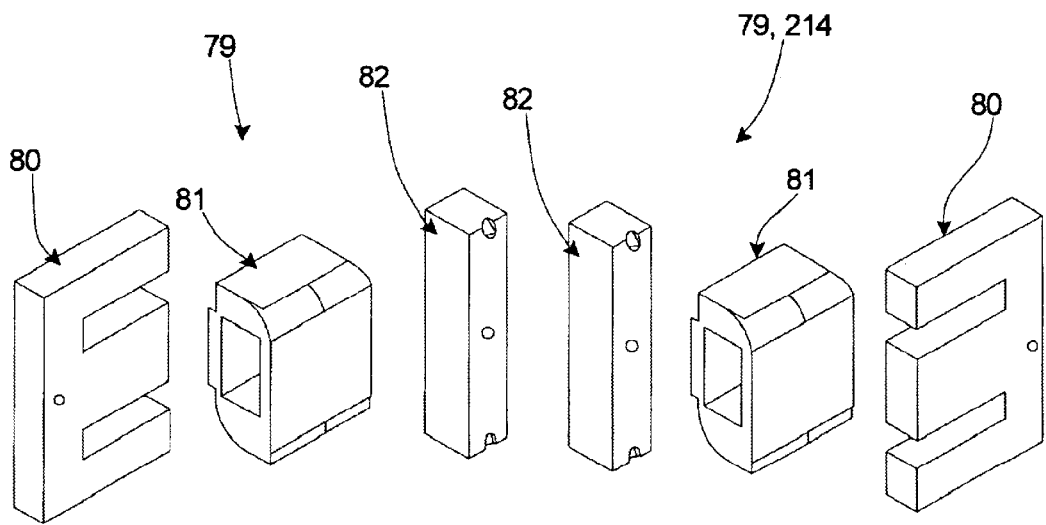
FIG. 6B illustrates an exploded perspective view of the actuators of FIG. 6A.

FIGS. 6A and 6B illustrate a perspective view of a preferred pair of electromagnetic actuators 79. More specifically, FIG. 6A illustrates a perspective view of a pair of electromagnetic actuators 79 commonly referred to as an E/I core actuators 214, and FIG. 6B illustrates an exploded perspective view of the E/I core actuators 214. Each E/I core actuator 214 is essentially an electromagnetic attractive device. Each E/I core actuator 214 includes an E shaped core 80, a tubular conductor 81, and an I shaped core 82. The E core 80 and the I core 82 are each made of a magnetic material such as iron, silicon steel, or Ni—Fe steel. The conductor 81 is positioned around the center bar of the E core 80. The combination of the E core 80 and the conductor 81 is sometimes referred to herein as an electromagnet. Further, the I core 82 is sometimes referred to herein as a target.

Each electromagnet and target is separated by an air gap g (which is very small and therefore difficult to see in the figures). The electromagnets are variable reluctance actuating portions and the reluctance varies with the distance defined by the gap g, which, of course also varies the flux and force applied to the target The attractive force between the electromagnet and the target is defined by:

$$F=K(i/g)^2$$

Where F is the attractive force, measured in Newtons;
K=an electromagnetic constant which is dependent upon the geometries of the E-shaped electromagnet, I-shaped target, and: number of conductor turns about the magnet. $K=1/2N^2\mu_o wd$; where N=the number of turns about the E-shaped magnet conductor 81; $\mu_o$=a physical constant of about $1.26\times10^{-6}$ H/m; w=the half width of the center of the E-shaped core 80 in meters; and d=the depth of the center of the E-shaped core 80 in meters. In a preferred embodiment, $K=7.73\times10^{-6}$ kg m$^3$/s$^2$A$^2$;
i=current, measured in amperes; and
g=the gap distance, measured in meters.

Current (not shown) directed through the conductor 81 creates an electromagnetic field that attracts the I core 82 towards the E core 80. The amount of current determines the amount of attraction. Stated another way, when the conductor of an electromagnet is energized, the electromagnet generates a flux that produces an attractive force on the target in accordance with the, formula given above, thereby functioning as a linear actuating portion. Because the electromagnets can only attract the targets, they must be assembled in pairs that can pull in opposition. The a targets are fixed to the upper table component 52 and move relative to the lower table component 54. Opposing pairs of electromagnets are secured to the lower table component 54 on opposite sides of the targets. By making a current through the one conductor 81 of the pair of electromagnets larger than the current through the other conductor 81 in the pair, a differential force can be produced that draws the target in one direction or its opposing direction.

Preferably, the targets are attached to the upper table component 52 in such a way that the pulling forces of the opposing pair of electromagnets do not distort the upper table component 52. This is preferably accomplished by mounting the targets for an opposing pair of electromagnets very close to one another, preferably peripherally of the upper table component 52. It is preferable to extend a thin web 83 of material (FIG. 5B) that is made of the same material as the upper table component 52. The opposing electromagnets are mounted on the lower table component 54 by a predetermined distance, when thin web 83 and targets are positioned there between, a predetermined gap g is formed between each set of electromagnet and target With this arrangement, only the resultant force, derived from the sum of the forces produced by the pair of electromagnets and targets, is applied to the upper table component 52 via transfer of the force through thin web 83. In this way, opposing forces are not applied to opposite sides of the upper table component 52 and stage distortion problems resulting from that type of arrangement are avoided.

FIG. 5B illustrates a preferred arrangement of the horizontal table movers 76. In this design, one opposing pair of attraction only actuators 79 are mounted so that the attractive forces produced thereby are substantially parallel with the X axis. Two opposing pairs of attraction only actuators 79 are mounted so that attractive forces from each pair are produced substantially parallel with the X axis. With this arrangement, the horizontal table movers 76 can make fine adjustments to the position of the upper table component 52 relative to the lower table component 54 along the X axis, along the Y axis, and about the Z axis. More specifically, actuation of the single pair of electromagnetic actuators 79 aligned along the X axis can achieve fine movements along the X axis. Actuation of the two pairs of electromagnetic actuators 79 aligned along the Y axis can control fine movements of the upper stage component 52 along the Y axis or in rotation (clockwise or counterclockwise) in the X-Y plane (i.e., Theta Z control). Y axis movements are accomplished by resultant forces from both pairs that are substantially equal and in the same direction. Theta Z movements are generally accomplished by producing jag opposite directional forces from the two pairs of electromagnets, although unequal to forces in the same direction will also cause some Theta Z adjustment.

Alternately, for example, two opposing pairs of electromagnetic actuators 79 can be mounted parallel with the Y direction, and one opposing pair of electromagnetic actuators 79 could be mounted parallel with the X direction. Other arrangements are also possible, but the preferred arrangement minimizes the number of actuating portions/bearings required for the necessary degrees of control.

Preferably, the lines of force of the electromagnetic actuators 79 are arranged to act through the center of gravity of the upper table, component 52. The two Y pairs of electromagnetic actuators 79 are preferably equidistant from the center of gravity of the upper table component 52.

The vertical table movers 78 are used to precisely position the upper table component 52 relative to the lower table component 54 along the Z axis, about the X axis, and about the Y axis (collectively referred to as "vertical degrees of freedom"). Because control in the three vertical degrees of freedom requires less dynamic performance (e.g., acceleration requirements are relatively low), and is easier to accomplish, lower force requirements exist than in the previously described X, Y, and Theta Z degrees of freedom. Accordingly, three voice coil motors can be used as the vertical table movers 78 to adjust the position of the upper table component 52 in the vertical degrees of freedom. In this design, each motor includes a magnet array 78A attached to the lower table component 54 and a conductor array 78B attached to the upper table component 52.

Preferably, fluid bellows 85 (illustrated in phantom) are utilized to support the dead weight of the upper table component 52. The fluid bellows 85 prevent overheating of the vertical table movers 78, As provided herein, one fluid bellow 85 is preferably positioned next to vertical table mover 78. The bellows 85 have very low stiffness in all degrees of freedom so they do not significantly interfere with the control of the upper table component 52.

The guide assembly 50 for each stage 14 is used to move the device table 48 along the X axis and about the Z axis and guide the movement of the device table 48 along the Y axis. The design of the guide assembly 50 can be varied to suit the design requirements of the stage assembly 10. In the embodiment illustrated in FIGS. 1–4, the guide assembly 50 includes an Upper beam 84, a lower guide 86, a first guide end 88, and a spaced apart second guide end 90. The upper beam 84 and the lower guide 86 are spaced apart, substantially parallel, and extend between the guide ends 88, 90.

The upper beam 84 is somewhat rectangular shaped and defines a portion of the stage mover assembly 16. The upper beam 84 fits within the opening 74 of the inner guide section 65. The lower guide 86 is somewhat rectangular shaped and includes a plurality of apertures 92 to reduce the mass. The lower guide 86 also includes a pair of opposed sides 94 (only one side is illustrated in the Figures).

Pressurized fluid (not shown) is released from the fluid outlets of the section fluid pads 72 towards the opposed sides 94 of the lower guide 86 to create a fluid bearing between the device table 48 and the guide assembly 50. The fluid bearing maintains the device table 48 spaced apart from the guide assembly 50 along the X axis and allows for motion of the device table 48 along the Y axis relative to the guide assembly 50.

The guide ends 88, 90 secure the upper beam 84 to the lower guide 86, and secure a portion of the stage mover assembly 16 to the guide assembly 50. Additionally, each of the guide ends 88, 90 includes a guide fluid pad 96 that is positioned adjacent to the reaction base 42. In this embodiment, each of the guide fluid pads 96 includes a plurality of spaced apart fluid outlets (not shown), and a plurality of spaced apart fluid inlets (not shown). Pressurized fluid (not shown) is released from the fluid outlets towards the reaction base 42 and a vacuum is pulled in the fluid inlets to create a vacuum preload type, fluid bearing between each of the guide fluid pads 96 and the reaction base 42. The vacuum preload type, fluid bearing maintains the guide assembly 50 spaced apart along the Z axis relative to the reaction base 42 and allows for motion of the guide assembly 50 along the X axis, along the Y axis, and about the Z axis relative to the reaction base 42.

Alternately, the guide assembly 50 can be supported spaced apart from the reaction base 42 by other ways. For example, a magnetic type bearing or a ball bearing type of assembly could be utilized that allows for motion of the guide assembly 50 relative to the reaction base 42.

The components of each stage 14 can be made of a number of materials including ceramic, such as alumina or silicon carbide; metals such as aluminum; composite materials; or plastic.

The stage mover assembly 16 controls and moves each stage 14 relative to the stage base 12. The design of the stage mover assembly 16 and the movement of the stages 14 can be varied to suit the movement requirements of the stage assembly 10. In the embodiment illustrated in FIGS. 1–3, the stage mover assembly 16 moves the stage 14 with a relatively large displacement along the X axis, a relatively large displacement along the Y axis, and a limited displacement about the Z axis (theta Z) relative to the stage base 12. In this embodiment, the stage mover assembly 16 includes: (i) a first X stage mover 98, (ii) a second X stage mover 100, (iii) an upper Y guide mover 102, (iv) a lower Y guide mover 104, and (V) a Y stage mover 106. The X stage movers 98, 100 move the stage 14 along the X axis and about the Z axis. The Y stage movers 102, 104, 106 move the guide assembly 50 and the stage 14 along the Y axis. More specifically, in this embodiment, (i) the X stage movers 98, 100 move the guide assembly 50 with a relatively large displacement along the X axis and with a limited range of motion about the Z axis (theta Z), (ii) the Y guide movers 102, 104 move the guide assembly 50 with a small displacement along the Y axis, and (iii) the Y stage mover 106 moves the device table 48 with a relatively large displacement along the Y axis.

The design of each mover 98, 100, 102, 104, 106 can be varied to suit the movement requirements of the stage assembly 10. As provided herein, each mover 98, 100, 102, 104, 106 includes a first component 108 and an adjacent second component 110, which interact with the first component 108. In the embodiments provided herein, each of the Y guide movers 102, 104 is an E/I core type actuator. Further, in the embodiments provided herein, for the X stage movers 98, 100 and the Y stage mover 106, one of the components 108, 110 includes one or more magnet arrays (not shown) and the other component 108, 110 includes one or more conductor arrays (not shown).

Each magnet array includes one or more magnets (not shown). The design of each magnet array and the number of magnets in each magnet array can be varied to suit the design requirements of the movers 98, 100, 106. Each magnet can be made of a permanent magnetic material such as NdFeB.

Each conductor array includes one or more conductors (not shown). The design of each conductor array and the number of conductors in each conductor array is varied to suit the design requirements of the movers 98, 100, 106. Each conductor can be made of metal such as copper or any substance or material responsive to electrical current and capable of creating a magnetic field such as superconductors.

Electrical current (not shown) is individually supplied to each conductor in each conductor array by the control system 22. For each mover 98, 100, 106, the electrical current In each conductor interacts with a magnetic field (not shown) generated by one or more of the magnets in the magnet array. This causes a force (Lorentz force) between the conductors and the magnets that can be used to move the stage 14 relative to the stage base 12.

Specifically, the first component 108 and the second component 110 of each X stage mover 98, 100 interact to selectively move the stage 14 along the X axis and about the Z axis relative to the stage base 12. In the embodiment illustrated in the FIG. 1, each X stage mover 98, 100 is a commutated, linear motor.

The first component 108 for the first X stage mover 98 is secured to a first X reaction mass 112 of the X reaction component 33A of the reaction mass assembly 18 while the second component 110 of the first X stage mover 98 is secured to the first guide end 88 of the guide assembly 50. Similarly, the first component 108 for the second X stage mover 100 is secured to a second X reaction mass 114 of the X reaction component 33A of the reaction mass assembly 18 while the second component 110 of the second X stage mover 100 is secured to the second guide end 90 of the guide assembly 50. In this embodiment, the first component 108 of each X stage mover 98, 100 includes a conductor array (not shown) while the second component 110 of each X stage mover 98, 100 includes a pair of spaced apart magnet arrays (not shown). Alternately, for example, the first component 108 of each X stage mover 98, 100 can include a magnet array (not shown) while the second component 110 of each X stage mover 98, 100 can include a pair of spaced apart conductor arrays (not shown).

It should be noted that the first X stage mover 98 for each of the stages 14 illustrated in the FIGS. 1–3 share the same first component 108. Similarly, the second X stage mover 100 for each of the two stages 14 illustrated in the FIGS. 1–3 share the same first component 108.

With the design provided herein, the X stage movers 98, 100 make relatively large displacement adjustments to the position of the guide assembly 50 along the X axis. The required stroke of the X stage movers 98, 100 along the X axis will vary according to desired use of the stage assembly 10. More specifically, for an exposure apparatus 30, generally, the stroke of the X stage movers 98, 100 for moving the semiconductor wafer 28 is between approximately two hundred (200) millimeters and one thousand (1000) millimeters.

The X stage movers 98, 100 also make relatively slight adjustments to position of each stage 14 about the Z axis. In order to make the adjustments about the Z axis, the second component 110 of one of the X stage movers 98, 100 is moved relative to the second component 110 of the other X stage mover 98, 100. With this design, the X stage movers 98, 100 generate torque about the Z axis. A gap (not shown) exists between the first component 108 and the second component 110 of each X stage mover 98, 100 to allow for slight movement of each stage 14 about the Z axis. Typically, the gap is between approximately one millimeter and five millimeters. However, depending upon the design of the particular mover, a larger or smaller gap may be utilized.

The Y guide movers 102, 104 selectively move the guide assembly 50 along the Y axis relative to the stage base 12. In the embodiment illustrated in FIGS. 1–3, each Y guide mover 102, 104 includes an opposed pair of electromagnetic actuators. The electromagnetic actuators consume less power and generate less heat than a voice coil motor or a linear motor. Suitable electromagnetic actuators include the E/I core actuators 214 described above and illustrated in FIGS. 6A and 6B.

In the embodiments provided herein: (i) the combination E shaped core and conductor of each electromagnetic actuator is considered the second component 110 to of each Y guide mover 102, 104 and is secured to the guide assembly 50, and (ii) the I shaped core of each electromagnetic actuator is considered the first component 108 of each Y guide mover 102, 104 and is secured to the second X reaction mass 114 of the reaction mass assembly 18. In this embodiment, each Y guide mover 102, 104 includes two E core and conductor combinations that are separated by a row of I cores.

It should be noted that the upper Y guide mover 102 for each of the stages 14 illustrated in the FIGS. 1–3 share the same first component 108. Similarly, the lower Y guide mover 104 for each of the two stages 14 illustrated in the FIGS. 1–3 share the same first component 108.

The Y stage mover 106 moves the stage 14 with a relatively large displacement along the Y axis relative to the stage base 12. More specifically, the first component 108 and the second component 110 of the Y stage mover 106 interact to selectively move the device table 48 along the Y axis relative to the guide assembly 50. In the embodiment illustrated in the FIGS. 13, the Y stage mover 106 is a commutated, linear motor. The first component 108 for the Y stage mover 106 is secured to the upper beam 84 of the guide assembly 50, and the second component (not shown) is secured to the inner guide section 65 of the device table 48. In this embodiment, the first component 108 of the Y stage mover 106 includes a conductor array (not shown) and the second component 110 of the Y stage mover 106 includes a magnet array (not shown). Alternately, for example, the first component 108 of the Y stage mover 106 could include a magnet array (not shown) while the second component 110 of the Y stage mover 106 could include a conductor array (not shown).

With this design, the Y stage mover 106 makes relatively large displacement adjustments to the position of the device table 48 along the Y axis. The required stroke of the Y stage mover 106 along the Y axis will vary according to desired use of the stage assembly 10. More specifically, for an exposure apparatus 30, generally, the stroke of the Y stage mover 106 for moving the semiconductor wafer 28 is between approximately one hundred (100) millimeters and six hundred (600) millimeters.

The reaction mass assembly 18 reduces and minimizes the amount of reaction forces from the stage movers 98, 100, 102, 104, 106 that is transferred to the stage base 12 and to the mounting base 24. Uniquely, the reaction mass assembly 18 provided herein is free to move with at least two, and more preferably three, degrees of freedom. More specifically, the reaction mass assembly 18 is free to move along the X axis, along the Y axis, and about the Z axis relative to the stage base 12. This design allows the reaction mass assembly 18 to reduce and minimize the amount of reaction forces from the stage movers 98, 100, 102, 104, 106 that is transferred to the stage base 12 and to the mounting base 24. Further, the reaction mass assembly 18 provided herein reduces and minimizes the reaction forces for multiple stages 14.

The design of the reaction mass assembly 18 can be varied to suit the design requirements of the stage assembly 10. In the embodiment illustrated in FIGS. 1–3, the reaction mass assembly 18 includes the Y reaction component 33B, the X reaction component 33A, and a reaction mover assembly 124. In this design, the Y reaction component 33B includes the reaction base 42, and the X reaction component 33A includes the first X reaction mass 112, and the second X reaction mass 114. Further, the reaction mass assembly 18, is supported above the stage base 12 by the fluid bearings as provided above.

As an overview, through the principle of conservation of momentum, movement of each stage 14 with the X stage movers 98, 100 along the X axis in one direction, moves the X reaction masses 112, 114 of the reaction mass assembly 18 in the opposite direction along the X axis. Somewhat similarly, movement of each stage 14 with the Y stage movers 102, 104, 106 along the Y axis in one direction, moves the X reaction masses 112, 114 and the reaction base 42 along the Y axis in the opposite direction. With this design, the reaction forces from the stage mover assembly 16 are negated. This inhibits the reaction forces from the stage mover assembly 16 from influencing the position of the stage base 12.

The reaction base 42 supports each stage 14 and the X reaction masses 112, 114. The design of the reaction base 42 can be varied to suit the design requirements of the stage assembly 10. In the embodiment illustrated in FIGS. 1–3, the reaction base 42 is generally rectangular shaped and includes a planar, upper surface 126, a planar bottom surface 128, and four sides 130.

The reaction base 42 also includes a mass guide assembly 131 that guides the X reaction masses 112, 114, and allow the X reaction masses 112, 114 to move relative to the reaction base 42 along the X axis. In the embodiments provided herein, the reaction base 42 includes a pair of base guides 132. Each base guide 132 is a rectangular shaped channel in the upper surface 126 that extends along the X axis. Pressurized fluid is released into the channel and a vacuum is created between the reaction base 42 and each of the X reaction masses 112, 114 to create a vacuum preload type fluid bearing (not shown). The fluid bearing maintains the X reaction masses 112, 114 spaced apart from the reaction base 42, and allows for independent motion of the X reaction masses 112, 114 along the X axis relative to the reaction base 42. Alternately, the X reaction masses 112, 114 can be supported above the reaction base 42 by other ways such as magnetic type bearing (not shown) or a ball bearing type of assembly (not shown).

It should be noted in this embodiment, that the X reaction masses 112, 114 and the reaction base 42 move concurrently along the Y axis and about the Z axis. Stated another way, the X reaction masses 112, 114 are rigidly coupled along the Y axis.

Referring to FIGS. 1–3, each of the X reaction masses 112, 114 includes a mass top 134, a mass bottom 136, a mass outer side 138, and a mass inner side 140. Each of the X reaction masses 112, 114 also includes a mass follower 142 that interacts with one the base guides 132 in the reaction base 42 to allow for movement of each X reaction mass 112, 114 along the X axis. In the embodiment illustrated in FIGS. 1–3, the mass follower 142 is a rectangular shaped body that extends downward from the mass bottom 136 of each X reaction mass 112, 114.

The first X reaction mass 112 is generally rectangular shaped and includes a somewhat rectangular shaped first channel 144 that extends into the mass inner side 140 of the first X reaction mass 112. In this embodiment, the first component 108 of the first X stage mover 98 is positioned within the first channel 144 and secured to the first X reaction mass 112.

The second X reaction mass 114 is somewhat rectangular shaped and includes a rectangular shaped upper groove 146 in the mass top 134 and a somewhat rectangular shaped second channel 148 that extends into the mass inner side 140 of the second X reaction mass 114. In this embodiment, the first component 108 of the upper Y guide mover 102 is positioned within the upper groove 146 and is secured to the second X reaction mass 114. Additionally, the first component 108 of the second X stage mover 100 and the first component (not shown) of the lower Y guide mover 104 are positioned within the second channel 148 and are secured to the second X reaction mass 114.

Additionally, each of the X reaction masses 112, 114 includes an "L" shaped bracket 150 that is secured to the mass outer side 138. Each bracket 150 is used to secure a portion of the reaction mover assembly 124 to the X reaction masses 112, 114.

The reaction mover assembly 124 makes minor corrections (i) to the position of the X reaction masses 112, 114 relative to the reaction base 42 and (ii) to the position of the reaction mass assembly 18 relative to the stage base 12. As provided herein, the reaction mover assembly 124 can adjust the position of the reaction mass assembly 18 relative to the stage base 12 in one degree of freedom, and more preferably, in three degrees of freedom. For example, the reaction mover assembly 124 can: (i) move the X reaction component 33A relative to the Y reaction component 33B along the X axis, (ii) move the X reaction component 33A and the Y reaction component 33B concurrently relative to the stage base 12 along the Y axis, (iii) move the X reaction component 33A and the Y reaction component 33B concurrently relative to the stage base 12 along the X axis, and/or (iv) move the X reaction component 33A and the Y reaction component 33B, concurrently relative to the stage base 12 about the Z axis.

In the embodiment illustrated in FIGS. 1–3, the reaction mover assembly 124 is used to make minor corrections along the X axis, along the Y axis, and about the Z axis to the position of the reaction mass assembly 18 relative to the stage base 12. Further, the reaction mover assembly 124 is used to independently correct the position of the X reaction masses 112, 114 along the X axis relative to the reaction base 42.

The design of the reaction mover assembly 124 can be varied according to the design requirements of the stage assembly 10. For example, the reaction mover assembly 124 can include one or more rotary motors, voice coil motors, linear motors, electromagnetic actuators, and/or force actuators. In the embodiment illustrated in the FIGS. 1–3, the reaction mover assembly 124 includes a first upper X reaction mover 152A, a second upper X reaction mover 152B, a pair of lower X reaction movers 154, and a Y reaction mover 156. Alternately, for example, the reaction mover assembly 124 could include a single, lower X reaction mover and a pair of Y reaction movers.

In the embodiments illustrated in FIGS. 1–3, each reaction mover 152, 154, 156 includes a first component 158, and an adjacent second component 160. In the embodiments provided herein, one of the components 168, 160 of each mover 152, 154, 156 includes one or more magnet arrays (not shown) and the other component 158, 160 of each mover 152, 154, 156 includes one or more conductor arrays (not shown). Electrical current (not shown) is individually supplied to each conductor array by the control system 22. For each reaction mover 152, 154, 156, the electrical current in each conductor interacts with a magnetic field (not shown) generated by one or more of the magnets in the magnet array. This causes a force (Lorentz force) between the conductors and the magnets.

Specifically, the first component 158 and the second component 160 of each upper X reaction mover 152 interact to selectively and independently move one of the X reaction masses 112, 114 along the X axis relative to the reaction base 42. In the embodiment illustrated in the FIG. 1, each upper X reaction mover 152 is a commutated, linear motor. For the first upper X reaction mover 152A, the first component 158 is secured to the first X reaction mass 112, while the second component 160 is secured to the reaction base 42. Similarly, for the second upper X reaction mover 152B, the first component 158 is secured to the second X reaction mass 114, while the second component 160 is secured to the reaction base 42.

In this embodiment, the first component 158 of each upper X reaction mover 152 includes a conductor array (not shown), while the second component 160 of each upper X reaction mover 152 includes a pair of spaced apart magnet arrays (not shown). With this design, the upper X reaction movers 152 can independently make corrections to the positions of the X reaction masses 112, 114 along the X axis relative to the reaction base 42. Alternately, for example, the first component of each upper X reaction mover 152 could include a pair of spaced apart magnet arrays while the second component of each upper X reaction mover 152 could include a conductor array.

Preferably, the upper X reaction movers 152 include a measurement device (not shown) such as an encoder that provides information regarding the position of the X reaction masses 112, 114 relative to the reaction base 42 along the X axis.

Somewhat similarly, the first component 158 and the second component 160 of each lower X reaction mover 154 interact to collectively move the reaction base 42 along the X axis relative to the stage base 12, and to rotate the reaction base 42 and the X reaction masses 112, 114 about the Z axis relative to the stage base 12. In the embodiment illustrated in the FIG. 1, each lower X reaction mover 154 is a commutated, linear motor. For each of the lower X reaction movers 164, the first component 158 is secured to the reaction base 42 while the second component 160 is secured to the mounting base 24 with a ground frame 164 (illustrated in FIG. 18). Alternately, for example, the second component 160 of each lower X reaction mover 154 can be secured to the stage base 12.

In this embodiment, the first component 158 of each lower X reaction mover 154 includes a conductor array (not shown), while the second component 160 of each lower X reaction mover 154 includes a pair of spaced apart magnet arrays (not shown). With this design, the lower X reaction movers 154 can make minor corrections to the positions of the reaction base 42 along the X axis relative to the stage base 12, and to rotate the reaction base 42 and the X reaction masses 112, 114 about the Z axis relative to the stage base 12. Alternately, for example, the first component 158 of each lower X reaction mover 154 could include a pair of spaced apart magnet arrays while the second component 160 of each upper X reaction mover 154 could include a conductor array.

Preferably, the lower X reaction movers 154 include a measurement device (not shown) such as an encoder that provides information regarding the position of the reaction base 42 relative to the stage base 12 along the X axis and about the Z axis.

Similarly, the first component 158 and the second component 160 of the Y reaction mover 156 interact to selectively move the reaction base 42 and the X reaction masses 112, 114 concurrently along the Y axis relative to the stage base 12. In the embodiment illustrated in FIG. 1, the Y reaction mover 156 is a commutated, linear motor. For the Y reaction mover 156, the first component 158 is secured to the reaction base 42 while the second component 160 is secured to the mounting base 24 with the ground frame 164 (illustrated in FIG. 18). Alternately, for example, the second component 160 of each Y reaction mover 156 can be secured to the stage base 12.

In this embodiment, the first component 158 of each Y reaction mover 156 includes a conductor array while the second component 160 of each Y reaction mover 156 includes a pair of spaced apart magnet arrays (not shown). With this design, the Y reaction movers 156 can make minor corrections to the position of the reaction base 42 and the X reaction masses 112, 114 along the Y axis relative to the stage base 12. Alternately, for example, the first component of the Y reaction mover 156 could include a pair of spaced apart magnet arrays while the second component of the Y reaction mover 156 could include a conductor array.

Preferably, the Y reaction mover 156 includes a measurement device (not shown) such as an encoder that provides information regarding the position of the reaction base 42 relative to the stage base 12 along the Y axis.

For each of the embodiments provided herein, the ratio of the mass of the reaction mass assembly 18 to the mass stage 14 is preferably relatively high. This will minimize the movement of the reaction mass assembly 18 and minimize the required travel of the reaction movers 152, 154, 156. A suitable ratio of the mass of the reaction mass assembly 18 to the mass of the stage 14 is between approximately 1:2 and 1:10. A larger mass ratio is better, but is limited by the physical size of the X reaction mass assembly 18.

Preferably, each of the movers in the stage, mover assembly 16 and the reaction mover assembly 124, are at the same height along the Z axis. In the X axis, the Y stage mover 106, a center of gravity of the device table 48, and a center of gravity of the guide assembly 50 are preferably in line. Also, in the X axis, the Y reaction mover 156 and the center of gravity of the Y reaction component 33B are preferably in line. In the Y axis, the center of gravity of the device table 48 and the fluid bearing between the device table 48 and the guide assembly 50 are preferably in line. In the Y axis, the center of gravity of the first X reaction mass 112, the first X stage mover 98, and the first upper reaction mover 152A are preferably in line. In the Y axis, the center of gravity of the second X reaction mass 114, the second X stage mover 100, and the second upper X reaction mover 152 are preferably in line.

The measurement system 20 monitors movement of each stage 14 relative to the stage base 12, or to some other reference such as a lens assembly 508 (illustrated in FIG.

18). With this information, the stage mover assembly 16 can be used to precisely position of the stages 14. The design of the measurement system 20 can be varied. For example, the measurement system 20 can utilize laser interferometers, encoders, and/or other measuring devices to monitor the position of the stages 14.

In the embodiment illustrated in FIGS. 1–3, the measurement system 20 monitors the position of the device table 48 for each stage 14 along the X axis, along the Y axis, and about the Z axis. For the design illustrated in FIGS. 1–3, for each stage 14, the measurement system 20 measures the position of the device table 48 relative to the guide assembly 50 along the Y axis, and the measurement system 20 measures the position of the device table 48 along the Y axis, along the X axis, and about the Z axis relative to the lens assembly 508.

In this embodiment, for each stage 14, the measurement system 20 utilizes a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Additionally, for each stage 14, the measurement system 20 includes an XZ interferometer 170 and a Y interferometer 172. The XZ interferometer 170 includes an XZ mirror 174 and an XZ block 176. The XZ block 176 interacts with the XZ mirror 174 to monitor the location of the device table 48 along the X axis and about the Z axis (theta Z). More specifically, the XZ block 176 generates a pair of spaced apart XZ measurement laser beams (not shown) that are reflected off of the XZ mirror 174. With these laser beams, the location of the device table 48 along the X axis and about the Z axis can be monitored. Further, because the device table 48 does not move relative to the guide assembly 50 along the X axis or about the Z axis, the location of the guide assembly 50 along the X axis and about the Z axis can also be monitored by the XZ interferometer 170.

In the embodiment illustrated in the Figures, the XZ mirror 174 is rectangular shaped and extends along one side of the device table 48. The XZ block 176 is positioned away from the device table 48. The XZ block 176 can be secured to the apparatus frame 46 (illustrated in FIG. 18) or some other location that is isolated from vibration.

Somewhat similarly, the Y interferometer 172 includes a Y mirror 178 and a Y block 180. The Y mirror 178 interacts with the Y block 180 to monitor the position of the device table 48 along the Y axis. More specifically, the Y block 180 generates a Y measurement laser beam that is reflected off of the Y mirror 178. With this laser beam, the location of the device table 48 along the Y axis can be monitored. Further, because the position of the device table 48 relative to the guide assembly 50 along the Y axis is measured with the encoder, the position of the guide assembly 50 along the Y axis can also be monitored.

In the embodiment illustrated in the Figures, the Y mirror 178 is rectangular shaped and is positioned along one of the sides of the device table 48. The Y block 180 is positioned away from the device table 48. The Y block 180 can be secured to the apparatus frame 46 (illustrated in FIG. 18) or some other location that is isolated from vibration.

Additionally, for the embodiment illustrated in FIGS. 5A and 5B, the measurement system 20 includes one or more sensors (not shown) that measure the position of the upper table component 52 relative to the, lower table component 54.

The control system 22 controls the stage mover assembly 16 for each stage 14 to precisely position the stages 14 and the devices 26. In the embodiment illustrated in FIGS. 1–3, the control system 22 directs and controls the current to the conductor array for each of the X stage mover 98, 100 to control movement of the stages 14 along the X axis and about the Z axis. Similarly, the control system 22 directs and controls the current to conductor array for the Y stage mover 106 to control movement of the stages 14 along the Y axis. Also, the control system 22 directs and controls the current to the conductors of each E/I core actuator of each Y guide mover 102, 104 to control the position of the guide assembly 50.

Additionally, the control system 22 directs and controls current to the reaction mover assembly 124 to control the position of the reaction mass assembly 18 along the X axis, along the Y axis and about the Z axis. More specifically, the control system 22 directs current to the conductor array for each upper X reaction mover 152 to independently control the position of each X reaction mass 112, 114 relative to the reaction base 42. Further, the control system 22 directs current to the conductor array for each lower X reaction mover 154 and the Y reaction mover 156 to control the position of the reaction base 42 along the X axis, along the Y axis and about the Z axis relative to the stage base 12.

Figure 7A:
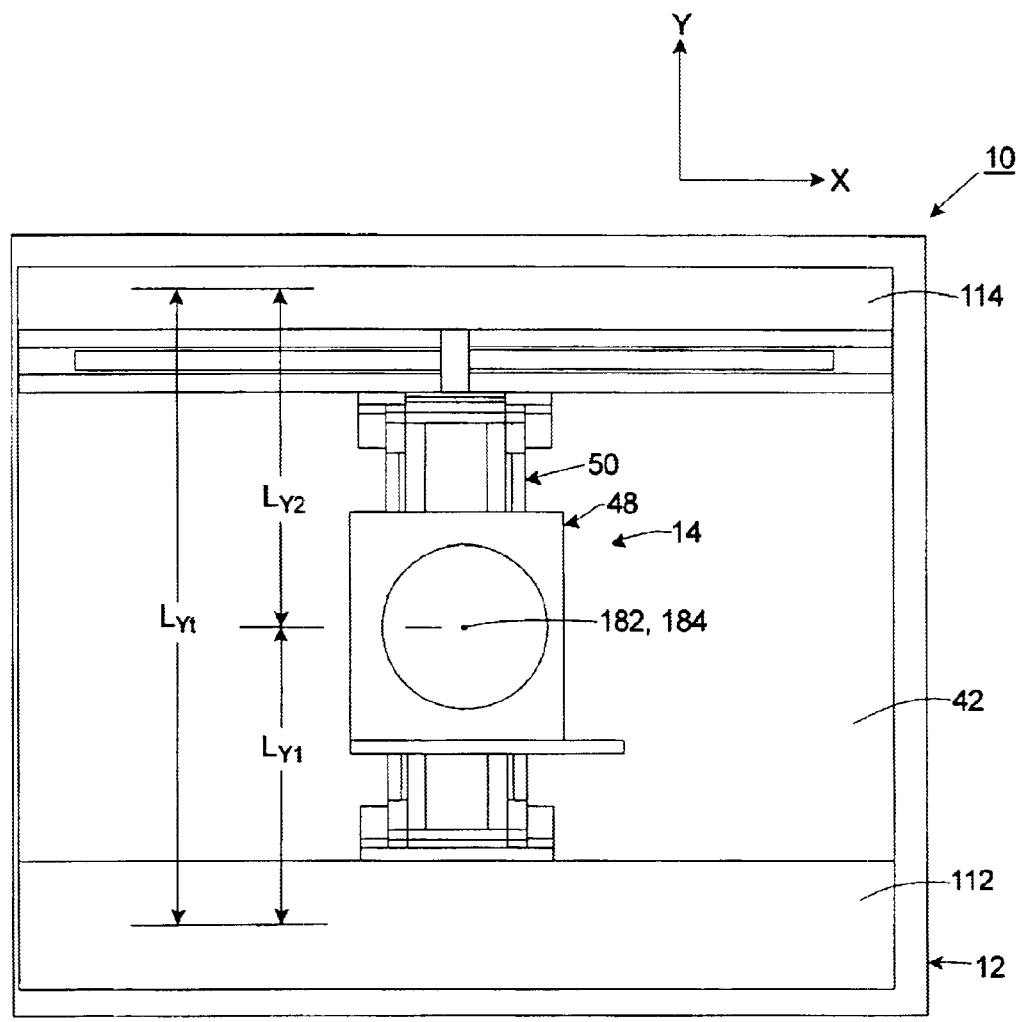
FIG. 7A is a simplified, schematic top view of a portion of a stage assembly.
Figure 7B:
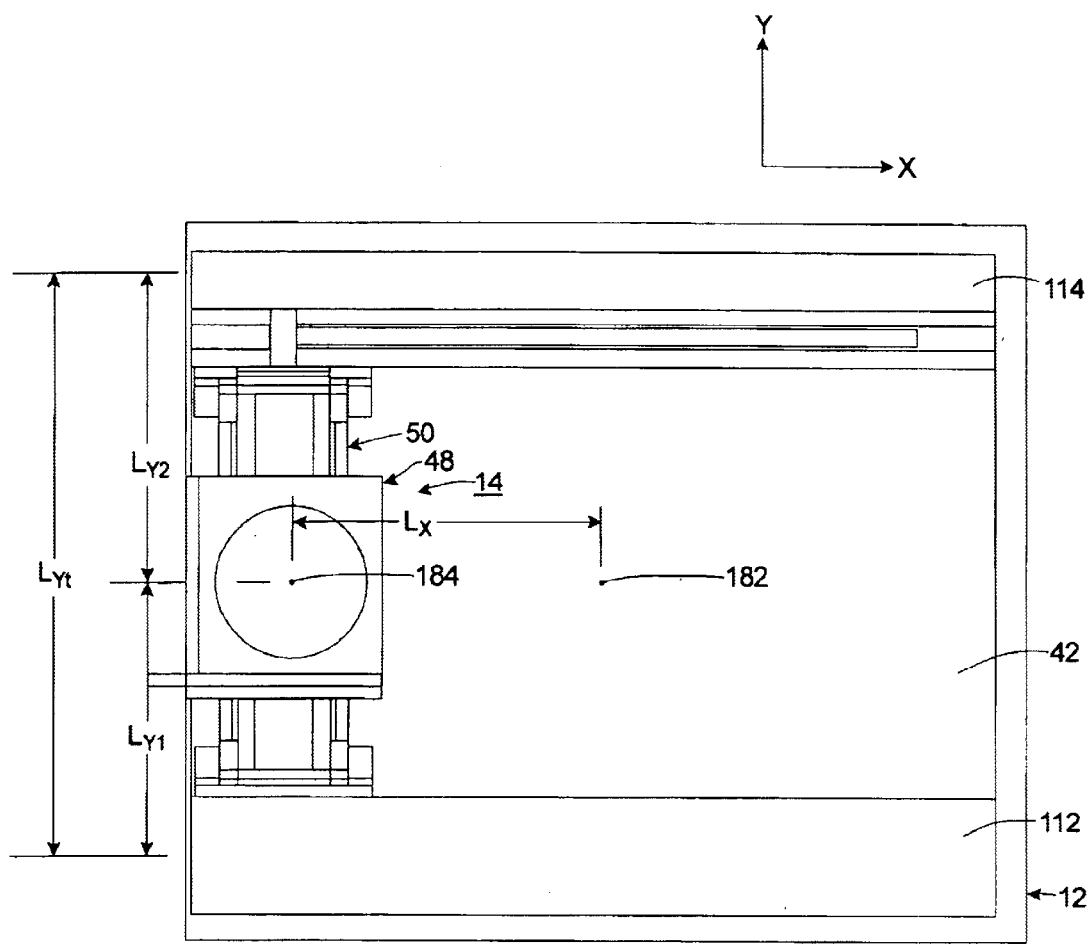
FIG. 7B is another, simplified schematic top view of a portion of the stage assembly.

FIGS. 7A and 7B illustrate simplified schematic top views of a portion of a stage assembly 10 having a single stage 14 that facilitate a discussion of the movement of the reaction mass assembly 18. In particular, FIG. 7A illustrates the stage assembly 10 with one device table 48 positioned approximately half-way between the X reaction masses 112, 114 along the,Y axis. In FIG. 7A, the device table 48 is positioned near a stage assembly combined center of gravity 182 and a stage center of gravity 184. In this embodiment, the stage assembly combined center of gravity 182 represents the center of gravity of the device table 48, the guide assembly 50, the first X reaction mass 112, the second X reaction mass 114, and the reaction base 42 and the stage center of gravity 184 represents the center of gravity of the device table 48 and the guide assembly 50. FIG. 7B illustrates the stage assembly 10 with the guide assembly 50, device table 48, and the stage center of gravity 184 positioned away from the stage assembly combined center of gravity 182.

The following symbols are used in conjunction with FIGS. 7A and 7B and the discussion provided below to describe the movement of the reaction mass assembly 18:

$L_{y1}$ represents the distance along the Y axis between the center of the first X reaction mass 112 and a stage combined center of gravity 184.

$L_{y2}$ represents the distance along the Y axis between the center of the second X reaction mass 114 and the stage combined center of gravity 184.

$L_{yt}$ represents the distance along the Y axis between the center of the first X reaction mass 112 and the center of the second X reaction mass 114.

$L_x$ represents the distance along the X axis between the stage assembly combined center of gravity 182 and the stage combined center of gravity 184.

$M_s$ represents the total mass of the stage 14.

$M_1$ represents the total mass of the first X reaction mass 112.

$M_2$ represents the total mass of the second X reaction mass 114.

$M_d$ represents the total mass of the device table 48.

$M_{cm}$ represents the combined mass of the X reaction masses 112, 114 the reaction base 42 and the guide assembly 50.

$a^x_s$ represents the acceleration of the stage 14 along the X axis.

$a^x_1$ represents the acceleration of the first X reaction mass 112 along the X axis.

$a^x_2$ represents the acceleration of the second X reaction mass 114 along the X axis.

$a^Y_d$ represents the acceleration of the device table 48 along the Y axis.

$a^Y_{cm}$ represents the acceleration of the X reaction masses 112, 114, the reaction base 42, and the guide assembly 50 along the Y axis.

Referring to FIG. 7A, during a move of the stage 14 along the X axis, under the principles of the conservation of momentum, the following formulas are applicable:

$$M_s \int a^x_s dt + M_1 \int a^x_1 dt + M_2 \int a^x_2 dt = \text{constant} = 0$$

$$M_1 a_1 L_{y1} = M_2 a_2 L_{y2}$$

Referring to FIG. 7B, during a move of the stage 14 along the Y axis, under the principles of conservation of momentum, the following formulas are applicable:

$$M_d \int a^Y_d dt + M_{cm} \int a^Y_{cm} dt = \text{constant} = 0$$

Further, to achieve zero torque:

$$M_d a^Y_d L_x = (M_2 a^x_2 - M_1 a^x_1) L_{yt} \qquad (2)$$

Further, to achieve no net force $$M_1 a_1^x + M_2 a_2^x = 0$$

Figure 7C:
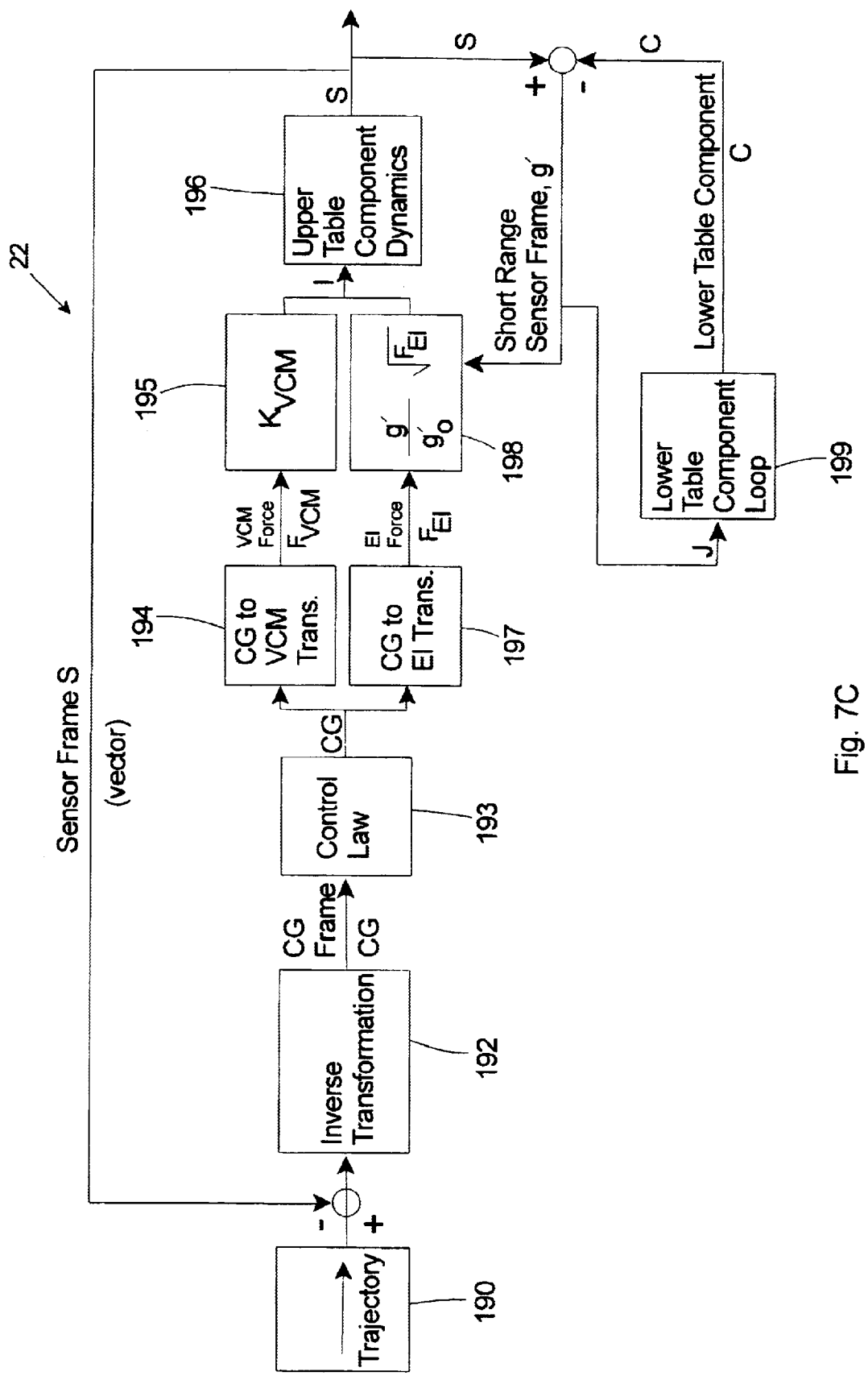
FIG. 7C is a simplified block diagram that illustrates the operation of a control system having features of the present invention.

FIG. 7C is a schematic that describes the sensing and control functions used to move and control a stage assembly 10 that includes the device table 48 illustrated in FIGS. 5A and 5B. The sensing and control functions are more thoroughly described in co-pending U.S. patent applications Ser. No. 09/022,713 filed Feb. 12, 1998, Ser. No. 09/139,954 filed Aug. 25, 1998, and Ser. No. 09/141,762 filed Aug. 27, 1998, each of which is hereby incorporated by reference thereto, in their entireties. A trajectory 190, or desired path for the focused optical system to follow, is determined based on the desired path of the wafer or other object to which the focused optical system is to be applied. The trajectory 190 is next fed into the control system 22. The trajectory 190 is compared with a sensor signal vector S that is generated from the output of measurement system 20. The difference vector, which results from the comparison, is transformed to a CG coordinate frame though an inverse transformation 192. The control law 193 prescribes the corrective action for the signal. The control law may be in the form of a PID (proportional integral derivative) controller, proportional gain controller or preferably a lead-lag filter, or other commonly known law in the art of control, for example.

The vector for vertical motion is fed to the CG to VCM transformation 194. This transforms the CG signal to a value of force to be generated by the VCMs, which is then fed to the VCM gain 195, and output to the stage hardware 196. The vector for planar motion is fed to the CG to EI-core transformation 197. This transforms the CG signal to a force to be generated by the EI-core force (i.e., electromagnet and target arrangements). Because the EI-core force depends upon the gap squared, it is compensated by the short range sensor vector g through the compensation block 198, to produce a linear output to the stage hardware 196. The stage hardware 196 responds to the input and is measured in the sensor frame S. A similar servo loop (block 199) is not shown in detail for moving the lower table component 54.

The position of lower table component 54, is also computed using the upper table component 52 and the gap g. As provided herein, the lower table component 54 is served to maintain a predetermined relationship to the upper table component 52.

Figure 9:
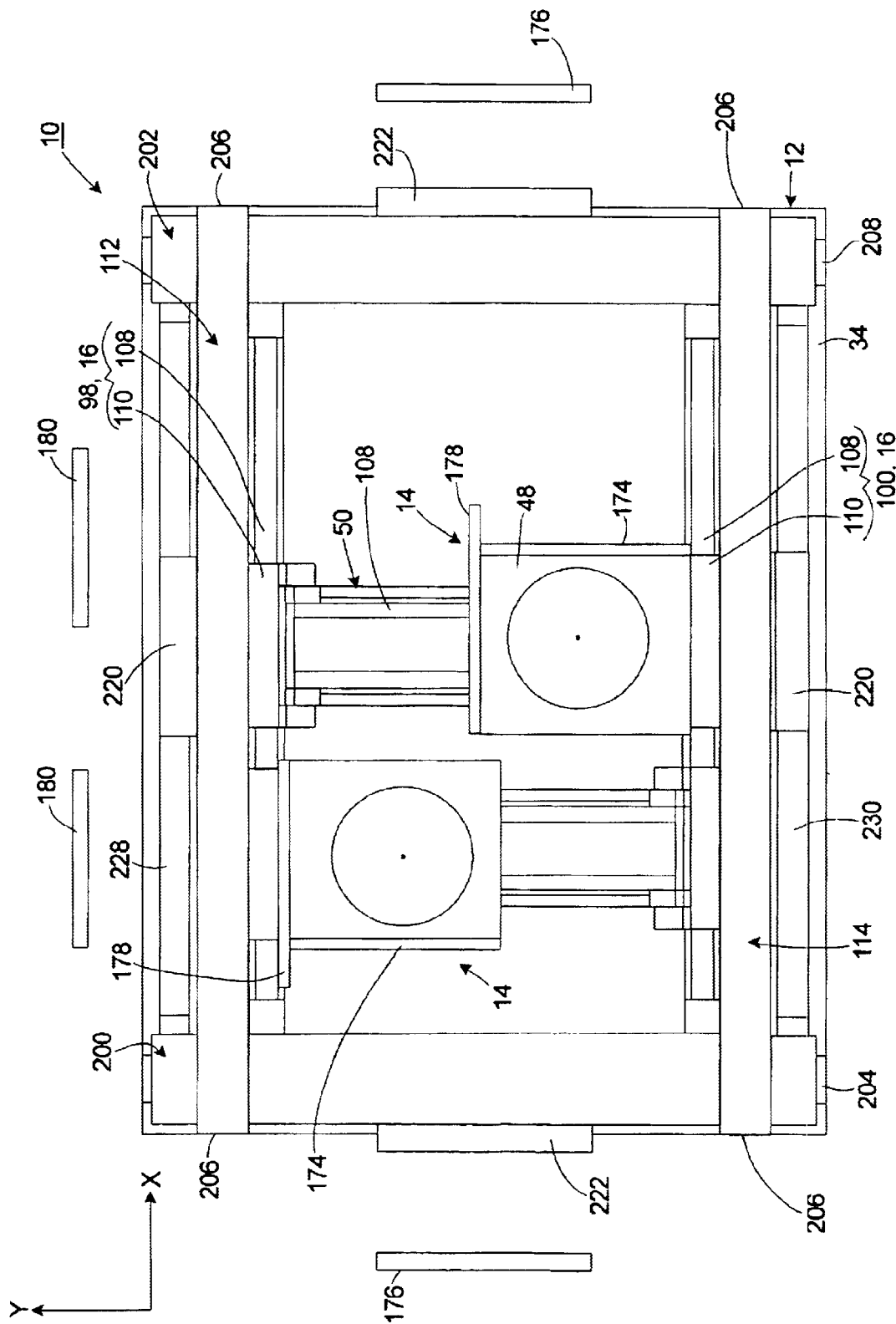
FIG. 9 is a top plan view of the stage assembly of FIG. 8.
Figure 10:
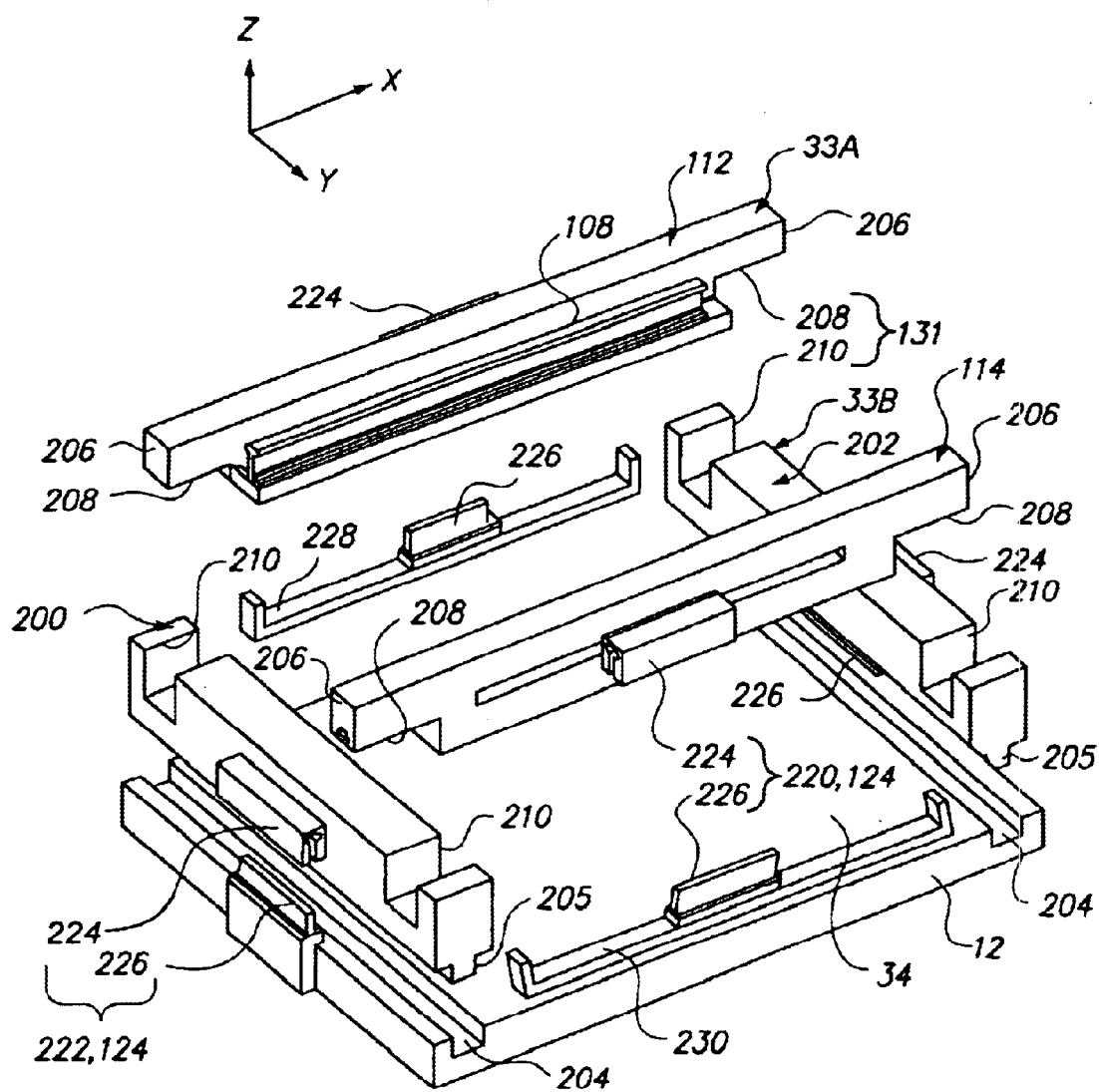
FIG. 10 is an exploded perspective view of a reaction mass assembly illustrated in FIG. 8.

FIGS. 8–10 illustrate a second embodiment having features of the present invention. In particular, FIG. 8 illustrates a perspective view of the stage assembly 10, FIG. 9 illustrates a top plan view of the stage assembly 10 of FIG. 8, and FIG. 10 illustrates an exploded perspective view of the reaction mass assembly 18. The stage assembly 10 illustrated in FIGS. 8 and 9 includes the stage base 12, a pair of stages 14, the stage mover assembly 16, the reaction mass assembly 18, the measurement system 20, and the control system 22.

In the embodiment illustrated in FIGS. 8–9, each stage 14, the stage mover assembly 16, the measurement system 20, and the control system 22 are somewhat similar to the equivalent components described above. However, in the embodiment illustrated in FIGS. 8–10, the stage base 12 and the reaction mass assembly 18 differ from the embodiment illustrated in FIGS. 1–3.

In the embodiment illustrated in FIGS. 8–10, the X reaction component 33A includes the X reaction masses 112, 114. However, in this embodiment, instead of a reaction base 42, the Y reaction component 33B includes a first Y reaction mass 200 and a second Y reaction mass 202.

Further, in this embodiment, the base top 34 of the stage base 12 includes a reaction guide assembly 203, e.g. a pair of reaction guides 204. Each Y reaction mass 200, 202 includes a Y follower 205. The reaction guides 204 cooperate with the Y followers 205 to guide movement of the Y reaction masses 200, 202 along the Y axis and allow the reaction masses 112, 114, 200, 202 to move relative to the stage base 12 along the Y axis. In the embodiments provided herein, each reaction guide 204 is a rectangular shaped channel in the base top 34 that extends along the Y axis, and each Y follower 205 is a rectangular shaped lip that extends below each Y reaction mass 200, 202 along the Y axis. Pressurized fluid is released into the channel and a vacuum is created between the stage base 12 and each of the Y reaction masses 200, 202 to create a vacuum preload type fluid bearing (not shown). The fluid bearing maintains the Y reaction masses 200, 202 spaced apart from the stage base 12 and allows for relative motion of the reaction masses 112, 114, 200, 202 along the Y axis relative to the stage base 12. Alternately, the Y reaction masses 200, 202 can be supported above the stage base 12 by other ways such as magnetic type bearing (not shown) or a ball bearing type assembly (not shown).

In this embodiment, the X reaction masses 112, 114 move independently relative to the Y reaction masses 200, 202 along the X axis. Further, all of the reaction masses 112, 114, 200, 202 move together along the Y axis. Stated another way, the X reaction masses 112, 114 are rigidly coupled in the Y direction and move concurrently with the Y reaction masses 200, 202 along the Y axis.

As can best be seen with reference to FIG. 10, each X reaction mass 112, 114 includes a pair of opposed ends 206. Each end 206 includes an X follower 208. In this embodiment, each X follower 208 is a notch in the end of the X reaction mass 112, 114. Each of the Y reaction masses 200, 202 includes two X guides 210. In this embodiment, each X guide 210 is a groove that is sized and shaped to receive a portion of one of the X reaction masses 112, 114. The X guides 210 and the X followers 208 cooperate to form the mass guide assembly 131. More specifically, the X guides 210 cooperate with the X followers 208, and allow the X reaction masses 112, 114 to move relative to the Y reaction masses 200, 202 along the X axis. Further, the X guides 210 cooperate with the X followers 208 to constrain the X reaction masses 112, 114 so that the X reaction masses 112, 114 move concurrently with the Y reaction masses 200, 202 along the Y axis.

In the design, pressurized fluid is released into each X guide 210 and a vacuum is created between each Y reaction mass 200, 202 and each of the X reaction masses 112, 114 to create a vacuum preload type fluid bearing (not shown). The fluid bearing maintains the X reaction masses 112, 114 spaced apart from the Y reaction masses 200, 202 and allows for relative motion of the X reaction masses 112, 114 independently along the X axis relative to the Y reaction masses 200, 202. Alternately, for example, the X reaction masses 112, 114 can be supported and allowed to move relative to the Y reaction masses 200, 202 by other ways, such as a magnetic type bearing (not shown) or a ball bearing type assembly (not shown).

Somewhat similar to the embodiment illustrated in FIGS. 1–3, in the embodiment illustrated in FIGS. 8–10, the first component 108 of the first X stage mover 98 is secured to and moves with the first X reaction mass 112. Additionally, the first component 108 of the second X stage mover 100 is secured to and moves with the second X reaction mass 114. Further, the first component 108 of the Y stage mover 106 is secured to the guide assembly 50, and the second component 110 is secured to the device table 48. However, in the embodiment illustrated in FIGS. 8–10, each stage 14 utilizes a single Y guide mover 212 to move the guide assembly 50 along the Y axis relative to the stage base 12. In the embodiment illustrated in FIGS. 8–10, the Y guide mover 212 is a pair of E/I core actuators 214.

In this embodiment, the reaction mover assembly 124 is again used to make minor corrections along the Y axis to the position of the reaction mass assembly 18 relate to the stage base 12. Further, the reaction mover assembly 124 is used to make minor corrections to the position of the X reaction masses 112, 114 along the X axis relative to the Y reaction masses 200, 202 and the stage base 12.

In the embodiment illustrated in FIGS. 8–10, the reaction mover assembly 124 includes a pair of X reaction movers 220 and a pair of Y reaction movers 222 that cooperate to correct the location of the reaction mass assembly 18 relative to the stage base 12. In the embodiment illustrated in FIGS. 8–10, each of the reaction movers 220, 222 includes a first component 224 and an adjacent, second component 226. In the embodiments provided herein, one of the components 224, 226 of each of the reaction movers 220, 222 includes one or more magnet arrays (not shown) and the other component 224, 226 of each of the reaction movers 220, 222 includes one or more conductor arrays (not shown).

Electrical current (not shown) is individually supplied to each conductor array by the control system 22. For each of the reaction movers 220, 222, the electrical current in each conductor interacts with a magnetic field (not shown) generated by one or more of the magnets in the magnet array. This causes a force (Lorentz force) between the conductors and the magnets.

Specifically, the first component 224 and the second component 226 of each X reaction mover 220 interact to independently move one of the X reaction masses 112, 114 along the X axis relative to the Y reaction masses 200, 202. In the embodiment illustrated in the FIGS. 8–10, each X reaction mover 220 is a commutated, linear motor. For one of the X reaction movers 220, the first component 224 is secured to the first X reaction mass 112 while the second component 226 is secured to either or both of the Y masses 200, 202. Similarly, for the other X reaction mover 220, the first component 224 is secured to the second X reaction mass 114 while the second component 228 is secured to either or both of the Y masses 200, 202.

In the embodiment illustrated in FIGS. 8–10, a first connector bracket 228 and a spaced apart second connector bracket 230 each extend between the Y masses 200, 202. The connector brackets 228, 230 move with the Y masses 200, 202 above the stage base 12. The first connector bracket 228 extends along the first X reaction mass 112 and the second connector bracket 230 extends along the second X reaction mass 114. In this embodiment, the second component 226 of each of the X reaction movers 220 is secured to the connector brackets 228, 230.

In FIGS. 8–10, the first component 224 of each X reaction mover 220 includes a pair of spaced apart magnet arrays (not shown), while the second component 226 of each X reaction mover 220 includes a conductor array (not shown). With this design, the X reaction movers 220 can independently make corrections to the positions of the X reaction masses 112, 114 along the X axis relative to the stage base 12. Alternately, for example, the first component of each X reaction mover could include a conductor array while the second component of each X reaction mover could include a pair of spaced apart magnet arrays.

Preferably, the X reaction movers 220 include a measurement device (not shown) such as an encoder that provides information regarding the position of the X reaction masses 112, 114 relative to the stage base 12 or the Y masses 200, 202 along the X axis.

Somewhat similarly, the first component 224 and the second component 226 of each Y reaction mover 222 interact to selectively move the reaction masses 112, 114, 200, 202 along the Y axis relative to the stage base 12. In the embodiment illustrated in FIGS. 8–10, each Y reaction mover 222 is a commutated, linear motor. For each of the Y reaction movers 222, the first component 224 Is secured to one of the Y reaction masses 200, 202 while the second component 226 is secured to the stage base 12.

In FIGS. 8–10, the first component 224 of each Y reaction mover 222 includes a pair of spaced apart magnet arrays (not shown) while the second component of each Y reaction mover includes a conductor array (not shown). With this design, the Y reaction movers 222 can make minor corrections to the positions of the reaction masses 112, 114, 200, 202 along the Y axis relative to the stage base 12. Alternately, for example, the first component 224 of each Y reaction mover 222 could include a conductor array while the second component 226 of each Y reaction mover 222 could include a pair of spaced apart magnet arrays.

Preferably, the Y reaction movers 222 include a measurement device (not shown) such as an encoder that provides information regarding the position of the Y reaction masses 200, 202 relative to the stage base 12 along the Y axis.

Alternately, in this embodiment, the second component 226 of each reaction mover 220, 222 could be secured to the mounting base 24 with the ground frame 164 (illustrated in FIG. 18) instead of to the stage base 12.

Figure 12:
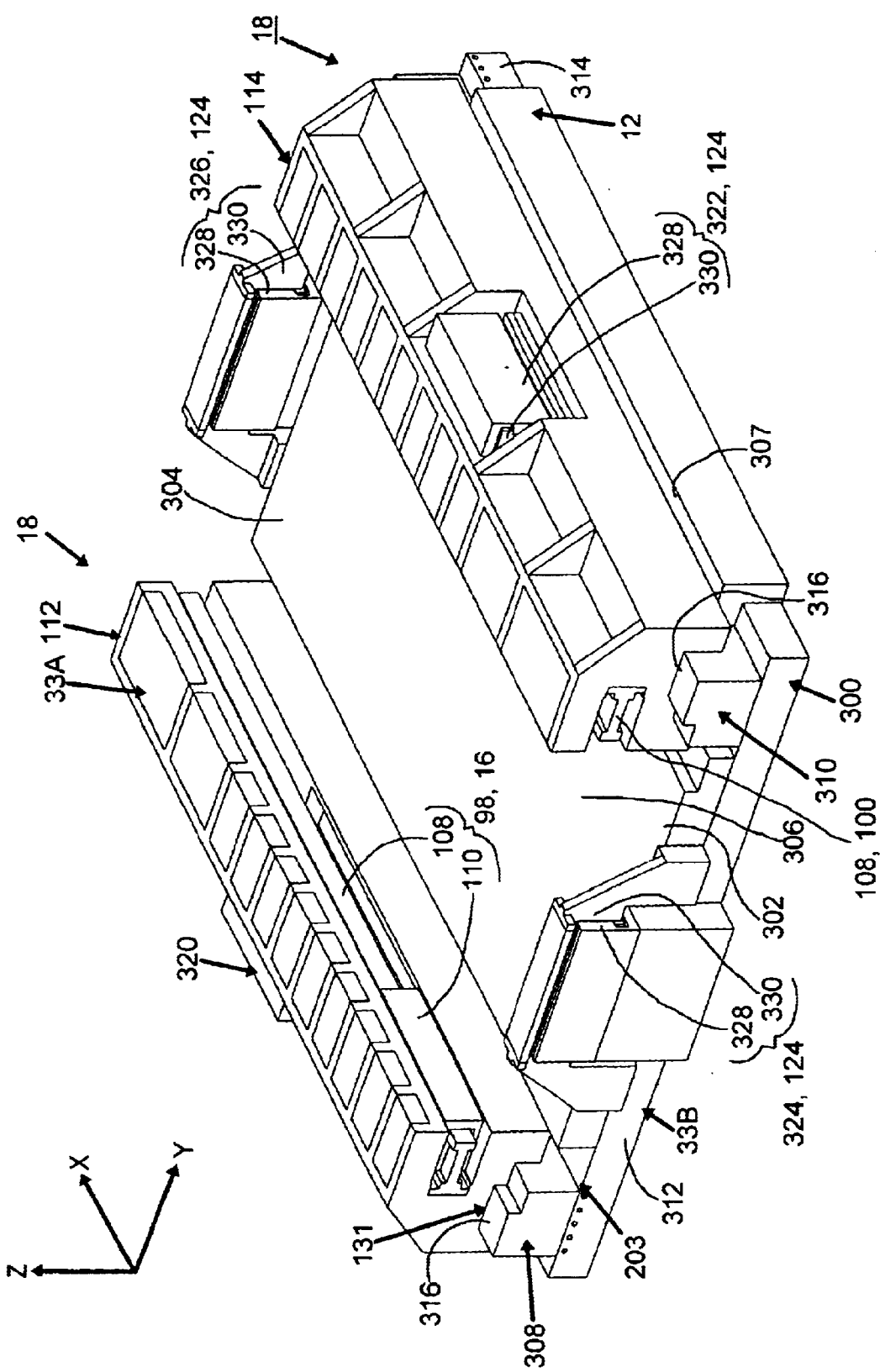
FIG. 12 is a perspective view of a reaction mass assembly illustrated in FIG. 11.
Figure 13:
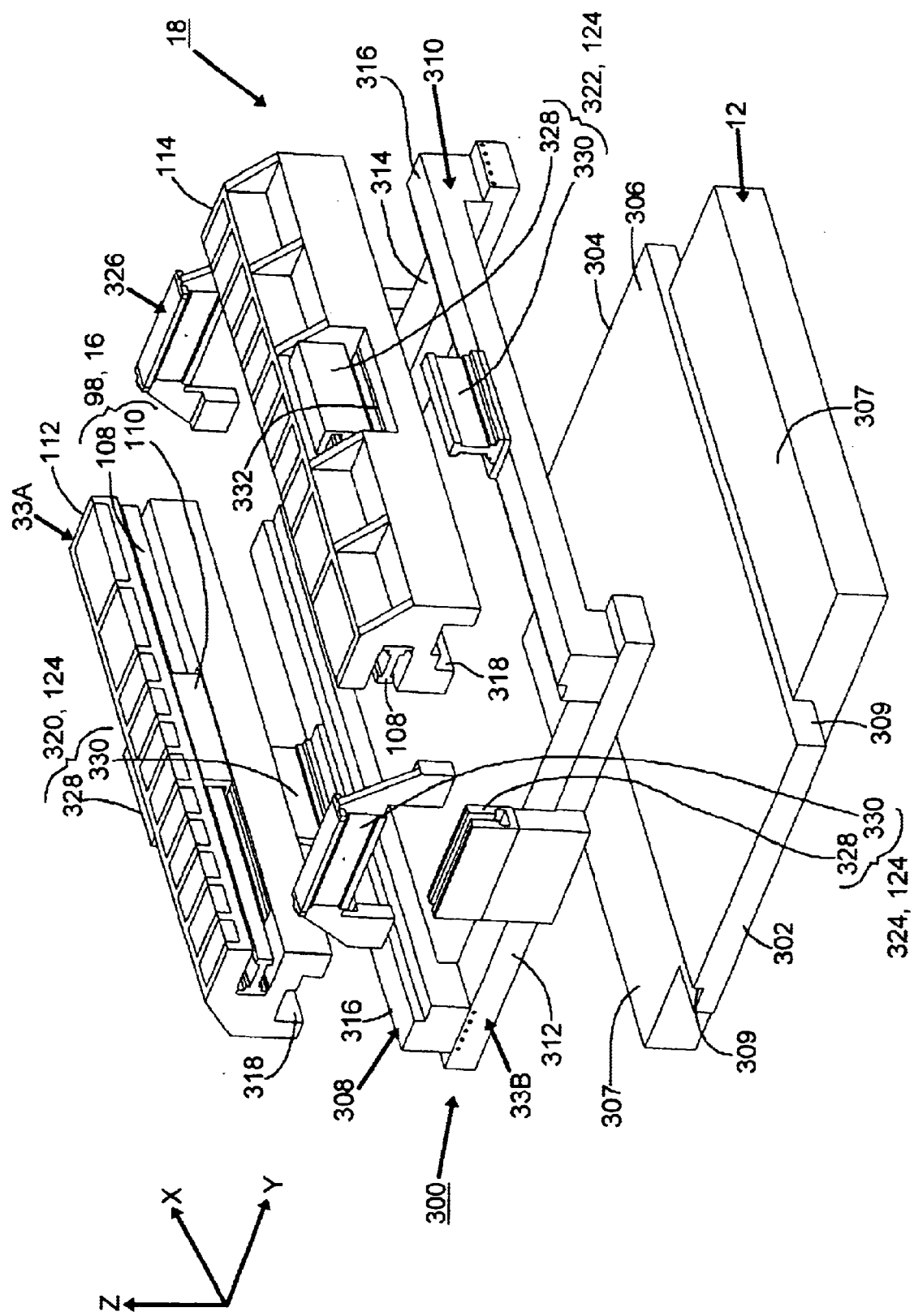
FIG. 13 is an exploded perspective view of the reaction mass assembly of FIG. 11.

FIGS. 11–13 illustrate a third embodiment having features of the present invention. In particular, FIG. 11 illustrates a perspective view of the stage assembly 10, FIG. 12 illustrates a perspective view of the reaction mass assembly 18, and FIG. 13 illustrates an exploded perspective view of the reaction mass assembly 18. The stage assembly 10 illustrated in FIG. 11 includes the stage base 12, a pair of stages 14, the stage mover assembly 16, the reaction mass assembly 18, and the control system 22. The measurement system is not illustrated in FIG. 11.

In the embodiment illustrated in FIG. 11, each stage 14, the stage mover assembly 16, and the control system 22 are somewhat similar to the equivalent components described above. However, in the embodiment illustrated in FIGS. 11–13, the stage base 12 and the reaction mass assembly 18 differ from the embodiment illustrated in FIGS. 1–3 and the embodiment illustrated in FIGS. 8–10.

In the embodiment illustrated in FIGS. 11–13, the X reaction component 33A includes the X reaction masses 112, 114. However, in this embodiment, instead of a reaction base, the Y reaction component 33B includes a reaction frame 300.

As can best be seen with reference to FIGS. 12 and 13, in this embodiment, the stage base 12 is somewhat rectangular shaped and includes a front lip 302, a rear lip 304, a raised central section 306, and a pair of spaced apart upper edge sections 307. The front lip 302 cantilevers away from a front side of the stage base 12, and the rear lip 304 cantilevers away from a rear side of the stage base 12. The raised central section 306 separates the upper edge sections 307. The raised central section 306 includes a pair of spaced apart section sides 309.

The reaction frame 300 is rectangular frame shaped and includes a first frame side 308, a second frame side 310, a front frame side 312, and a rear frame side 314. Referring to FIG. 13, the first and second frame sides 308, 310 are offset from and are positioned above the front and rear frame sides 312, 314. This feature enhances the access to the stages 14.

The first frame side 308 and the second frame side 310 each include an X mass guide 316 for guiding the X reaction masses 112, 114. Each X reaction mass 112, 114 includes an X follower 318. The X mass guides 316 and the X followers 318 cooperate to form the mass guide assembly 131. In this embodiment, each X mass guide 316 cooperates with the X follower 318 of one of the X reaction masses 112, 114, to guide the movement of the X reaction masses 112, 114 along the X axis relative to the reaction frame 300 and stage base 12. In the embodiments provided herein, the first and second frame sides 308, 310 are each somewhat rectangular beam shaped and each X follower 318 is a channel that extends along the X axis in each of the X reaction masses 112, 114. The front and rear frame sides 312, 314 are also generally rectangular shaped.

Pressurized fluid is released and a vacuum is created between the first and second frame sides 308, 310 and the X reaction masses 112, 114 to create a vacuum preload type fluid bearing (not shown). The vacuum preload type fluid bearing maintains the X reaction masses 112, 114 spaced apart from the reaction frame 300 and allows for independent relative motion of the X reaction masses 112, 114 along the X axis relative to the reaction frame 300 and stage base 12. Alternately, the X reaction masses 112, 114 can be supported above the reaction frame 300 by other ways such as a magnetic type bearing (not shown) or a ball bearing type assembly (not shown).

It should be noted in this embodiment, that the X reaction masses 112, 114 and the reaction frame 300 move concurrently along the Y axis.

In the design provided in FIGS. 11–13, the first frame side 308 and the second frame side 310 are positioned above the upper edge sections 307 and are separated by the raised central section 306. Further, the front frame side 312 is positioned below the front lip 302, and the rear frame side 314 is positioned below the rear lip 304. In the embodiment illustrated in FIGS. 11–13, the reaction frame 300 is maintained above the stage base 12 with a reaction guide assembly 203. More specifically, in this embodiment, pressurized fluid (not shown) is released and a vacuum is pulled in fluid inlets (not shown) to create a vacuum preload type fluid bearing between the stage base 12 and the reaction frame 300. The vacuum preload type, fluid bearing maintains the reaction frame 300 spaced apart from the stage base 12 along the X axis and along the Z axis. With this design, the vacuum preload type fluid bearing allows for motion of the reaction frame 300 along the Y axis relative to the stage base 12. Further, the fluid bearing inhibits movement of the reaction frame 300 relative to the stage base 12 along the X axis, along the Z axis, and about the X, Y and Z axis.

Alternately, the reaction frame 300 can be supported spaced apart from the stage base 12 by other ways. For example, a magnetic type bearing (not shown) or a ball bearing type assembly (not shown) could be utilized that allows for motion of the reaction frame 300 relative to the stage base 12.

Somewhat similar to the embodiment illustrated in FIGS. 1–3, in this embodiment, the first component 108 of the first X stage mover 98 is secured to and moves with the first X reaction mass 112; and, the first component 108 of the second X stage mover 100 is secured to and moves with the second X reaction mass 114.

Further, the stage assembly 10 illustrated in FIG. 11 includes a single, Y guide mover (not shown) that moves the guide assembly 50 along the Y axis relative to the stage base 12. In this embodiment, the reaction mover assembly 124 is used to make minor corrections along the Y axis to the position of the reaction mass assembly 18 relative to the stage base 12. Further, the reaction mover assembly 124 is used to independently make corrections to the position of the X reaction masses 112, 114 along the X axis relative to the reaction frame 300.

In the embodiment illustrated in FIGS. 11–13, the reaction mover assembly 124 includes a first X reaction mover 320, a second X reaction mover 322, a first Y reaction mover 324, and a second Y reaction mover 326, that cooperate to move the reaction mass assembly 18 relative to the stage base 12.

Each of the reaction movers 320, 322, 324, 326 includes a first component 328 and an adjacent, second component 330. In the embodiments provided herein, one of the components 328, 330 of each reaction mover 320, 322, 324, 326 includes one or more magnet arrays (not shown) and the other component 328, 330 of each mover 320, 322, 324, 326 includes one or more conductor arrays (not shown). Electrical current (not shown) is individually supplied to each conductor array by the control system 22. For each reaction mover 320, 322, the electrical current in each conductor interacts with a magnetic field (not shown) generated by one or more of the magnets in the magnet array. This causes a force (Lorentz force) between the conductors and the magnets.

Specifically, in the embodiment illustrated in the FIGS. 11–13, each X reaction mover 320, 322 is a commutated, linear motor. For the first X reaction mover 320, the first component 328 is secured to the first X reaction mass 112 while the second component 330 is secured to the first frame side 308 of the reaction frame 300. Similarly, for the second X reaction mover 322, the first component 328 is secured to the second X reaction mass 114 while the second component 330 is secured to the second frame side 310 of the reaction frame 300.

It should be noted in this embodiment that each X reaction mass 112, 114 includes a mass aperture 332, and that the second component 330 of each X reaction mover 320, 322 extends through the mass aperture 332.

In this embodiment, the first component 328 of each X reaction mover 320, 322 includes a pair of spaced apart magnet arrays (not shown) while the second component 330 of each X reaction mover 320, 322 includes a conductor array (not shown). With this design, the X reaction movers 320, 322 can make minor corrections to the positions of the X reaction masses 112, 114 along the X axis relative to the reaction frame 300 and the stage base 12. Alternately, for example, the first component of each X reaction mover could include a conductor array while the second component of each X reaction mover could include a pair of spaced apart magnet arrays.

Preferably, the X reaction movers 320, 322 include a measurement device (not shown) such as an encoder that provides information regarding the position of the X reaction masses 112, 114 relative to the reaction frame 300 and the stage base 12 along the X axis.

Somewhat similarly, in the embodiment illustrated in FIGS. 11–13, each Y reaction mover 324, 326 is a commutated, linear motor. For each of the Y reaction movers 324, 326, the first component 328 is secured to the reaction frame 300, while the second component 330 is secured to the stage base 12 or preferably to the mounting base 24. More specifically, for the first Y reaction mover 324, the first component 328 is secured to the front frame side 312, and the second component 330 is secured to the front lip 302. Similarly, for the second Y reaction mover 326, the first component 328 is secured to the rear frame side 314, and the second component 330 is secured to the rear lip 304.

In this embodiment, the first component 328 of each Y reaction mover 324, 326 includes a pair of spaced apart magnet arrays (not shown) while the second component 330 of each Y reaction mover 324, 326 includes a conductor array (not shown). With this design, the Y reaction movers 324, 326 can make minor corrections to the position of the reaction frame 300 and the X reaction masses 112, 114 along the Y axis relative to the stage base 12. Alternately, for example, the first component of each Y reaction mover could include a conductor array while the second component of each Y reaction mover could include a pair of spaced apart magnet arrays.

Preferably, the Y reaction movers 324, 326 include a measurement device (not shown) such as an encoder that provides Information regarding the position of the reaction frame 300 relative to the stage base 12 along the Y axis.

Figure 15:
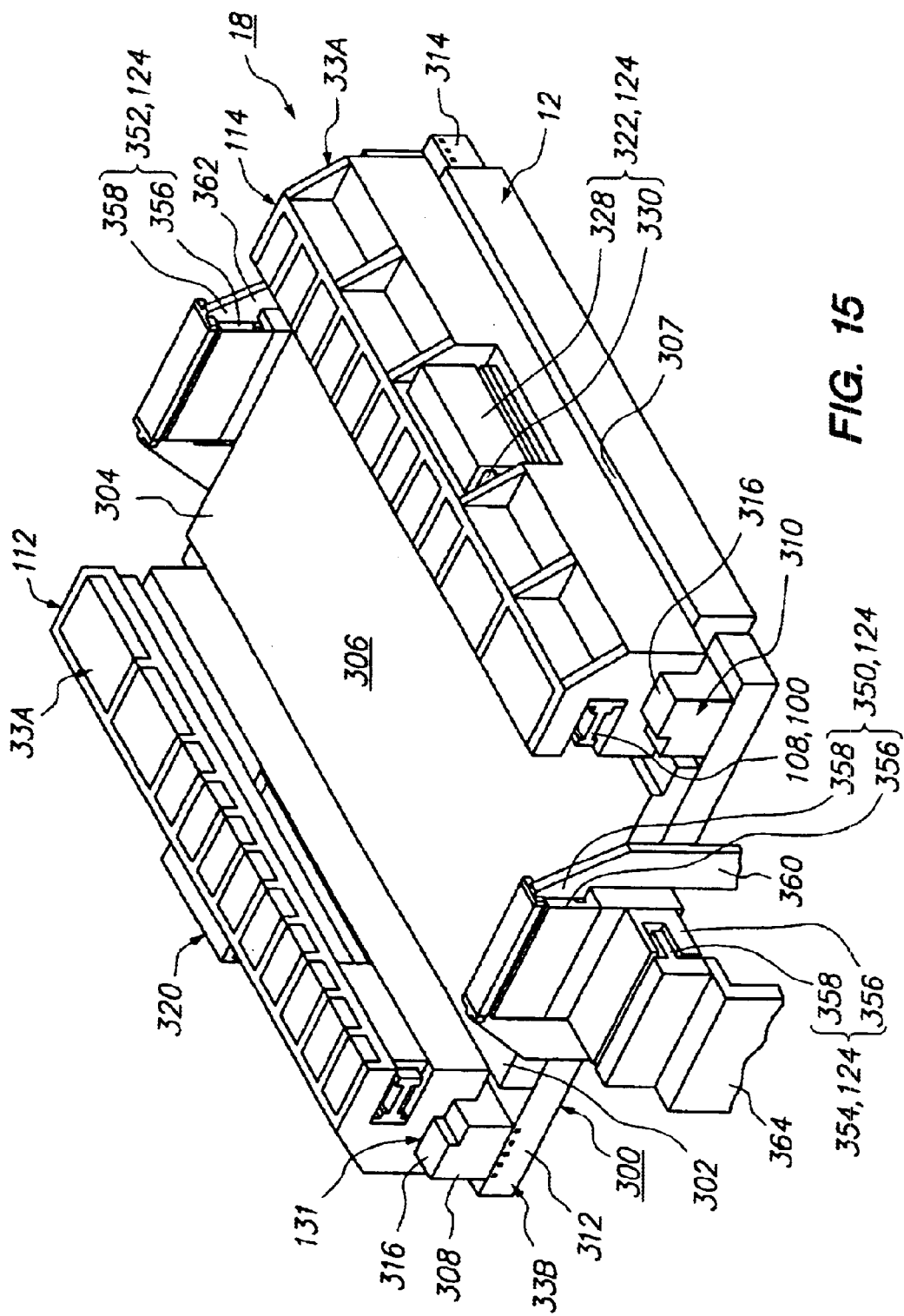
FIG. 15 is a perspective view of a reaction mass assembly illustrated in FIG. 14.
Figure 16:
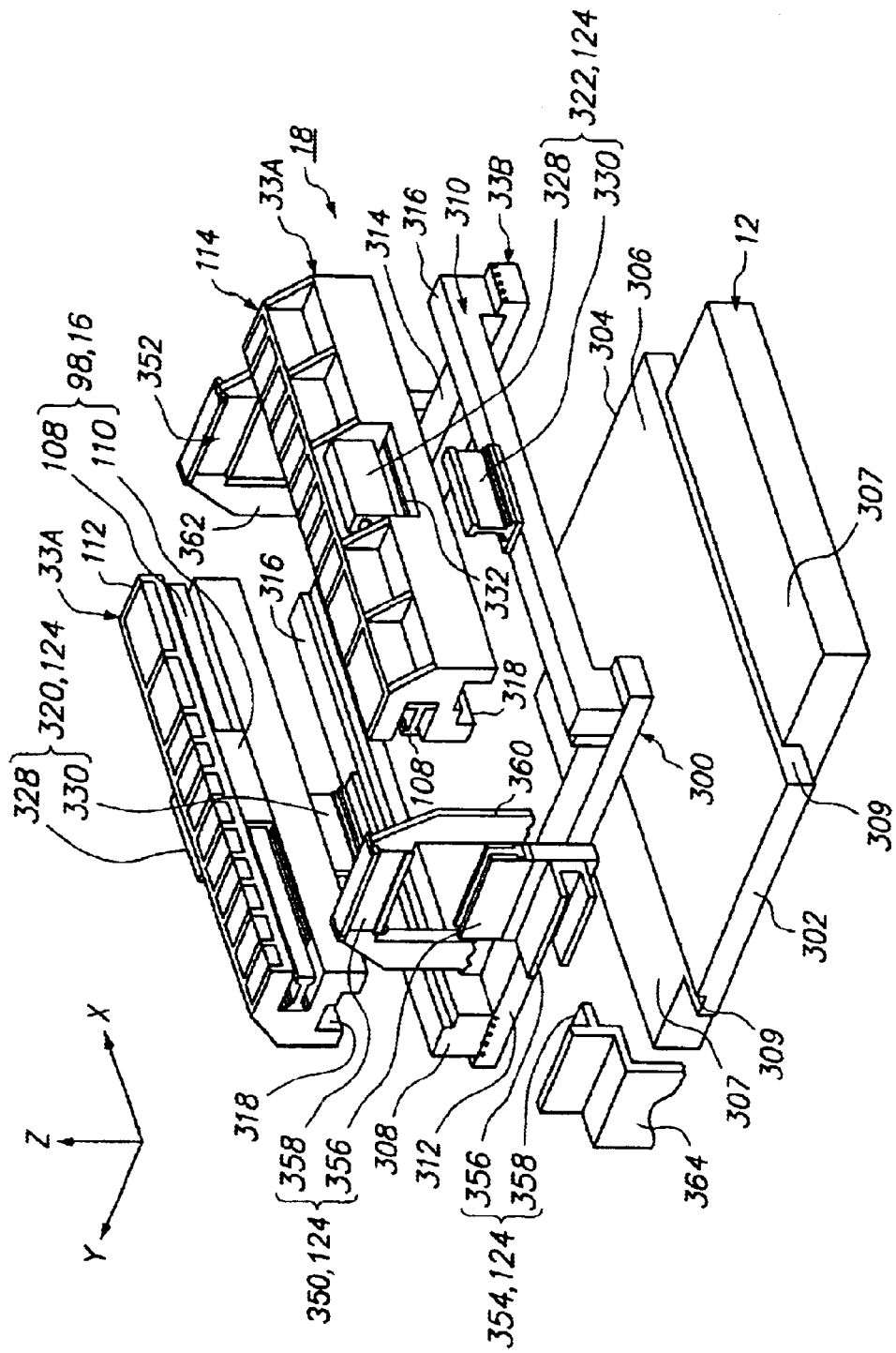
FIG. 16 is an exploded perspective view of the reaction mass assembly of FIG. 15.

FIGS. 14–16 illustrate a fourth embodiment having features of the present invention. In particular, FIG. 14 illustrates a perspective view of the stage assembly 10, FIG. 15 illustrates a perspective view of the reaction mass assembly 18, and FIG. 16 illustrates an exploded perspective view of the reaction mass assembly 18. The stage assembly 10 illustrated in FIG. 14 includes the stage base 12, a pair of stages 14, the stage mover assembly 16, the reaction mass assembly 18, and the control system 22. The measurement system is not illustrated in FIG. 14.

In the embodiment illustrated in FIG. 14, each stage 14, the stage mover assembly 16, and the control system 22 are somewhat similar to the equivalent components described above. Further, the stage base 12 and the reaction mass assembly 18 Illustrated in FIGS. 14–16 are similar to the stage base 12 and reaction mass assembly 18 illustrated in FIGS. 11–13 and described above. However, in the embodiment illustrated in FIGS. 14–16, the reaction frame 300 is free to move along the X axis, along the Y axis, and about the Z axis relative to the stage base 12. More specifically, in the embodiment, the fluid bearing between the reaction frame 300 and the stage base 12 only maintains the reaction frame 300 spaced apart along the Z axis relative to the stage base 12. Stated another way, the fluid bearing allows for motion of the reaction frame 300 along the X axis, along the Y axis, and about the Z axis relative to the stage base 12.

Further, in the embodiment illustrated in FIGS. 14–16, the reaction mover assembly 124 differs from the reaction mover assembly 124 illustrated in FIGS. 11–13 and described above. In particular, in the embodiment illustrated in FIGS. 14–16, the reaction mover assembly 124 includes the X reaction movers 320, 322, a first Y reaction mover 350, a second Y reaction mover 352, and a lower X reaction mover 354 that cooperate to move the reaction mass assembly 18 relative to the stage base 12.

In this embodiment, the reaction mover assembly 124 makes minor corrections along the X axis, along the Y axis, and about the Z axis to the position of the reaction frame 300 relative to the stage base 12. Further, the reaction mover assembly 124 makes independent corrections to the position of the X reaction masses 112, 114 along the X axis relative to the reaction frame 300.

The first and second X reaction movers 320, 322 are the same as illustrated in FIGS. 11–13 and described above. Each Y reaction mover 350, 352, and the lower X reaction mover 354 includes a first component 356 and an adjacent second component 358. One of the components of each reaction mover 350, 352, 354 includes one or more magnet arrays (not shown) and the other component of each reaction mover 350, 352, 354 includes one or more conductor arrays (not shown). Electrical current (not shown) is individually supplied to each conductor array by the control system 22. For each reaction mover 350, 352, 354, the electrical current in each conductor interacts with a magnetic field (not shown) generated by one or more of the magnets in the magnet array. This causes a force (Lorentz force) between the conductors and the magnets.

In the embodiment illustrated in the FIGS. 14–16, each Y reaction mover 350, 352 is a commutated linear motor. For the first Y reaction mover 350, the first component 356 is secured to the front frame side 312 of the reaction frame 300, while the second component 358 is secured to the mounting base 24 (illustrated in FIG. 18) with a first reaction mover frame 360. Similarly, for the second Y reaction mover 352, the first component 356 is secured to the rear frame side 314 of the reaction frame 300, and the second component 358 is secured to the mounting base 24 with a second reaction mover frame 362. Only a portion of each reaction mover frame 360, 362 is illustrated in FIGS. 14–16.

In this embodiment, the first component 356 of each Y reaction mover 350, 352, includes a pair of magnet arrays (not shown) while the second component 358 of each Y reaction mover 350, 352 includes a conductor array (not shown). With this design, the Y reaction movers 350, 352 can make minor corrections to the positions of the X reaction masses 112, 114 and the reaction frame 300 along the Y axis and about the Z axis relative to the stage base 12. Alternately, for example, the first component of each Y reaction mover could include a conductor array while the second component of each Y reaction mover could include a pair of spaced apart magnet arrays.

Preferably, the Y reaction movers 350, 352 include a measurement device (not shown) such as an encoder that provides information regarding the position of the X reaction frame 300 relative to the stage base 12.

Somewhat similarly, the first component 356 and the second component 358 of the lower X reaction mover 354 interact to selectively move the reaction frame 300 along the X axis relative to the stage base 12. In the embodiment illustrated in FIGS. 14–16, the lower X reaction mover 354 is a non-commutated voice coil motor. In this embodiment, for the lower X reaction mover 354, the first component 356 is secured to the front frame side 312 of the reaction frame 300, while the second component 358 is secured to the mounting base 24 with a third reaction mover frame 364.

In this embodiment, the first component 356 of the lower X reaction mover 354 includes a pair of spaced apart magnet arrays (not shown) while the second component 358 includes a conductor array (not shown). With this design, the lower X reaction mover 354 can make minor corrections to tee position of the reaction frame 300 and the X reaction masses 112, 114 along the X axis relative to the stage base 12. Alternately, for example, the first component of the lower X reaction mover could include a conductor array while the second component of each Y reaction mover could include a pair of spaced apart magnet arrays.

Preferably, the lower X reaction mover 354 includes a measurement device (not shown) such as an encoder that provides information regarding the position of the reaction frame 300 relative to the stage base 12 along the X axis.

Although it is not presently preferred, the second component 358 of the first Y al reaction mover 350, the second Y reaction mover 352 and lower X reaction mover 354 could be attached to the stage base 12.

As discussed above, the control system 22 directs and controls current to the reaction mover assembly 124 to control the position of the reaction mass assembly 18 relative to the stage base 12. Preferably, the control system 22 controls current to the reaction mover assembly 124 to prevent the X reaction masses 112, 114 from achieving a constant velocity, and to keep the stroke of the reaction movers relatively short Stated another way, the control system 22 controls current to the reaction mover assembly 124 to: (i) correct external disturbances that can influence the position of the reaction mass assembly 18, (ii) to prevent the X reaction masses 112, 114 from drifting off of the stage base 12, (iii) to prevent unwanted motion of the assembly's center of gravity 182, (iv) to prevent the exposure apparatus 30 from moving, and (v) to correct any torque that is transferred to the reaction mass assembly 18.

Basically, the control system 22 controls current to the reaction mover assembly 124 to ensure that the X reaction masses 112, 114 and the rest of the reaction mass assembly 18 are property positioned and/or centered relative to the stage base 12.

The control system 22 can control and direct current to the reaction mover assembly 124 at any time during the operation of the stage assembly 10 to correct the position of the X reaction masses 112. 114 and the rest of the reaction mass assembly 18. As provided herein, the control system 22 and the reaction mover assembly 124 can continuously servo the reaction mass assembly 18 so that the reaction mass assembly 18 is centered on the stage base 12.

Preferably, the control system 22 controls and directs current to the reaction mover assembly 124 in a way that minimizes the disturbances created by the reaction mover assembly 124 on the stage assembly 10 and the exposure apparatus 30. More specifically, the timing and/or the amount of current from the control system 22 directed to the reaction mover assembly 124 can be varied to minimize the influence of the disturbances created by the reaction mover assembly 124 on the stage assembly 10. Further, the timing and/or the amount of current can be varied according to the use of the stage assembly.

In a first embodiment, for an exposure apparatus 30, the control system 22 can control and direct current to the reaction mover assembly 124 so that the reaction movers only move and correct the position of the reaction mass assembly 18 at selected times. For example, the reaction movers can be activated between exposures of the exposure apparatus 30 and deactivated during an exposure. Stated another way, for the exposure apparatus 30, the control system 22 can be designed to direct current to the reaction mover assembly 124 only when an illumination system 504 (illustrated in FIG. 18) is not directing a beam of light energy at the reticle 32.

In this embodiment, the control system 22 can direct current to the reaction mover assembly 124 between each chip (not shown) on the semiconductor wafer 28, between each row of chips on the semiconductor wafer 28, between every scan of the semiconductor wafer 28, or between each semiconductor wafer 28 processed by the exposure apparatus 30. Stated another way, the reaction mover assembly 124 can be activated to move the reaction mass assembly 18 between each chip (not shown) on the semiconductor wafer 28, between each row of chips on the semiconductor wafer 28, between every scan of the semiconductor wafer 28, or between each semiconductor wafer 28 processed by the exposure apparatus 30.

Because the reaction mover assembly 124 is not activated during an exposure, the disturbances created by the reaction mover assembly 124 on the stage assembly 10 during exposure are minimized.

In another embodiment of the control system 22, the rate of movement of the reaction movers is varied according to the operation of the stage assembly 10. For it) example, for an exposure apparatus 30, the control system 22 can control and direct current to the reaction mover assembly 124 at a different rate during an exposure than between exposures of the exposure apparatus 30. For example, during an exposure, the control system 22 can direct current to the reaction mover assembly 124 so that the forces generated by the reaction mover assembly 124 are relatively small and the gain is low. Alternately, between exposures, the control system 22 can direct current to the reaction mover assembly 124 so that the forces generated by the reaction mover assembly 124 are relatively large and the gain is high.

Stated another way, for the exposure apparatus 30, the control system 22 can be designed to direct a relatively large current to the reaction mover assembly 124 only when an illumination system 504 (illustrated in FIG. 18) is not directing a beam of light energy at the reticle 32.

As provided herein, the control system 22 can direct a relatively large current to the reaction mover assembly 124 between each chip (not shown) on the semiconductor wafer 28, between each row of chips on the semiconductor wafer 28, between every scan of the wafer 28, or between each semiconductor wafer 28 processed by the exposure apparatus 30. With this design, the control system 22 changes the closed loop bandwidth between exposures. Stated another way, the reaction mover assembly 124 can make relatively large adjustments to the position of the reaction mass assembly 18 between each chip (not shown) on the wafer 28, between each row of chips on the semiconductor wafer 28, been every scan of the semiconductor wafer 28, or between each semiconductor wafer 28 processed by the exposure apparatus 30. Alternately, the reaction mover assembly 124 makes relatively small adjustments to the position on the reaction mass assembly 18 during an exposure.

Because the reaction mover assembly 124 makes relatively small adjustments to the position on the reaction mass assembly 18 during an exposure, the disturbances created by the reaction mover assembly 124 on the stage assembly 10 during exposure are minimized.

Figure 17A:
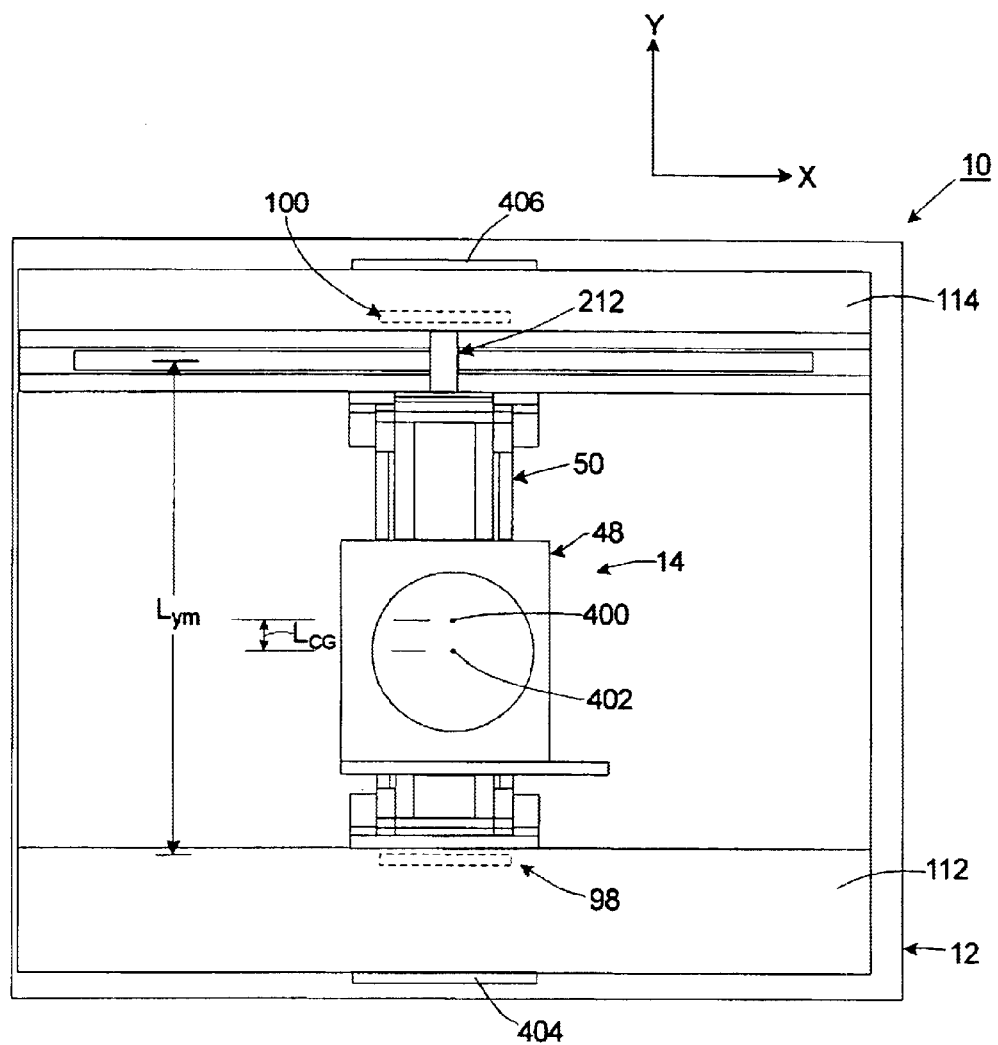
FIG. 17A is a simplified schematic top view of a portion of a stage assembly.

FIG. 17A illustrates a simplified schematic top view of a portion of a stage assembly 10 having a single stage 14 to facilitate a discussion of the control system 22. In particular, FIG. 17A illustrates the stage assembly 10 with one device table 48 positioned approximately half-way between the X reaction masses 112, 114 along the Y axis. In FIG. 17A, the device table 48 is positioned near the center of gravity 400 of the stage assembly 10.

The following symbols are used in conjunction with FIG. 17A and the discussion provided below to describe the movement of the reaction mass assembly 18:

$L_{YM}$ represents the distance along the Y axis between the center of the first X stage mover 98 and the second X stage mover 100.

$L_{CG}$ represents the distance along the Y axis between a stage assembly center of gravity 400 and a stage center of gravity 402.

$P_{M1}$ represents the momentum of the first X reaction mass 112 along the X axis.

$P_{M2}$ represents the momentum of the second X reaction mass 114 along the X axis.

$F_{S1}$ represents the force generated by the first X stage mover 98 (illustrated in phantom in FIG. 17A).

$F_{S2}$ represents the force generated by the second X stage mover 100.

$F_{r1}$ represents the force generated by the first X reaction mover 404.

$F_{r2}$ represents the force generated by the second X reaction mover 406.

The two equations that define the X stage mover 98, 100 force balance are $$F_{s1}+F_{s2}=F_x \text{ Force equation}$$

$$F_{s1}(L_{YM}/2+L_{CG})-F_{s2}(L_{YM}/2-L_{CG})=0 \text{ Moment equation}$$

Solving these two equations leads to $$F_{s1}=F_x/2-[F_xL_{CG}]/[L_{YM}] \quad F_{s2}=F_x/2+[F_xL_{CG}]/[L_{YM}]$$

For each X reaction mass 112, 114, the total momentum (m*v) is equal to the time integral of the forces acting on it Each X reaction mass 112, 114 has a reaction force generated by one of the X stage movers 98, 100 and a corrective force generated by one of the X reaction movers 404, 406.

$$P_1=m_1v_1=\int(F_{s1}+F_{r1})dt$$

It is assumed that the first X reaction mover 404 and the second X reaction mover 406 are driven in opposite directions with the same amplitude.

$$F_{r1}=-F_{r2}=F_t$$

A similar equation applies to the second X reaction mass 114. Substituting the previous result into these equations leads to:

$$P_1=\int(F_x/2)dt-1/2L_{ym}(\int F_xL_{CG}dt)+\int F_{r1}dt$$

$$P_2=\int(F_x/2)dt+1/2L_{ym}(\int F_xL_{CG}dt)+\int F_{r2}dt$$

These equations show that the momentum of each X reaction mass 112, 114 is one-half the stage 14 momentum, plus a term that depends on the time history of $F_x$ and $L_{CG}$, and the time integral of the reaction mover 404, 406 force. To ensure that the X reaction masses 112, 114 are not left with a constant velocity when the stage 14 returns to zero velocity, the second and third terms must cancel. This leads to the following equation:

$$\int F_t dt=1/(2Lym)\int F_xL_{CG}dt \qquad \text{(equation 1)}$$

One easy solution to this integral equation is to let $$F_t=F_xL_{CG}/(2Lym)$$

But this transmits the high frequency components of $F_x$ through the reaction movers 404, 406. Ideally, the $F_t$ would only have low frequency components.

Figure 17B:
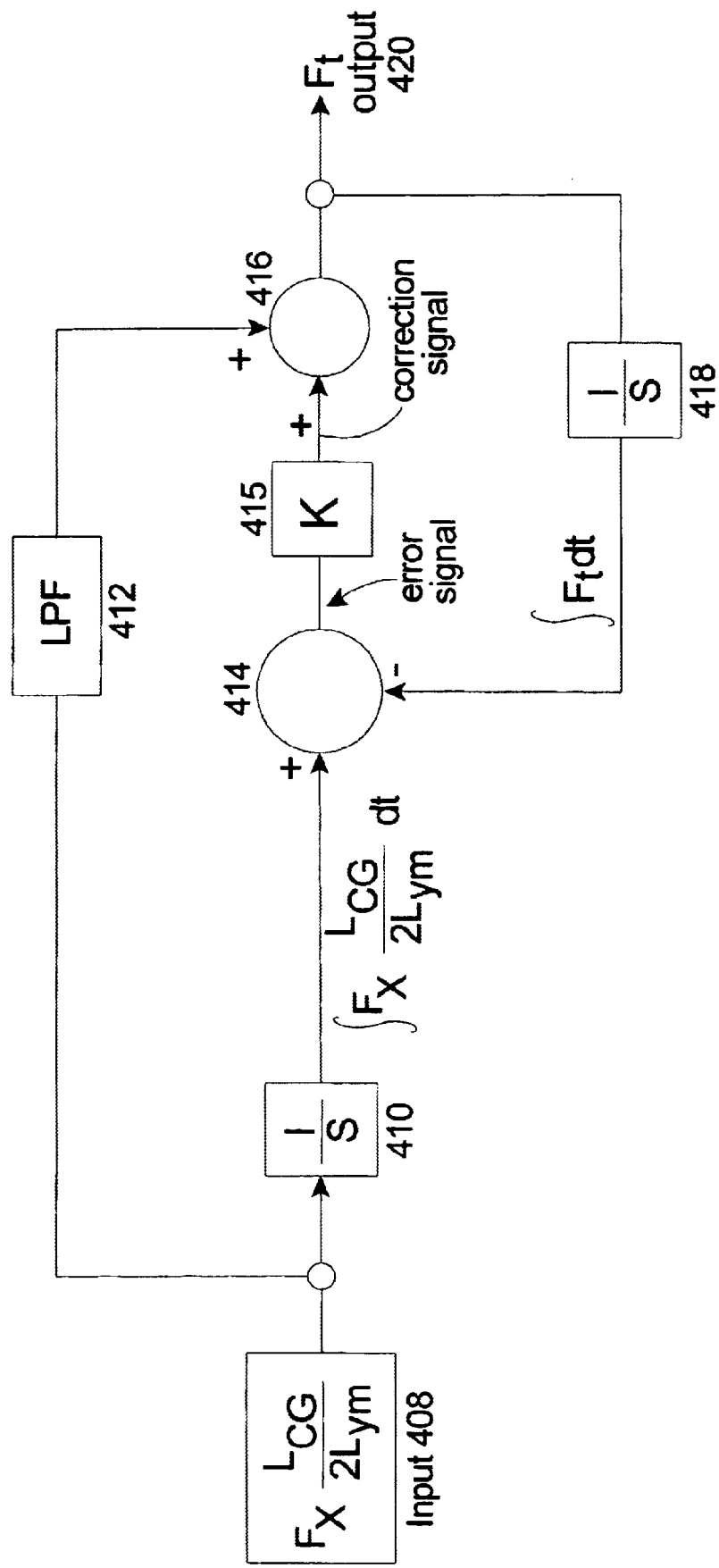
FIG. 17B is a simplified block diagram that illustrates the operation of a control system having features of the present invention.

FIG. 17B is a schematic that describes a method for reducing the frequency content of $F_t$. An input 408 is equal to $F_x(L_{CG}/2Lym)$. The tow frequency components of this input signal pass through low pass filter 412 to summing junction 416. The output of summing junction 416 is the reaction force $F_t$. The input signal 408 also goes to integrator 410, which calculates the time integral $\int F_x(L_{CG}/2Lym)dt$. A second integrator 418 integrates the output signal 420, and produces the time integral $\int F_t dt$. A differencing junction 414 calculates an error signal which is the difference between the outputs of integrator 410 and second integrator 418. Compensator 415 performs a calculation (such as multiplying by a gain K) on the error signal to produce a correction signal that is added to the output of low pass filter 412 in summing junction 416 to produce the output signal 420. By adjusting the cutoff frequency of the low pass filter 412 and the compensation calculation 415, the frequency content of output 420 can be limited to any desired value. The feedback loop through integrator 418 and differencing junction 414 ensures that over time, the two integrals are equal and equation 1 is satisfied.

FIG. 18 is a schematic view illustrating an exposure apparatus 30 useful with the present invention. The exposure apparatus 30 includes the apparatus frame 46, the ground frame 164, an illumination system 504 (irradiation apparatus), a reticle stage assembly 506, a lens assembly 508, and a wafer stage assembly 510. The stage assemblies 10 provided herein can be used as the wafer stage assembly 510. Alternately, with the disclosure provided herein, the stage assembly 10 provided herein can be modified for use as the reticle stage assembly 506.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 46 is rigid and supports the components of the exposure apparatus 30. The design of the apparatus frame 46 can be varied to suit the design requirements for the rest of the exposure apparatus 30. The apparatus frame 46 illustrated in FIG. 18 supports the lens assembly 508 and the illumination system 504 and the reticle stage assembly 506 above the mounting base 24.

The illumination system 504 includes an illumination source 512 and an illumination optical assembly 514. The illumination source 512 emits a beam (irradiation) of light energy. The illumination optical assembly 514 guides the beam of light energy from the illumination source 512 to the lens assembly 508. The beam illuminates selectively different portions of the reticle 32 and exposes the semiconductor wafer 28. In FIG. 18, the illumination source 512 is illustrated as being supported above the reticle stage assembly 506. Typically, however, the illumination source 512 is secured to one of the sides of the apparatus frame 46 and the energy beam from the illumination source 512 is directed to above the reticle stage assembly 506 with the illumination optical assembly 514.

The lens assembly 508 projects and/or focuses the light passing through the reticle to the wafer. Depending upon the design of the exposure apparatus 30, the lens assembly 508 can magnify or reduce the image illuminated on the reticle 32.

The reticle stage assembly 506 holds and positions the reticle relative to the lens assembly 508 and the wafer. Similarly, the wafer stage assembly 510 holds and positions the wafer with respect to the projected image of the illuminated portions of the reticle 32. In FIG. 18, the wafer stage assembly 510 utilizes a stage assembly 10 having features of the present invention. Depending upon the design, the exposure apparatus 30 can also include additional motors to move the stage assemblies 506, 510.

There are a number of different types of lithographic devices. For example, the exposure apparatus 30 can be used as scanning type photolithography system that exposes the pattern from the reticle 32 onto the wafer 28 with the reticle 32 and the wafer 28 moving synchronously. In a scanning type lithographic device, the reticle 32 is moved perpendicular to an optical axis of the lens assembly 508 by the reticle 32 stage assembly 506 and the wafer 28 is moved perpendicular to an optical axis of the lens assembly 508 by the wafer 28 stage assembly 510. Scanning of the reticle 32 and the wafer 28 occurs while the reticle and the wafer 28 are moving synchronously.

Alternately, the exposure apparatus 30 can be a step-and-repeat type photolithography system that exposes the reticle 32 while the reticle 32 and the wafer 28 are stationary. In the step and repeat process, the wafer 28 is in a constant position relative to the reticle 32 and the lens assembly 508 during the exposure of an individual field. Subsequently, between consecutive exposure steps, the wafer 28 is consecutively moved by the wafer stage assembly 510 perpendicular to the optical axis of the lens assembly 508 so that the next field of the wafer 28 is brought into position relative to the lens assembly 508 and the reticle 32 for exposure. Following this process, the images on the reticle 32 are sequentially exposed onto the fields of the wafer 28 so that the next field of the wafer 28 is brought into position relative to the lens assembly 508 and the reticle 32.

However, the use of the exposure apparatus 30 provided herein is not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a fens assembly. Additionally, the present invention provided herein can be used in other devices, including other semiconductor processing equipment, machine tools, metal cutting machines, and inspection machines.

The illumination source 512 can be g-line (436 nm), i-line (365 nm), KrF excimer laser (248 nm), ArF excimer laser (193 nm) and $F_2$ laser (157 nm). Alternately, the illumination source 512 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 508 included in the photolithography system, the lens assembly 508 need not be limited to a reduction system. It could also be a 1x or magnification system.

With respect to a lens assembly 508, when far ultra-violet rays such as the excimer laser is used, glass materials such as quartz and fluorite that transmit far ultraviolet rays is preferable to be used. When the $F_2$ type laser or x-ray is used, the lens assembly 508 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultraviolet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laidpen Patent Applications are incorporated herein by reference.

Further, In photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 19:
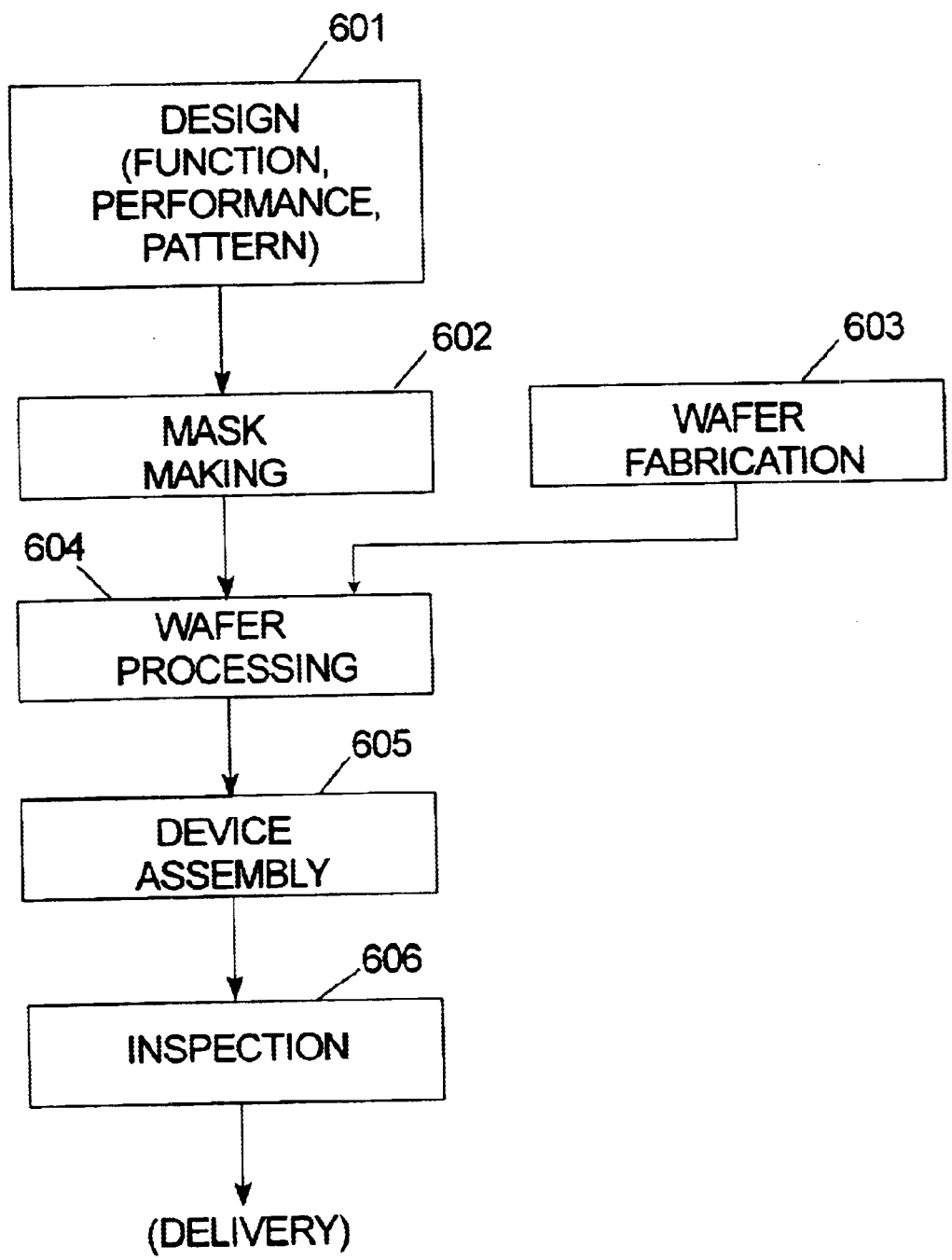
FIG. 19 is a flow chart that outlines a process for manufacturing a device in accordance with the present invention.

Further, semiconductor devices can be fabricated using the above described systems, by the process shown generally in FIG. 19. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process), finally, the device is then inspected in step 606.

Figure 20:
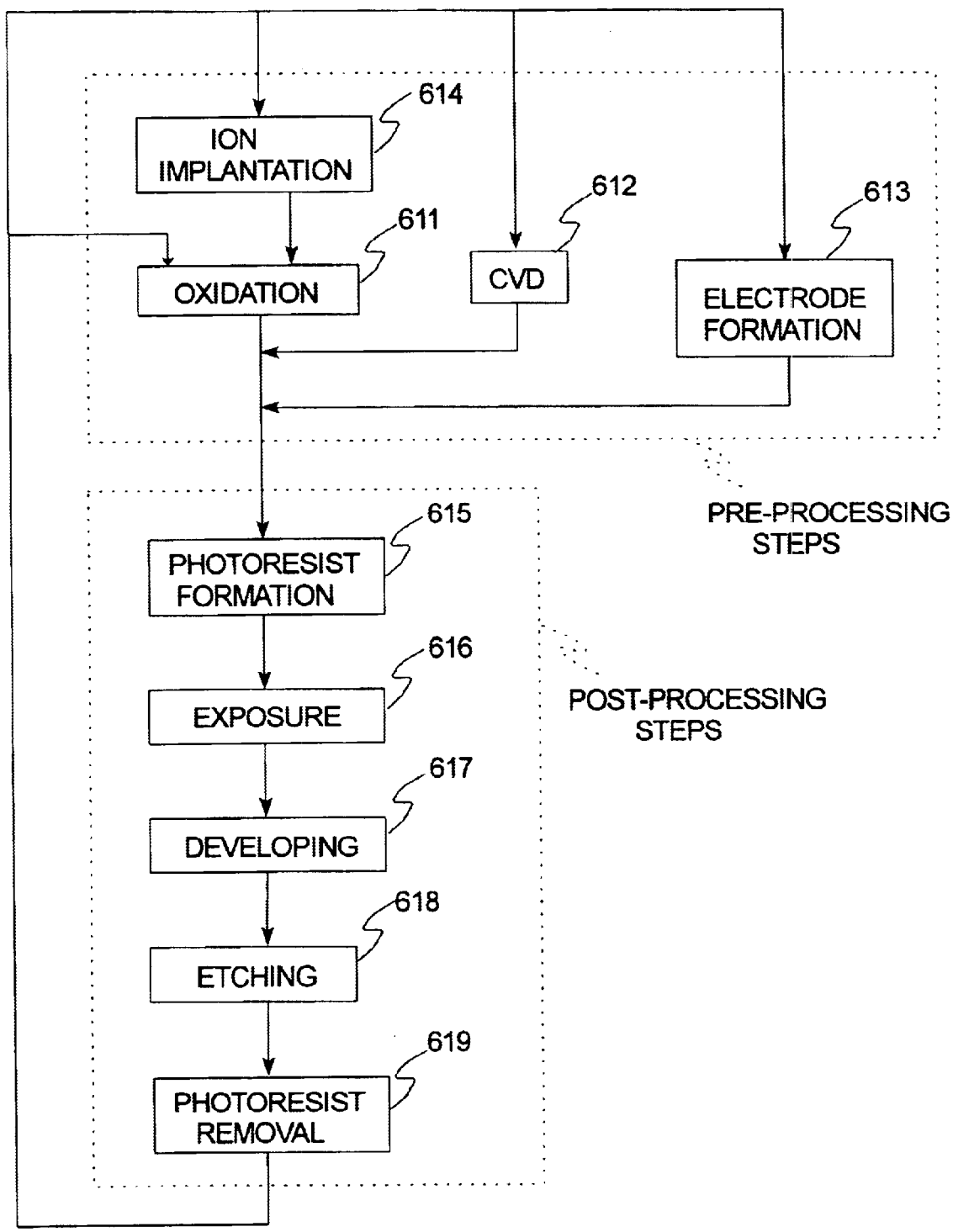
FIG. 20 is a flow chart that outlines device processing in more detail.

FIG. 20 illustrates a detailed flowchart example of the above-mentioned step 604 in the case of fabricating semiconductor devices. In FIG. 20, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611–614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that is adapted to move a device, the stage assembly comprising:
   a stage that retains the device;
   a stage base that directly supports the stage;
   a stage mover assembly connected to the stage, the stage mover assembly moving the stage with at least two degrees of freedom and generating reaction forces in at least two degrees of freedom;
   a reaction mass assembly coupled to the stage mover assembly, the reaction mass assembly reducing the reaction forces in at least two degrees of freedom that are transferred to the stage base; and
   a reaction mover assembly that adjusts the position of the reaction mass assembly relative to the stage base along an X axis, along a Y axis and about a Z axis.

2. A stage assembly that is adapted to move a device relative to a stage base, the stage assembly comprising:
   a stage adapted to retain the device;
   a stage mover assembly connected to the stage, the stage mover assembly moving the stage with at least two degrees of freedom and generating reaction forces in at least two degrees of freedom;
   a reaction mass assembly including an X reaction component and a Y reaction component that are coupled to the stage mover assembly, the X reaction component moving relative to the Y reaction component along an X axis, the X reaction component and the Y reaction component moving concurrently along a Y axis relative to the stage base, the reaction mass assembly being adapted to reduce the reaction forces in at least two degrees of freedom that are transferred to the stage base; and
   a mass guide assembly that allows the X reaction component to move relative to the Y reaction component along the X axis and inhibits movement of the X reaction component relative to the Y reaction component along the Y axis.

3. A stage assembly that is adapted to move a device relative to a stage base, the stage assembly comprising:
   a stage adapted to retain the device;
   a stage mover assembly connected to the stage, the stage mover assembly moving the stage with at least two degrees of freedom and generating reaction forces in at least two degrees of freedom;
   a reaction mass assembly including an X reaction component and a Y reaction component that are coupled to the stage mover assembly, the X reaction component including a pair of spaced apart X reaction masses and the Y reaction component including a pair of spaced apart Y reaction masses, the X reaction component moving relative to the Y reaction component along an X axis, the X reaction component and the Y reaction component moving concurrently along a Y axis relative to the stage base, the reaction mass assembly being adapted to reduce the reaction forces in at least two degrees of freedom that are transferred to the stage base; and
   a mass guide assembly that connects the X reaction masses to the Y reaction masses, allows the X reaction masses to move independently relative to the Y reaction masses along the X axis and inhibits movement of the X reaction masses relative to the Y reaction masses along the Y axis.

4. A stage assembly that is adapted to move a device relative to a stage base, the stage assembly comprising:
   a stage adapted to retain the device;
   a stage mover assembly connected to the stage, the stage mover assembly moving the stage along an X axis and along a Y axis and generating reaction forces along the X axis and along the Y axis;
   a reaction mass assembly coupled to the stage mover assembly, the reaction mass assembly being adapted to reduce the reaction forces along the X axis and along the Y axis, the reaction mass assembly including an X reaction component and a Y reaction component, the X reaction component moving relative to the stage base along the X axis, the X reaction component moving relative to the Y reaction component along the X axis and along the Y axis, and the X reaction component and the Y reaction component move concurrently along the Y axis; and
   a reaction mover assembly that adjusts (i) the position of the X reaction component relative to the Y reaction component along the X axis, (ii) the position of the Y reaction component and the X reaction component relative to the stage base along the Y axis, and (iii) the position of the Y reaction component and the X reaction component relative to the stage base along the X axis.

5. A stage assembly that is adapted to move a device relative to a stage base, the stage assembly comprising:
   a stage adapted to retain the device;
   a stage mover assembly connected to the stage, the stage mover assembly moving the stage along an X axis and along a Y axis and generating reaction forces along the X axis and along the Y axis;
   a reaction mass assembly coupled to the stage mover assembly, the reaction mass assembly being adapted to reduce the reaction forces along the X axis and along the Y axis, the reaction mass assembly including a X reaction component and a Y reaction component, the X reaction component including a first X reaction mass and a second X reaction mass that move independently along the X axis relative to the Y reaction component, the X reaction component moving relative to the stage base along the X axis and along the Y axis, the X reaction component and the Y reaction component moving concurrently along the Y axis, and the Y reaction component including a pair of spaced apart Y reaction masses; and
   a mass guide assembly that connects the X reaction masses to the Y reaction masses, allows the X reaction masses to move independently relative to the Y reaction masses along the X axis and inhibits movement of the X reaction masses relative to the Y reaction masses along the Y axis.

6. The stage assembly of claim 5 further comprising a reaction guide assembly that allows the Y reaction masses to move relative to the stage base along the Y axis and inhibits movement of the Y reaction masses along the X axis.

7. A method for making a stage assembly that moves a device relative to a stage base, the method comprising the steps of:
   providing a stage that retains the device;
   connecting a stage mover assembly to the stage, the stage mover assembly moving the stage with at least two degrees of freedom and generating reaction forces in at least two degrees of freedom; and
   coupling a reaction mass assembly to the stage mover assembly, the reaction mass assembly including a first X reaction mass, a second X reaction mass and a reaction frame, the first X reaction mass and the second X reaction mass moving independently along an X axis, the reaction mass assembly reducing the reaction forces in at least two degrees of freedom that are transferred to the stage base, the reaction frame being coupled to the X reaction masses so that the reaction frame moves relative to the stage base along the X axis.

8. The method of claim 7 including the step of providing a reaction mover assembly that adjusts the position of each X reaction mass relative to the reaction frame along the X axis, and adjusts the position of the reaction frame and the X reaction masses relative to the stage base along the Y axis.

9. The method of claim 7 including the step of providing a reaction mass assembly that adjusts the position of the X reaction masses and the reaction frame relative to the stage base along the X axis and along the Y axis.

10. A stage assembly that is adapted to move a device relative to a stage base, the stage assembly comprising:
    a stage adapted to retain the device;
    a stage mover assembly connected to the stage, the stage mover assembly moving the stage with at least two degrees of freedom and generating reaction forces in at least two degrees of freedom;
    a reaction mass assembly including an X reaction component and a Y reaction component that are coupled to the stage mover assembly, the X reaction component moving relative to the Y reaction component along an X axis, the X reaction component and the Y reaction component moving concurrently along a Y axis relative to the stage base, the reaction mass assembly reducing the reaction forces in at least two degrees of freedom that are transferred to the stage base; and
    a reaction mover assembly that adjusts the position of the X reaction component relative to the Y reaction component along the X axis, the reaction mover assembly adjusting the position of the X reaction component and the Y reaction component relative to the stage base along the X axis, the Y axis and about a Z axis.

11. A stage assembly that is adapted to move a device relative to a stage base, the stage assembly comprising:
    a stage adapted to retain the device;
    a stage mover assembly connected to the stage, the stage mover assembly moving the stage with at least two degrees of freedom and generating reaction forces in at least two degrees of freedom; and
    a reaction mass assembly including an X reaction component and a Y reaction component that are coupled to the stage mover assembly, the X reaction component moving relative to the Y reaction component along an X axis, the X reaction component and the Y reaction component moving concurrently along a Y axis relative to the stage base, the reaction mass assembly being adapted to reduce the reaction forces in at least two degrees of freedom that are transferred to the stage base; and
    a reaction mover assembly that adjusts the position of the Y reaction component and the X reaction component relative to the stage base along the X axis, the Y axis and about a Z axis.

12. A stage assembly that is adapted to move a device relative to a stage base, the stage assembly comprising:
  a stage adapted to retain the device;
  a stage mover assembly connected to the stage, the stage mover assembly moving the stage with at least two degrees of freedom and generating reaction forces in at least two degrees of freedom; and
  a reaction mass assembly including an X reaction component and a Y reaction component that are coupled to the stage mover assembly, the X reaction component including a pair of spaced apart X reaction masses and the Y reaction component including a generally planar shaped reaction base, the X reaction component moving relative to the Y reaction component along an X axis, the X reaction component and the Y reaction component moving concurrently along a Y axis relative to the stage base, the reaction mass assembly being adapted to reduce the reaction forces in at least two degrees of freedom that are transferred to the stage base.

13. A stage assembly that is adapted to move a device relative to a stage base, the stage assembly comprising:
  a stage adapted to retain the device;
  a stage mover assembly connected to the stage, the stage mover assembly moving the stage with at least two degrees of freedom and generating reaction forces in at least two degrees of freedom; and
  a reaction mass assembly including an X reaction component and a Y reaction component that are coupled to the stage mover assembly, the X reaction component including a pair of spaced apart X reaction masses and the Y reaction component including a reaction frame, the X reaction component moving relative to the Y reaction component along an X axis, the X reaction component and the Y reaction component moving concurrently along a Y axis relative to the stage base, the reaction mass assembly being adapted to reduce the reaction forces in at least two degrees of freedom that are transferred to the stage base.

14. The stage assembly of claim 13 further comprising a mass guide assembly that connects the X reaction masses to the reaction frame, allows the X reaction masses to move independently relative to the reaction frame along the X axis and inhibits movement of the X reaction masses relative to the reaction frame along the Y axis.

15. The stage assembly of claim 14 further comprising a reaction guide assembly that allows the reaction frame to move relative to the stage base along the Y axis and inhibits movement of the reaction frame along the X axis.

16. The stage assembly of claim 14 further comprising a reaction mover assembly that adjusts the position of the X reaction masses relative to the reaction frame along the X axis.

17. The stage assembly of claim 16 wherein the reaction mover assembly adjusts the position of the reaction frame and the X reaction masses relative to the stage base along the Y axis.

18. The stage assembly of claim 14 wherein the reaction frame is adapted to move relative to the stage base along the X axis, along the Y axis and about the Z axis.

19. The stage assembly of claim 18 further comprising a reaction mover assembly that adjusts the position of the X reaction masses relative to the reaction frame along the X axis.

20. The stage assembly of claim 18 further comprising a reaction mover assembly that adjusts the position of the reaction frame and the X reaction masses relative to the stage base along the X axis, along the Y axis and about the Z axis.

21. A stage assembly that is adapted to move a device relative to a stage base, the stage assembly comprising:
  a stage adapted to retain the device;
  a stage mover assembly connected to the stage, the stage mover assembly moving the stage along an X axis and along a Y axis and generating reaction forces along the X axis and along the Y axis; and
  a reaction mass assembly coupled to the stage mover assembly, the reaction mass assembly being adapted to reduce the reaction forces along the X axis and along the Y axis, the reaction mass assembly including a X reaction component that moves relative to the stage base along the X axis, along the Y axis and about a Z axis.

22. A stage assembly that is adapted to move a device relative to a stage base, the stage assembly comprising:
  a stage adapted to retain the device;
  a stage mover assembly connected to the stage, the stage mover assembly moving the stage along an X axis and along a Y axis and generating reaction forces along the X axis and along the Y axis;
  a reaction mass assembly coupled to the stage mover assembly, the reaction mass assembly being adapted to reduce the reaction forces along the X axis and along the Y axis, the reaction mass assembly including an X reaction component and a Y reaction component, the X reaction component moving relative to the stage base along the X axis, the X reaction component moving relative to the Y reaction component along the X axis and along the Y axis, and the X reaction component and the Y reaction component move concurrently along the Y axis; and
  a reaction mover assembly that adjusts (i) the position of the X reaction component relative to the Y reaction component along the X axis, (ii) the position of the Y reaction component and the X reaction component relative to the stage base along the Y axis, (iii) the position of the Y reaction component and the X reaction component relative to the stage base along the X axis, and (iv) the position of the Y reaction component and the X reaction component relative to the stage base about a Z axis.

23. A stage assembly that is adapted to move a device relative to a stage base, the stage assembly comprising:
  a stage adapted to retain the device;
  a stage mover assembly connected to the stage, the stage mover assembly moving the stage along an X axis and along a Y axis and generating reaction forces along the X axis and along the Y axis; and
  a reaction mass assembly coupled to the stage mover assembly, the reaction mass assembly being adapted to reduce the reaction forces along the X axis and along the Y axis, the reaction mass assembly including an X reaction component and a Y reaction component, the X reaction component including a first X reaction mass and a second X reaction mass that move independently along the X axis relative to the Y reaction component, the X reaction component moving relative to the stage base along the X axis, the X reaction component moving relative to the Y reaction component along the Y axis, the X reaction component and the Y reaction component moving concurrently along the Y axis, and the Y reaction component including a generally planar shaped reaction base.

24. A stage assembly that is adapted to move a device relative to a stage base, the stage assembly comprising:
a stage adapted to retain the device;
a stage mover assembly connected to the stage, the stage mover assembly moving the stage along an X axis and along a Y axis and generating reaction forces along the X axis and along the Y axis; and
a reaction mass assembly coupled to the stage mover assembly, the reaction mass assembly being adapted to reduce the reaction forces along the X axis and along the Y axis, the reaction mass assembly including an X reaction component and a Y reaction component, the X reaction component including a first X reaction mass and a second X reaction mass that move independently along the X axis relative to the Y reaction component, the X reaction component moving relative to the stage base along the X axis, the X reaction component moving relative to the Y reaction component along the Y axis, the X reaction component and the Y reaction component moving concurrently along the Y axis, the Y reaction component including a reaction frame.

25. The stage assembly of claim 24 further comprising a mass guide assembly that connects the X reaction masses to the reaction frame, allows the X reaction masses to move independently relative to the reaction frame along the X axis, and inhibits movement of the X reaction masses relative to the reaction frame along the Y axis.

26. The stage assembly of claim 25 further comprising a reaction guide assembly that allows the reaction frame to move relative to the stage base along the Y axis and inhibits movement of the reaction frame along the X axis.

27. The stage assembly of claim 26 further comprising a reaction mover assembly that adjusts the position of the X reaction masses relative to the reaction frame along the X axis.

28. The stage assembly of claim 27 wherein the reaction mover assembly adjusts the position of the reaction frame and the X reaction masses relative to the stage base along the Y axis.

29. The stage assembly of claim 25 wherein the reaction frame is adapted to move relative to the stage base along the X axis, along the Y axis and about the Z axis.

30. The stage assembly of claim 29 further comprising a reaction mover assembly that adjusts the position of the X reaction masses relative to the reaction frame along the X axis.

31. The stage assembly of claim 29 further comprising a reaction mover assembly that adjusts the position of the reaction frame and the X reaction masses relative to the stage base along the X axis, along the Y axis and about the Z axis.

32. A method for making a stage assembly that moves a device relative to a stage base, the method comprising the steps of:
providing a stage that retains the device;
connecting a stage mover assembly to the stage, the stage mover assembly moving the stage with at least two degrees of freedom and generating reaction forces in at least two degrees of freedom;
coupling a reaction mass assembly to the stage mover assembly, the reaction mass assembly including an X reaction component and a Y reaction component, the X reaction component moving relative to the Y reaction component along an X axis, the X reaction component and the Y reaction component move concurrently along a Y axis, the reaction mass assembly reducing the reaction forces in at least two degrees of freedom that are transferred to the stage base; and
adjusting the position of the Y reaction component and the X reaction component relative to the stage base along an X axis and about a Z axis with a reaction mover assembly.

33. A stage assembly that moves a device relative to a stage base, the stage assembly comprising:
a stage that retains the device;
a stage mover assembly connected to the stage, the stage mover assembly moving the stage with at least two degrees of freedom and generating a reaction force along a Y axis; and
a reaction mass assembly coupled to the stage mover assembly, the reaction mass assembly including an X reaction component and a Y reaction component, the X reaction component moving relative to the Y reaction component, the reaction components moving along the Y axis to reduce the reaction force along the Y axis that is transferred to the stage base.

34. The stage assembly of claim 33 wherein the stage mover assembly moves the stage along the Y axis directly causing the X reaction component and the Y reaction component to move along the Y axis.

35. The stage assembly of claim 33 wherein the X reaction component moves relative to the stage base with three degrees of freedom.

36. The stage assembly of claim 35 wherein the Y reaction component moves relative to the stage base with three degrees of freedom.

37. The stage assembly of claim 33 wherein the stage mover assembly comprises an X stage mover that moves the stage along the X axis, the X stage mover being coupled to the X reaction component so that movement of the stage by the X stage mover results in movement of the X reaction component along the X axis.

38. The stage assembly of claim 37 wherein the stage mover assembly comprises a Y stage mover that moves the stage along the Y axis, the Y stage mover being coupled to the X reaction component so that movement of the stage by the Y stage mover results in movement of the X reaction component along the Y axis.

39. The stage assembly of claim 33 further comprising a reaction mover assembly that adjusts the position of at least a portion of the reaction mass assembly relative to the stage base with one degree of freedom.

40. The stage assembly of claim 33 further comprising a reaction mover assembly that adjusts the position of at least a portion of the reaction mass assembly relative to the stage base with two degrees of freedom.

41. The stage assembly of claim 33 further comprising a reaction mover assembly that adjusts the position of at least a portion of the reaction mass assembly relative to the stage base with three degrees of freedom.

42. The stage assembly of claim 33 further comprising a reaction mover assembly that adjusts the position of the Y reaction component and the X reaction component relative to the stage base along the Y axis.

43. The stage assembly of claim 33 further comprising a reaction mover assembly that adjusts the position of one of the reaction components relative to the stage base about a Z axis.

44. The stage assembly of claim 33 further comprising a reaction mover assembly that adjusts the position of the X reaction component and the Y reaction component relative to the stage base about a Z axis.

45. The stage assembly of claim 33 wherein the X reaction component includes a first X reaction mass and a second X reaction mass that move independently along the X axis relative to the Y reaction component.

46. The stage assembly of claim 33 further comprising a mass guide assembly that allows the X reaction component to move relative to the Y reaction component along the X axis and inhibits movement of the X reaction component relative to the Y reaction component along the Y axis.

47. The stage assembly of claim 33 wherein the X reaction component includes a pair of spaced apart X reaction masses and the Y reaction component includes a generally planar shaped reaction base.

48. The stage assembly of claim 33 wherein the X reaction component includes a pair of spaced apart X reaction masses and the Y reaction component includes a pair of spaced apart Y reaction masses.

49. The stage assembly of claim 48 further comprising a mass guide assembly that connects the X reaction masses to the Y reaction masses, allows the X reaction masses to move independently relative to the Y reaction masses along the X axis and inhibits movement of the X reaction masses relative to the Y reaction masses along the Y axis.

50. The stage assembly of claim 48 further comprising a reaction guide assembly that allows the Y reaction masses to move relative to the stage base along the Y axis and inhibits movement of the Y reaction masses along the X axis.

51. The stage assembly of claim 48 further comprising a reaction mover assembly that adjusts the position of the X reaction masses relative to the Y reaction masses along the X axis.

52. The stage assembly of claim 51 wherein the reaction mover assembly adjusts the position of the Y reaction masses and the X reaction masses relative to the stage base along the Y axis.

53. The stage assembly of claim 33 wherein the X reaction component includes a pair of spaced apart X reaction masses and the Y reaction component includes a reaction frame.

54. The stage assembly of claim 53 further comprising a mass guide assembly that connects the X reaction masses to the reaction frame, allows the X reaction masses to move independently relative to the reaction frame along the X axis and inhibits movement of the X reaction masses relative to the reaction frame along the Y axis.

55. The stage assembly of claim 54 further comprising a reaction guide assembly that allows the reaction frame to move relative to the stage base along the Y axis and inhibits movement of the reaction frame along the X axis.

56. The stage assembly of claim 54 further comprising a reaction mover assembly that adjusts the position of the X reaction masses relative to the reaction frame along the X axis.

57. The stage assembly of claim 56 wherein the reaction mover assembly adjusts the position of the reaction frame and the X reaction masses relative to the stage base along the Y axis.

58. The stage assembly of claim 54 wherein the reaction frame moves relative to the stage base about the Z axis.

59. The stage assembly of claim 54 further comprising a reaction mover assembly that adjusts the position of the reaction frame and the X reaction masses relative to the stage base about the Z axis.

60. The stage assembly of claim 33 wherein the reaction components move along the Y axis to reduce the reaction force along the Y axis that is transferred to the stage base.

61. The stage assembly of claim 33 wherein the reaction components move concurrently along the Y axis to reduce the reaction force along the Y axis that is transferred to the stage base.

62. An exposure apparatus including the stage assembly of claim 33.

63. A Process for manufacturing a device including the step of utilizing the exposure apparatus according to claim 62.

64. A process for making a wafer on which an image has been formed including the step of utilizing the exposure apparatus according to claim 62.

65. A stage assembly that moves a device relative to a stage base, the stage assembly comprising:
   a stage that retains the device;
   a stage mover assembly connected to the stage, the stage mover assembly moving the stage with at least two degrees of freedom and generating reaction forces;
   a reaction mass assembly coupled to the stage mover assembly, the reaction mass assembly reducing the reaction forces in at least one degree of freedom that is transferred to the stage base, the reaction mass assembly including a Y reaction component and an X reaction component that moves relative to the Y reaction component, one of the reaction components moving about a Z axis relative to the stage base.

66. The stage assembly of claim 65 further comprising a reaction mover assembly that adjusts the position of one of the reaction components relative to the stage base about a Z axis.

67. The stage assembly of claim 65 wherein the X reaction component moves relative to the stage base with three degrees of freedom.

68. The stage assembly of claim 67 wherein the Y reaction component moves relative to the stage base with three degrees of freedom.

69. The stage assembly of claim 65 wherein the stage mover assembly comprises an X stage mover that moves the stage along an X axis, the X stage mover being coupled to the X reaction component so that movement of the stage by the X stage mover results in movement of the X reaction component along the X axis.

70. The stage assembly of claim 69 wherein the stage mover assembly comprises a Y stage mover that moves the stage along a Y axis, the Y stage mover being coupled to the X reaction component so that movement of the stage by the Y stage mover results in movement of the X reaction component along the Y axis.

71. The stage assembly of claim 65 further comprising a reaction mover assembly that adjusts the position of one of the reaction components relative to the stage base with two degrees of freedom.

72. The stage assembly of claim 65 further comprising a reaction mover assembly that adjusts the position of one of the reaction components relative to the stage base with three degrees of freedom.

73. The stage assembly of claim 65 further comprising a reaction mover assembly that adjusts the position of each of the reaction components relative to the stage base with three degrees of freedom.

74. The stage assembly of claim 65 further comprising a reaction mover assembly that adjusts the position of each of the reaction components relative to the stage base about the Z axis.

75. The stage assembly of claim 65 wherein the X reaction component includes a first X reaction mass and a second X reaction mass that move independently along an X axis relative to the Y reaction component.

76. The stage assembly of claim 65 further comprising a mass guide assembly that allows the X reaction component to move relative to the Y reaction component along an X axis and inhibits movement of the X reaction component relative to the Y reaction component along a Y axis.

77. The stage assembly of claim 65 wherein the X reaction component includes a pair of spaced apart X reaction masses and the Y reaction component includes a generally planar shaped reaction base.

78. The stage assembly of claim 65 wherein the X reaction component includes a pair of spaced apart X reaction masses and the Y reaction component includes a pair of spaced apart Y reaction masses.

79. The stage assembly of claim 78 further comprising a mass guide assembly that connects the X reaction masses to the Y reaction masses, allows the X reaction masses to move independently relative to the Y reaction masses along an X axis and inhibits movement of the X reaction masses relative to the Y reaction masses along a Y axis.

80. The stage assembly of claim 78 further comprising a reaction guide assembly that allows the Y reaction masses to move relative to the stage base along a Y axis and inhibits movement of the Y reaction masses along an X axis.

81. The stage assembly of claim 78 further comprising a reaction mover assembly that adjusts the position of the X reaction masses relative to the Y reaction masses along an X axis.

82. The stage assembly of claim 81 wherein the reaction mover assembly adjusts the position of the Y reaction masses and the X reaction masses relative to the stage base along a Y axis.

83. The stage assembly of claim 65 wherein the X reaction component includes a pair of spaced apart X reaction masses and the Y reaction component includes a reaction frame.

84. The stage assembly of claim 83 further comprising a mass guide assembly that connects the X reaction masses to the reaction frame, allows the X reaction masses to move independently relative to the reaction frame along an X axis and inhibits movement of the X reaction masses relative to the reaction frame along a Y axis.

85. The stage assembly of claim 84 further comprising a reaction guide assembly that allows the reaction frame to move relative to the stage base along the Y axis and inhibits movement of the reaction frame along the X axis.

86. The stage assembly of claim 84 further comprising a reaction mover assembly that adjusts the position of the X reaction masses relative to the reaction frame along the X axis.

87. The stage assembly of claim 86 further comprising a reaction mover assembly that adjusts the position of the reaction frame and the X reaction masses relative to the stage base along the Y axis.

88. The stage assembly of claim 84 wherein the reaction frame moves relative to the stage base about the Z axis.

89. The stage assembly of claim 84 further comprising a reaction mover assembly that adjusts the position of the reaction frame and the X reaction masses relative to the stage base about the Z axis.

90. The stage assembly of claim 65 wherein the X reaction component moves relative to the Y reaction component along an X axis, and the reaction components move concurrently in the same direction along a Y axis.

91. The stage assembly of claim 65 wherein the Y reaction component supports at least a portion of the X reaction component.

92. The stage assembly of claim 65 wherein the reaction components move along a Y axis to reduce the reaction force along the Y axis that is transferred to the stage base.

93. The stage assembly of claim 65 wherein the reaction components move concurrently along a Y axis to reduce the reaction force along the Y axis that is transferred to the stage base.

94. An exposure apparatus including the stage assembly of claim 65.

95. A process for manufacturing a device including the step of utilizing the exposure apparatus according to claim 94.

96. A process for making a wafer on which an image has been formed including the step of utilizing the exposure apparatus according to claim 94.

97. A stage assembly that moves a device relative to a stage base, the stage assembly comprising:

a stage that retains the device;

a stage mover assembly connected to the stage, the stage mover assembly moving the stage with at least two degrees of freedom and generating reaction forces in at least two degrees of freedom; and a reaction mass assembly including an X reaction component and a Y reaction component that are coupled to the stage mover assembly, the X reaction component moving relative to the Y reaction component, the Y reaction component including a generally planar shaped reaction base, the reaction mass assembly reducing the reaction forces in at least two degrees of freedom that are transferred to the stage base.

98. The stage assembly of claim 97 wherein the stage mover assembly moves the stage along a Y axis directly causing the X reaction component and the Y reaction component to move along the Y axis.

99. The stage assembly of claim 97 wherein one of the reaction components moves relative to the stage base with three degrees of freedom.

100. The stage assembly of claim 97 wherein each of the reaction components moves relative to the stage base with three degrees of freedom.

101. The stage assembly of claim 97 wherein the stage mover assembly comprises an X stage mover that moves the stage along an X axis, the X stage mover being coupled to the X reaction component so that movement of the stage by the X stage mover results in movement of the X reaction component along the X axis.

102. The stage assembly of claim 101 wherein the stage mover assembly comprises a Y stage mover that moves the stage along a Y axis, the Y stage mover being coupled to the X reaction component so that movement of the stage by the Y stage mover results in movement of the X reaction component along the Y axis.

103. The stage assembly of claim 97 further comprising a reaction mover assembly that adjusts the position of at least a portion of the reaction mass assembly relative to the stage base with one degree of freedom.

104. The stage assembly of claim 97 further comprising a reaction mover assembly that adjusts the position of at least a portion of the reaction mass assembly relative to the stage base with two degrees of freedom.

105. The stage assembly of claim 97 further comprising a reaction mover assembly that adjusts the position of at least a portion of the reaction mass assembly relative to the stage base with three degrees of freedom.

106. The stage assembly of claim 97 further comprising a reaction mover assembly that adjusts the position of the Y reaction component and the X reaction component relative to the stage base along the Y axis.

107. The stage assembly of claim 97 further comprising a reaction mover assembly that adjusts the position of one of the reaction components relative to the stage base about a Z axis.

108. The stage assembly of claim 97 further comprising a reaction mover assembly that adjusts the position of the X reaction component and the Y reaction component relative to the stage base about a Z axis.

109. The stage assembly of claim 97 wherein the X reaction component includes a first X reaction mass and a second X reaction mass that move independently along the X axis relative to the Y reaction component.

110. The stage assembly of claim 97 further comprising a mass guide assembly that allows the X reaction component to move relative to the Y reaction component along the X axis and inhibits movement of the X reaction component relative to the Y reaction component along the Y axis.

111. The stage assembly of claim 97 wherein the X reaction component includes a pair of spaced apart X reaction masses.

112. The stage assembly of claim 97 wherein the Y reaction component supports at least a portion of the X reaction component.

113. The stage assembly of claim 97 wherein the X reaction component moves relative to the Y reaction component along an X axis, and the reaction components moves concurrently in the same direction along a Y axis.

114. The stage assembly of claim 113 further comprising a reaction mover assembly that adjusts the position of one of the reaction components relative to the stage base about a Z axis.

115. The stage assembly of claim 97 wherein the reaction components move along a Y axis to reduce the reaction force along the Y axis that is transferred to the stage base.

116. The stage assembly of claim 97 wherein the reaction components move concurrently along a Y axis to reduce the reaction force along the Y axis that is transferred to the stage base.

117. An exposure apparatus including the stage assembly of claim 97.

118. A process for manufacturing a device including the step of utilizing the exposure apparatus according to claim 117.

119. A process for making a wafer on which an image has been formed including the step of utilizing the exposure apparatus according to claim 117.

120. A stage assembly that moves a device relative to a stage base, the stage assembly comprising:
 a stage that retains the device;
 a stage mover assembly connected to the stage, the stage mover assembly moving the stage with at least two degrees of freedom and generating reaction forces in at least two degrees of freedom; and
 a reaction mass assembly including an X reaction component and a Y reaction component that are coupled to the stage mover assembly, the Y reaction component including a reaction frame, the X reaction component moving relative to the Y reaction component, the reaction mass assembly reducing the reaction forces in at least two degrees of freedom that are transferred to the stage base.

121. The stage assembly of claim 120 wherein the stage mover assembly moves the stage along a Y axis directly causing the X reaction component and the Y reaction component to move along the Y axis.

122. The stage assembly of claim 120 wherein one of the reaction components moves relative to the stage base with three degrees of freedom.

123. The stage assembly of claim 120 wherein each of the reaction components moves relative to the stage base with three degrees of freedom.

124. The stage assembly of claim 120 wherein the stage mover assembly comprises an X stage mover that moves the stage along an X axis, the X stage mover being coupled to the X reaction component so that movement of the stage by the X stage mover results in movement of the X reaction component along the X axis.

125. The stage assembly of claim 124 wherein the stage mover assembly comprises a Y stage mover that moves the stage along a Y axis, the Y stage mover being coupled to the X reaction component so that movement of the stage by the Y stage mover results in movement of the X reaction component along the Y axis.

126. The stage assembly of claim 120 further comprising a reaction mover assembly that adjusts the position of at least a portion of the reaction mass assembly relative to the stage base with two degrees of freedom.

127. The stage assembly of claim 120 further comprising a reaction mover assembly that adjusts the position of at least a portion of the reaction mass assembly relative to the stage base with three degrees of freedom.

128. The stage assembly of claim 120 further comprising a reaction mover assembly that adjusts the position of the Y reaction component and the X reaction component relative to the stage base along the Y axis.

129. The stage assembly of claim 120 further comprising a reaction mover assembly that adjusts the position of one of the reaction components relative to the stage base about a Z axis.

130. The stage assembly of claim 120 further comprising a reaction mover assembly that adjusts the position of the X reaction component and the Y reaction component relative to the stage base about a Z axis.

131. The stage assembly of claim 120 further comprising a mass guide assembly that allows the X reaction component to move relative to the Y reaction component along the X axis and inhibits movement of the X reaction component relative to the Y reaction component along the Y axis.

132. The stage assembly of claim 120 wherein the Y reaction component supports at least a portion of the X reaction component.

133. The stage assembly of claim 120 wherein the X reaction component moves relative to the Y reaction component along an X axis, and the reaction components moving concurrently in the same direction along a Y axis.

134. The stage assembly of claim 120 wherein the X reaction component includes a pair of spaced apart X reaction masses.

135. The stage assembly of claim 120 wherein the reaction components move along a Y axis to reduce the reaction force along the Y axis that is transferred to the stage base.

136. The stage assembly of claim 120 wherein the reaction components move concurrently along a Y axis to reduce the reaction force along the Y axis that is transferred to the stage base.

137. An exposure apparatus including the stage assembly of claim 120.

138. A process for manufacturing a device including the step of utilizing the exposure apparatus according to claim 137.

139. A process for making a wafer on which an image has been formed including the step of utilizing the exposure apparatus according to claim 137.

140. A stage assembly that moves a device relative to a stage base, the stage assembly comprising:
 a stage that retains the device;
 a stage mover assembly connected to the stage, the stage mover assembly moving the stage with at least two degrees of freedom and generating reaction forces in at least two degrees of freedom; and a reaction mass assembly including an X reaction component and a Y reaction component that are coupled to the stage mover assembly, the X reaction component moving relative to the Y reaction component, the Y reaction component supporting at least a portion of the X reaction component, the reaction mass assembly reducing the reaction forces in at least two degrees of freedom that are transferred to the stage base.

141. The stage assembly of claim 140 wherein the stage mover assembly moves the stage along a Y axis directly causing the X reaction component and the Y reaction component to move along the Y axis.

142. The stage assembly of claim 140 wherein the X reaction component moves relative to the stage base with three degrees of freedom.

143. The stage assembly of claim 142 wherein the Y reaction component moves relative to the stage base with three degrees of freedom.

144. The stage assembly of claim 140 wherein the stage mover assembly comprises an X stage mover that moves the stage along the X axis, the X stage mover being coupled to the X reaction component so that movement of the stage by the X stage mover results in movement of the X reaction component along the X axis.

145. The stage assembly of claim 144 wherein the stage mover assembly comprises a Y stage mover that moves the stage along the Y axis, the Y stage mover being coupled to the X reaction component so that movement of the stage by the Y stage mover results in movement of the X reaction component along the Y axis.

146. The stage assembly of claim 140 further comprising a reaction mover assembly that adjusts the position of at least a portion of the reaction mass assembly relative to the stage base with two degrees of freedom.

147. The stage assembly of claim 140 further comprising a reaction mover assembly that adjusts the position of at least a portion of the reaction mass assembly relative to the stage base with three degrees of freedom.

148. The stage assembly of claim 140 further comprising a reaction mover assembly that adjusts the position of the Y reaction component and the X reaction component relative to the stage base along the Y axis.

149. The stage assembly of claim 140 further comprising a reaction mover assembly that adjusts the position of one of the reaction components relative to the stage base about a Z axis.

150. The stage assembly of claim 140 further comprising a reaction mover assembly that adjusts the position of the X reaction component and the Y reaction component relative to the stage base about a Z axis.

151. The stage assembly of claim 140 wherein the X reaction component includes a first X reaction mass and a second X reaction mass that move independently along the X axis relative to the Y reaction component.

152. The stage assembly of claim 140 further comprising a mass guide assembly that allows the X reaction component to move relative to the Y reaction component along the X axis and inhibits movement of the X reaction component relative to the Y reaction component along the Y axis.

153. The stage assembly of claim 140 wherein the X reaction component includes a pair of spaced apart X reaction masses and the Y reaction component includes a generally planar shaped reaction base.

154. The stage assembly of claim 140 wherein the X reaction component includes a pair of spaced apart X reaction masses and the Y reaction component includes a pair of spaced apart Y reaction masses.

155. The stage assembly of claim 154 further comprising a mass guide assembly that connects the X reaction masses to the Y reaction masses, allows the X reaction masses to move independently relative to the Y reaction masses along the X axis and inhibits movement of the X reaction masses relative to the Y reaction masses along the Y axis.

156. The stage assembly of claim 154 further comprising a reaction guide assembly that allows the Y reaction masses to move relative to the stage base along the Y axis and inhibits movement of the Y reaction masses along the X axis.

157. The stage assembly of claim 154 further comprising a reaction mover assembly that adjusts the position of the X reaction masses relative to the Y reaction masses along the X axis.

158. The stage assembly of claim 157 wherein the reaction mover assembly adjusts the position of the Y reaction masses and the X reaction masses relative to the stage base along the Y axis.

159. The stage assembly of claim 140 wherein the X reaction component includes a pair of spaced apart X reaction masses and the Y reaction component includes a reaction frame.

160. The stage assembly of claim 140 wherein the reaction components move along a Y axis to reduce the reaction force along the Y axis that is transferred to the stage base.

161. The stage assembly of claim 140 wherein the reaction components move concurrently along a Y axis to reduce the reaction force along the Y axis that is transferred to the stage base.

162. An exposure apparatus including the stage assembly of claim 140.

163. A process for manufacturing a device including the step of utilizing the exposure apparatus according to claim 162.

164. A process for making a wafer on which an image has been formed including the step of utilizing the exposure apparatus according to claim 162.

165. A method for making a stage assembly that moves a device relative to a stage base, the method comprising the steps of:
retaining the device with a stage;
generating reaction forces by moving the stage with two degrees of freedom with a stage mover assembly;
coupling a reaction mass assembly to the stage mover assembly, the reaction mass assembly including a Y reaction component and an X reaction component that moves relative to the Y reaction component, the reaction mass assembly reducing the reaction forces that are transferred to the stage base; and
adjusting the position of at least one of the reaction components relative to the stage base about a Z axis with a reaction mover assembly.

166. The method of claim 165 wherein the step of generating reaction forces includes the step of providing an X stage mover that moves the stage along an X axis, the X stage mover being coupled to the X reaction component so that movement of stage by the X stage mover results in movement of the X reaction component along the X axis.

167. The method of claim 166 wherein the step of generating reaction forces includes the step of providing a Y stage mover that moves the stage along a Y axis, the Y stage mover being coupled to the X reaction component so that movement of the stage by the Y stage mover results in movement of the X reaction component along the Y axis.

168. The method of claim 165 wherein the step of coupling the reaction mass assembly includes the step of moving the X reaction component and the Y reaction component concurrently in a same direction along a Y axis.

169. The method of claim 165 wherein the step of adjusting the position includes adjusting the position of the X reaction component relative to the Y reaction component along an X axis.

170. The method of claim 165 wherein the step of adjusting the position includes adjusting the position of the Y reaction component and the X reaction component concurrently relative to the stage base along a Y axis.

171. The method of claim 165 wherein the step of adjusting the position includes adjusting the position of the Y reaction component and the X reaction component relative to the stage base along an X axis and about the Z axis.

172. The method of claim 165 wherein the step of adjusting the position includes adjusting the position of the X reaction component relative to the Y reaction component along an X axis, and adjusting the position of the Y reaction component and the X reaction component relative to the stage base along a Y axis.

173. The method of claim 165 wherein the step of coupling a reaction mass assembly includes the step of providing a first X reaction mass and a second X reaction mass that move independently along an X axis.

174. The method of claim 173 wherein the step of coupling a reaction mass assembly includes the step of coupling a reaction frame to the X reaction masses so that the reaction frame moves relative to the stage base along the X axis.

175. The method of claim 174 wherein the step of adjusting the position includes adjusting the position of each X reaction mass relative to the reaction frame along the X axis, and adjusting the position of the reaction frame and the X reaction masses relative to the stage base along the Y axis.

176. The method of claim 174 including the step of adjusting the position of the X reaction masses and the reaction frame relative to the stage base along the X axis and along the Y axis with the reaction mover assembly.

177. The method of claim 165 wherein the step of adjusting the position includes adjusting the position of the reaction mass assembly relative to the stage base along the X axis.

178. The method of claim 165 wherein the step of adjusting the position includes adjusting the position of the reaction mass assembly relative to the stage base along the X axis and along the Y axis.

179. A method for making an exposure apparatus that forms an image on a wafer, the method comprising the steps of:
providing an irradiation apparatus that irradiates the wafer with radiation to form the image on the wafer; and
providing the stage assembly made by the method of claim 165.

180. A method of making a wafer utilizing the exposure apparatus made by the method of claim 179.

181. A method of making a device including at least the exposure process: wherein the exposure process utilizes the exposure apparatus made by the method of claim 179.

* * * * *